United States Patent
Ishikawa et al.

(10) Patent No.: US 10,723,884 B2
(45) Date of Patent: Jul. 28, 2020

(54) BLACK PIGMENT, METHOD FOR PRODUCING SAME, PIGMENT DISPERSION LIQUID, PHOTOSENSITIVE COMPOSITION AND CURED PRODUCT OF SAID PHOTOSENSITIVE COMPOSITION

(71) Applicant: TORAY INDUSTRIES, INC., Tokyo (JP)

(72) Inventors: Akihiro Ishikawa, Otsu (JP); Yugo Tanigaki, Otsu (JP); Kazuto Miyoshi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 16/327,162

(22) PCT Filed: Aug. 22, 2017

(86) PCT No.: PCT/JP2017/029878
§ 371 (c)(1),
(2) Date: Feb. 21, 2019

(87) PCT Pub. No.: WO2018/038083
PCT Pub. Date: Mar. 1, 2018

(65) Prior Publication Data
US 2019/0218396 A1    Jul. 18, 2019

(30) Foreign Application Priority Data
Aug. 24, 2016   (JP) .................. 2016-163659

(51) Int. Cl.
| C08F 2/46 | (2006.01) |
| --- | --- |
| C08F 2/50 | (2006.01) |
| C08G 61/04 | (2006.01) |
| C09B 67/08 | (2006.01) |
| C09B 57/00 | (2006.01) |
| G03F 7/023 | (2006.01) |
| G03F 7/037 | (2006.01) |
| H01L 51/50 | (2006.01) |
| G03F 7/004 | (2006.01) |
| H05B 33/22 | (2006.01) |
| G03F 7/027 | (2006.01) |
| G09F 9/30 | (2006.01) |
| H05B 33/12 | (2006.01) |
| H01L 27/32 | (2006.01) |
| C08K 3/22 | (2006.01) |
| C08K 3/36 | (2006.01) |
| C08K 5/00 | (2006.01) |
| C08K 5/1535 | (2006.01) |
| C08K 5/3417 | (2006.01) |
| C08L 79/08 | (2006.01) |
| C09B 5/62 | (2006.01) |
| C09B 29/40 | (2006.01) |
| C09B 67/46 | (2006.01) |

(52) U.S. Cl.
CPC ............ *C09B 67/0007* (2013.01); *C08K 3/22* (2013.01); *C08K 3/36* (2013.01); *C08K 5/0041* (2013.01); *C08K 5/1535* (2013.01); *C08K 5/3417* (2013.01); *C08L 79/08* (2013.01); *C09B 5/62* (2013.01); *C09B 29/3608* (2013.01); *C09B 57/00* (2013.01); *C09B 67/009* (2013.01); *G03F 7/004* (2013.01); *G03F 7/0045* (2013.01); *G03F 7/023* (2013.01); *G03F 7/027* (2013.01); *G03F 7/037* (2013.01); *G09F 9/30* (2013.01); *H01L 27/32* (2013.01); *H01L 51/50* (2013.01); *H05B 33/12* (2013.01); *H05B 33/22* (2013.01); *C08K 2003/2227* (2013.01); *C08L 2203/20* (2013.01); *H01L 27/322* (2013.01)

(58) Field of Classification Search
CPC . C09B 67/007; C09B 67/009; C09B 29/3608; C09B 5/62; C09B 57/00; G03F 7/0045; G03F 7/023; C08L 2203/20; C08L 79/08; C08K 5/0041; C08K 5/3417; C08K 5/1535; C08K 3/22; C08K 3/36; C08K 2003/2227; H01L 27/322
USPC ........... 522/75, 74, 71, 6, 189, 184, 1; 520/1
See application file for complete search history.

(56) References Cited

U.S. PATENT DOCUMENTS

| 4,880,472 A | 11/1989 | Bugnon et al. |
| 5,209,998 A | 5/1993 | Kavassalis et al. |
| 2002/0121228 A1 | 9/2002 | Zama et al. |

(Continued)

FOREIGN PATENT DOCUMENTS

| CN | 1662594 A | 8/2005 |
| CN | 104350108 A | 2/2015 |

(Continued)

OTHER PUBLICATIONS

Yamamoto et al, JP 2008-107530 Machine Translation, May 8, 2008 (Year: 2008).*

(Continued)

*Primary Examiner* — Jessica Whiteley
(74) *Attorney, Agent, or Firm* — Birch, Stewart, Kolasch & Birch LLP

(57) ABSTRACT

Provided is a black pigment that enables pattern formation of pixel division layer while suppressing generation of development residue. The black pigment comprises (a) a core containing at least one organic black pigment selected from the group consisting of benzodifuranone-based black pigments, perylene-based black pigments, azo-based black pigments, and isomers thereof and (b) a coating layer containing silica and/or a metal oxide and/or a metal hydroxide.

19 Claims, 2 Drawing Sheets

(56) References Cited

U.S. PATENT DOCUMENTS

| | | |
|---|---|---|
| 2006/0155007 A1 | 7/2006 | Huber |
| 2007/0151478 A1 | 7/2007 | Erk et al. |
| 2009/0246674 A1 | 10/2009 | Carlini et al. |
| 2010/0186891 A1 | 7/2010 | Ruch et al. |
| 2012/0172498 A1 | 7/2012 | Fontana et al. |
| 2015/0183955 A1 | 7/2015 | Deno et al. |
| 2018/0019290 A1* | 1/2018 | Arai ................ C08G 73/10 |

FOREIGN PATENT DOCUMENTS

| | | | |
|---|---|---|---|
| JP | 50-051527 A | | 5/1975 |
| JP | 63-120766 A | | 5/1988 |
| JP | 64-016871 A | | 1/1989 |
| JP | 5-232745 A | | 9/1993 |
| JP | 9-230131 A | | 9/1997 |
| JP | 2008-107530 | * | 5/2008 |
| JP | 2008-107530 A | | 5/2008 |
| JP | 2010-534726 A | | 11/2010 |
| JP | 2011-515567 A | | 5/2011 |
| JP | 2012-515240 A | | 7/2012 |
| JP | 2013-254047 A | | 12/2013 |
| JP | 2015-525260 | * | 9/2015 |
| JP | 2015-525260 A | | 9/2015 |
| WO | WO 2005/078023 A2 | | 8/2005 |
| WO | WO 2009/010521 A2 | | 1/2009 |
| WO | WO 2013/183426 A1 | | 12/2013 |

OTHER PUBLICATIONS

BASF, JP 2015-525260 Machine Translation, Sep. 3, 2015 (Year: 2015).*

International Search Report (PCT/ISA/210) issued in PCT/JP2017/029878, dated Oct. 10, 2017.

Written Opinion (PCT/ISA/237) issued in PCT/JP2017/029878, dated Oct. 10, 2017.

* cited by examiner

BLACK PIGMENT, METHOD FOR PRODUCING SAME, PIGMENT DISPERSION LIQUID, PHOTOSENSITIVE COMPOSITION AND CURED PRODUCT OF SAID PHOTOSENSITIVE COMPOSITION

TECHNICAL FIELD

The present invention relates to a black pigment and its production method, a pigment dispersion, a photosensitive composition, and its cured product.

BACKGROUND ART

Many products using organic electroluminescence (EL) display are recently developed in the field of display apparatus such as smartphone, tablet PC, and TV having a flat panel display. An organic EL display typically has a first electrode of a light-transmitting silver/magnesium alloy or the like on the light extraction side of the light-emitting device and a second electrode of indium tin oxide (ITO) or the like and a metal reflective layer of silver/copper alloy or the like on the side of the light-emitting device that is not the light extraction side, and since the pixels of each of the red/blue/green light-emitting device are divided, patterned pixel division layer having an insulating layer function is provided between the first electrode layer and the second electrode layer. The first electrode and the second electrode are typically formed by sputtering, and the pixel division layer is required to have a pattern morphology with a small taper angle in order to prevent breakage of the first electrode.

An organic EL display is a self-luminescent device which emits light by using the energy generated by re-contact of the electron from the cathode and the electron-hole from the anode. Accordingly, visibility and contrast are lost upon entrance of the exterior light such as sunlight by the reflection of the exterior light, and there is a need for a technology capable of reducing the reflection of the exterior light. Typical such technology of reducing the exterior light reflection is the one wherein a pixel division layer having a light-shielding property is formed by using a photosensitive composition. Typical colorants used for providing the light-shielding property are organic black pigments having high insulation and coloring capability, and examples include bis-oxodihydroindolylene-benzodifuranone which is a benzodifuranone-based pigment (see, for example, Patent Document 1). Other disclosed organic black pigments include perylene-based black pigment (see, for example, Patent Document 2) and azo-based black pigment (see, for example, Patent Document 3).

PRIOR ART DOCUMENTS

Patent Document

Patent Document 1: International Unexamined Patent Application No. 2009/010521
Patent Document 2: International Unexamined Patent Application No. 2005/078023
Patent Document 3: U.S. Unexamined Patent Application Publication No. 2002-121228

SUMMARY OF THE INVENTION

Problems to be Solved by the Invention

However, the formation of a pixel division layer of an organic EL display by photolithography by incorporating the organic black pigment disclosed in Patent Documents 1 to 3 in the photosensitive composition has been associated with the problem that development residues are generated on the substrate. Presence of such development residue resulted in the decrease of the yield in the development step as well as loss of visibility by the generation of non-luminescent spots called "dark spots" in the pixel caused by the development residue. Because of such situation, there has been a strong demand for a black pigment that enables pattern formation of the pixel division layer while suppressing the generation of the development residue.

Means for Solving the Problems

The present invention provides a black pigment comprising (a) a core containing at least one organic black pigment selected from the group consisting of benzodifuranone-based black pigments, perylene-based black pigments, and azo-based black pigments and (b) a coating layer containing silica and/or a metal oxide and/or a metal hydroxide.

Advantageous Effects of the Invention

The black pigment of the present invention enables improvement in the light emitting properties of an organic EL display by facilitating pattern formation of the pixel division layer while suppressing the generation of the development residue.

DESCRIPTION OF THE PREFERRED EMBODIMENTS

Figure 1:
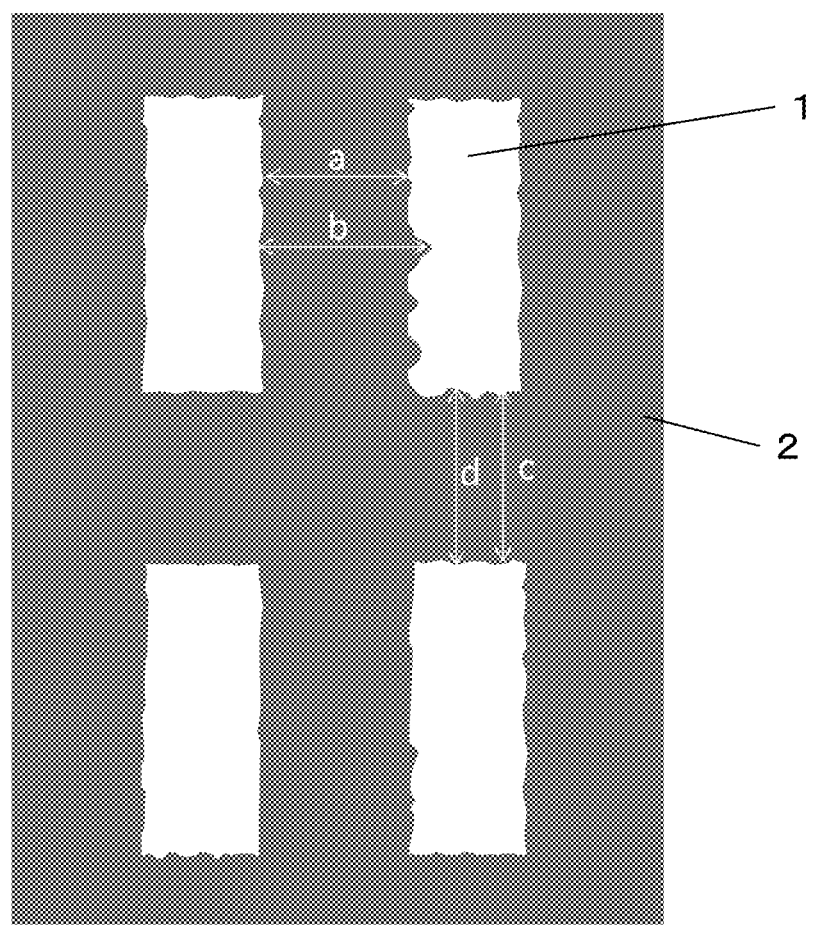
FIG. 1 is a schematic view showing the ripple which is an index for the pattern linearity of the pixel division layer containing the black pigment of the present invention in the Example.

Next, the present invention is described in detail. It is to be noted that, in the present invention, the value range expressed by using "(a value) to (another value)" is the range including the value expressed before and after the "to" as the lower limit value and the upper limit value. In the present invention, the "pixel division layer" is the pixel division layer for an organic EL display, and the "organic EL display" includes both the rigid-type organic EL display which cannot be bent and the flexible-type organic EL display which can be bent. Furthermore, the "light-shielding property" means the degree of shielding the light in the wavelength range of 380 to 780 nm which is the range of the visible light, and a higher light-shielding property corresponds to a lower light transmittance. The "C.I." used for the name of the colorant is the abbreviation of Colour Index Generic Name, and the "C.I." indicates chemical structure and crystal type of the pigment or the dye, for the colorants registered in the color index, based on the color index published from "The Society of Dyers and Colourists".

The inventors of the present invention examined the principle how the development residue is generated when the (a) at least one organic black pigment selected from the group consisting of benzodifuranone-based black pigments, perylene-based black pigments, azo-based black pigments, and isomers thereof is used in the photosensitive composition, and the inventors clarified that the development residue is generated in the use of such organic black pigment due to the lack or insufficiency of at least one of the properties inherent to the chemical structure of the pigment, namely, chemical durability and dispersibility.

With regard to the benzodifuranone-based black pigment, it has been found that the development residue generation is caused by the lack of the chemical durability inherent to the pigment. More specifically, it has been found that the benzodifuranone-based black pigment is markedly inferior in the alkali resistance compared to inorganic black pigments such as carbon black and titanium black and many non-black organic pigments such as blue and red organic pigments, and such inferiority resulted in the deposition of the residue in the opening of the pixel division layer during the patterning in the development step as will be described below since the crystal structure of the benzodifuranone-based black pigment is destructed by the contact with the alkaline developer that has permeated through the binder component and this invites dissolution or semi-dissolution of the black pigment and sticking of the decomposed components on the substrate. Decomposition of the benzodifuranone-based black pigment leads to change in color from the black to brown or coffee, loss of the light-shielding property, rotten smell, and disappearance of other properties inherent to the benzodifuranone-based black pigment.

When the pixel division layer of an organic EL display is formed by the so-called negative photolithography wherein the film in the exposed area is photo-cured by patterned exposure through a mask to reduce solubility by an alkali while the film in the unexposed area is removed by an alkaline developer, the development residue is generated not only as the development residue in the opening as described above, namely the unexposed area but also by re-deposition on the substrate in the unexposed area of the film in the exposed area that became peeled off during the development. As described above, the pixel division layer is required to have a pattern morphology with a small taper angle in order to prevent breakage of the first electrode, and this small taper angle pattern is formed by reflowing the film after the development in the curing step as will be described below. Accordingly, excessive photo-curing of the exposed area should be avoided in the exposure step as will be described below. However, this means that, in the development step, the alkaline developer is likely to be permeated into the surface layer and/or side surface of the film in the exposed area to promote the decomposition of the benzodifuranone-based black pigment, and due to the resulting rapid decrease in the adhesion strength at the pigment/binder boundary, and local peeling of the film in the exposed area is induced and the peeled film deposits in the opening and attaches to the substrate to further increase the development residue. The development residue deposited in the opening which will finally be the pixel having the light-emitting device will be visually recognized as spotted black defects randomly aligned in the resulting organic EL display, and the results are random decrease of the effective area in the pixel contributing for the light emission per pixel and generation of the dark spots and decrease of the brightness. Compared to the major axis of the development residue, the major axis of the dark spot derived from the development residue is equivalent or larger, and since the enlarged dark spot interferes with the light emission, the development residue directly results in the fall of the value as a display device. When the pixel division layer of an organic EL display is formed by the so-called positive photolithography wherein patterned exposure through a mask results in the higher solubility in alkali of the film in the exposed area compared with the solubility in alkali of the film in the unexposed area and the film in the exposed area is removed by an alkali developer solution by utilizing such difference in the solubility, decomposition of the benzodifuranone-based black pigment is promoted and the development residue is similarly generated in the opening.

On the other hand, the perylene-based black pigments and the azo-based black pigments have high chemical durability due to their rigid structure, and their alkali resistance is sufficient as a pigment while their dispersibility has been inferior to the benzodifuranone-based black pigments as described above, and the pigment dispersion containing these pigments as the colorants and photosensitive composition prepared by using such pigment dispersion suffered re-aggregation and viscosity increase with the lapse of time during their storage. Furthermore, it has been found that, the dispersion state is easily disrupted upon contact with the alkali developer in the development step, and accordingly, when the pixel division layer of an organic EL display is formed by negative photolithography, the film of the unexposed area containing coarse pigment aggregates having low solubility in the alkali would attach to the substrate, and development residue is generated in the opening of the pixel division layer. The development residue is generated by the same principle when the pixel division layer of the organic EL display is formed by positive photolithography.

When two or more organic black pigments wherein the principle of the development residue generation is different from each other are used in combination, for example, when the benzodifuranone-based black pigment is used in combination with a mixture of the perylene-based black pigment and/or the azo-based black pigment, the alkali resistance and the dispersibility are not simultaneously realized, but the development residues from each pigment are simultaneously deposited on the substrate corresponding to the mixing ratio of the pigments, and the problems are left unsolved.

The inventors of the present invention investigated covering of the surface of the organic black pigment with an inorganic coating material in order to impart the alkali resistance and/or dispersibility sufficient in forming the pixel division layer of the organic EL display. It was then found, that the benzodifuranone-based black pigments, the perylene-based black pigments, and the azo-based black pigments all had an acid resistance sufficient for enduring the surface treatment step and that they can be coated with an inorganic coating material in an aqueous dispersion medium. It has also been found that use of a coating layer containing silica and/or a metal oxide and/or a metal hydroxide for the inorganic coating material is very effective for suppressing the development residue generated due to the properties inherent to the organic black pigment in view of their capability of reducing the interaction with the substrate surface and also drastically improving the dispersibility of the hardly dispersible organic black pigment and also in view of protecting the organic black pigment in the development step, and the present invention has been completed on such findings. When the film surface of the ITO electrode as described above is seen from its cross-section, the ITO electrode is macroscopically a highly flat thin film while it is microscopically a thin film which is susceptible to formation of the development residue derived from the pigment since it has spotted bumps (steps in the form of grains) with the size of several nm in the film depth direction scattered uniformly over the entire surface, and this has been one reason why solving the problem has been so difficult.

Accordingly, in the present invention, the inventors found that a particularly significant effect of suppressing the residue is found when the substrate surface in the opening comprises the ITO electrode.

The black pigment of the present invention has (a) a core containing at least one organic black pigment selected from the group consisting of benzodifuranone-based black pigments, perylene-based black pigments, azo-based black pigments, and isomers thereof and (b) a coating layer containing silica and/or a metal oxide and/or a metal hydroxide.

The core in the black pigment of the present invention, namely, the core located in the interior surrounded by the coating layer contains at least one organic black pigment selected from the group consisting of (a) benzodifuranone-based black pigments, perylene-based black pigments, azo-based black pigments, and an isomer thereof. The core may be constituted solely from the organic black pigment as described above, or the organic black pigment may be the one subjected to an organic treatment such as treatment with a pigment derivative as will be described below. It is to be noted that the chemical structure of the component constituting the core may be identified by grinding the black pigment of the present invention with a mortar and a pestle to peel the coating layer and collect the exposed core for the analysis of the chemical structure and the crystal type by a combination of Time-of-flight secondary ion mass spectrometry (TOF-SIMS), Time-of-flight mass spectrometry (TOF-MS), NMR analysis, LC-MS, ICP mass spectrometry, infrared absorption spectrum, and powder X-ray diffractometry by CuKα radiation. The collected core may be immersed in an amide-based organic solvent such as dimethylformamide and N-methylpyrrolidone to use the dissolved solution for the sample in the analysis.

The benzodifuranone-based black pigment of (a) in the core of the black pigment of the present invention is preferably a compound represented by the general formula (1) or (2) or an isomer thereof. The "isomer" as used herein includes tautomers. The isomer may be included either as a mixture in the core or as a mixed crystal in the core.

[Chemical formula 1]

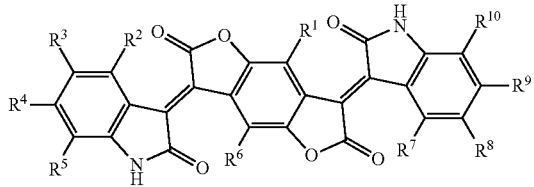

(1)

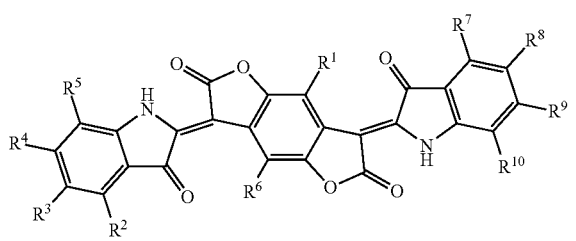

(2)

In the general formulae (1) and (2), $R^1$ and $R^6$ independently represent hydrogen atom, $CH_3$, $CF_3$, fluorine atom, or chlorine atom; $R^2$, $R^3$, $R^4$, $R^5$, $R^7$, $R^8$, $R^9$, and $R^{10}$ independently represent hydrogen atom, a halogen atom, an alkyl group containing 1 to 12 carbon atoms, a cycloalkyl group containing 1 to 12 carbon atoms, an alkenyl group containing 1 to 12 carbon atoms, a cycloalkenyl group containing 1 to 12 carbon atoms, an alkynyl group containing 1 to 12 carbon atoms, COOH, $COOR^{11}$, $COO^-$, $CONH_2$, $CONHR^{11}$, $CONR^{11}R^{12}$, CN, OH, $OR^{11}$, $OCOR^{11}$, $OCONH_2$, $OCONHR^{11}$, $OCONR^{11}R^{12}$, $NO_2$, $NH_2$, $NHR^{11}$, $NR^{11}R^{12}$, $NHCOR^{11}$, $NR^{11}COR^{12}$, $N=CH_2$, $N=CHR^{11}$, $N=CR^{11}R^{12}$, SH, $SR^{11}$, $SOR^{11}$, $SO_2R^{11}$, $SO_3R^{11}$, $SO_3H$, $SO_3^-$, $SO_2NH_2$, $SO_2NHR^{11}$, or $SO_2NR^{11}R^{12}$ with $R^2$ and $R^3$, $R^3$ and $R^4$, $R^4$ and $R^5$, $R^7$ and $R^8$, $R^8$ and $R^9$, and $R^9$ and $R^{10}$ directly bonded or indirectly bonded with intervening O, S, NH, or $NR^{11}$; and $R^{11}$ and $R^{12}$ independently represent an alkyl group containing 1 to 12 carbon atoms, a cycloalkyl group containing 1 to 12 carbon atoms, an alkenyl group containing 1 to 12 carbon atoms, a cycloalkenyl group containing 1 to 12 carbon atoms, or an alkynyl group containing 1 to 12 carbon atoms.

In view of the disaggregation in the deionized water in the surface treatment step, $R^2$, $R^4$, $R^5$, $R^7$, $R^9$, and $R^{10}$ are preferably hydrogen atom and $R^3$ and $R^8$ are preferably hydrogen atom, $SO_3H$, $SO_3^-$, $SO_2NR^{11}R^{12}$, or COOH; and in view of the heat resistance, $R^1$ to $R^{10}$ are preferably hydrogen atom. In other words, the more preferred is the benzodifuranone-based black pigment represented by the formula (3).

[Chemical formula 2]

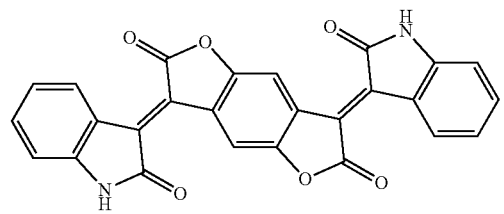

(3)

The perylene-based black pigment of (a) in the core of the black pigment of the present invention is preferably a compound represented by the general formula (4), a compound represented by the general formula (5), C.I. pigment black 31, or C.I. pigment black 32. The compound represented by the general formula (4) and the compound represented by the general formula (5) may be included either as a mixture in the core or as a mixed crystal in the core. The "mixture" as used herein includes the case when the number of molecular structures constituting one pigment particle is two or more due to the production process of the pigment.

[Chemical formula 3]

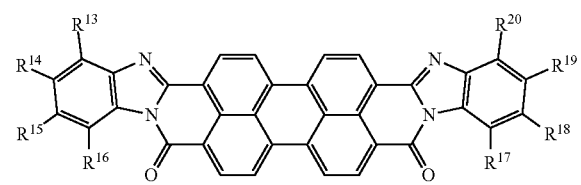

(4)

-continued (5)

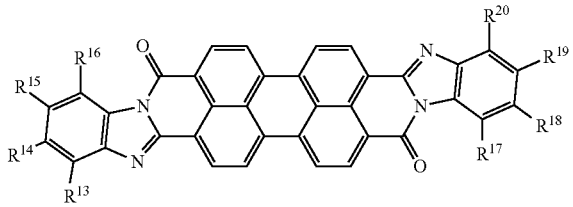

In the general formulae (4) and (5), $R^{13}$ to $R^{20}$ independently represent hydrogen atom, an alkyl group containing 1 to 12 carbon atoms, an alkoxy group containing 1 to 6 carbon atoms, or hydroxy group.

In the compound represented by the general formula (4) or (5), $R^{13}$ to $R^{20}$ are preferably hydrogen atom in view of the light-shielding property and the heat resistance. In other words, the more preferred is the perylene-based black pigment represented by the formula (6) or formula (7):

[Chemical formula 4]

(6)

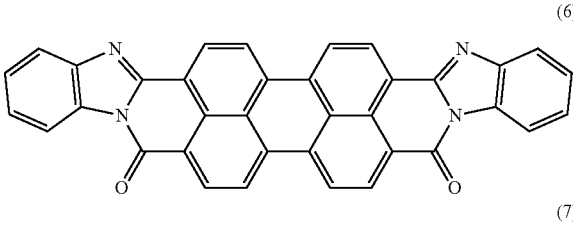

(7)

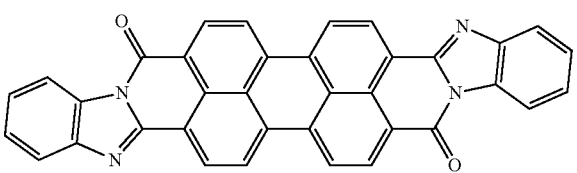

The azo-based black pigment of (a) in the core of in the black pigment of the present invention is the compound represented by the general formula (8):

[Chemical formula 5]

(8)

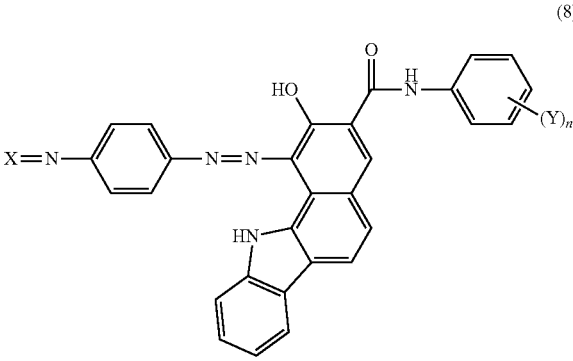

In the general formula (8), X represents an organic group having isoindolinone structure or an organic group having isoindoline structure; Y represents at least one organic group selected from the group consisting of an alkyl group containing 1 to 3 carbon atoms and an alkoxy group containing 1 to 3 carbon atoms; and n represents an integer of 1 to 5.

In view of the light-shielding property and the heat resistance, preferable embodiments are the azo-based black pigment represented by the formula (9) and the azo-based black pigment represented by the formula (10).

[Chemical formula 6]

(9)

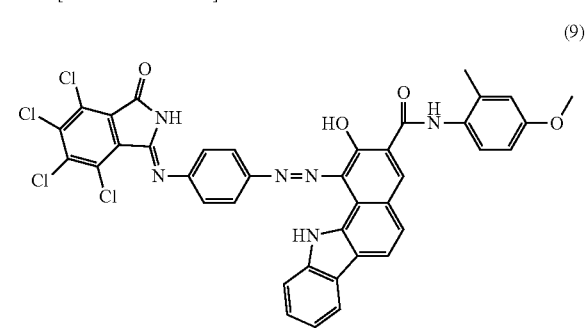

[Chemical formula 7]

(10)

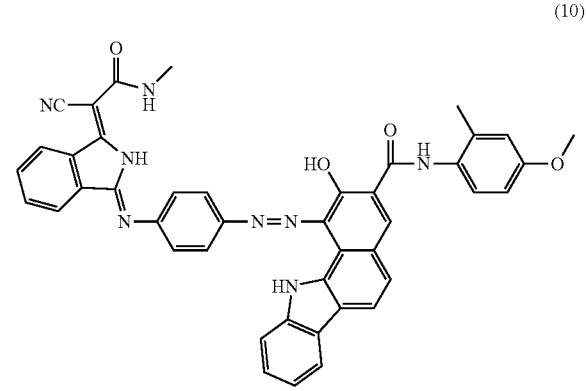

The benzodifuranone-based black pigment, the perylene-based black pigment, and the azo-based black pigment of (a) in the core may preferably have an average primary particle size of at least 30 nm and more preferably at least 40 nm in view of improving the dispersibility and the heat resistance of the black pigment of the present invention. The average primary particle size is preferably up to 150 nm and more preferably up to 100 nm in view of improving the pattern linearity of the pixel division layer.

The "average primary particle size" as used herein means the number average primary particle size calculated by particle size analysis method using an image analysis-type particle size distribution analyzer. A transmission electron microscope (TEM) can be used to obtain the image, and the average primary particle size may be calculated from the image having at least 100 pigment primary particles at a magnification of ×50000. When the pigment is not spherical, the average of the major axis and the minor axis is used for the primary particle size. The image analysis may be conducted by using a particle size distribution software Mac-View manufactured by MOUNTECH Co., Ltd.

When there is a need to reduce the average primary particle size or to crush the coarse particles, the average primary particle size may be adjusted to the desired range by a wet pulverization treatment such as solvent salt milling. This solvent salt milling is a method wherein a mixture of the pigment, a water-soluble inorganic salt and a water-soluble solvent is kneaded and washed in the state of a paste with high viscosity. The water-soluble inorganic salt used may be any salt in the form of particles which can function as a crusher, and the preferred are sodium chloride, potassium chloride, and potassium sulfate preferably having an average primary particle size of approximately 0.5 to 50 μm. Exemplary water-soluble solvents include organic solvents such as alcohol solvents and glycol solvents. The pulverization power of the solvent salt milling method is much stronger than the wet medium dispersion as will be described below, and when the black pigment of the present invention is used for the pixel division layer of the organic EL display, this method is very useful for controlling the primary particle size and realizing the good pattern linearity.

The organic black pigment preferably generates minimum amount of gas in the high-temperature condition of at least 200° C. and more preferably at least 250° C. in view of improving the heat resistance required for the pixel division layer.

The core preferably has a surface pH of less than 7, and in other words, the pigment is preferably an acidic pigment and the surface pH is more preferably less than 6. The "surface pH" as used herein is the value obtained by mixing 5% by weight of the pigment and 95% by weight of water which has been deionized a decarbonized, stirring the mixture in a sealed vessel for 1 hour, and measuring the pH of the aqueous pigment suspension by a pH meter under the conditions including the temperature of 25° C. When the coating material is coated on the core at a surface pH of less than 7, disaggregation in the aqueous dispersion medium can be readily promoted in the preparation step as will be described below, and coating on the aggregated core can be avoided to improve average coverage rate as will be described below. Of the organic black pigment, the preferred is a benzodifuranone-based black pigment in view of the low surface pH and excellent disaggregation in the aqueous dispersion medium.

The core may also contain a pigment derivative. A pigment derivative is a dispersion aid having at least one organic group for controlling acidity or basicity introduced by derivatization in the molecular structure of the pigment molecule to be derivatized. According to the technical knowledge common to those skilled in the art, such pigment derivative is commonly used for improving adsorption ability of the resin-type dispersant, and in the present invention, such pigment derivative is well adapted as an aid component for promoting disaggregation and improving the average coverage rate of the core in the preparation step as described below. Examples of the pigment to be derivatized include organic pigments such as phthalocyanine-based pigment, azo-based pigment, quinacridone-based pigment, quinophthalone-based pigment, and diketopyrrolopyrrole-based pigment, and examples of the organic group include acidic group, basic group, and aromatic group, for example, sulfonic acid group, alkali metal salt of sulfonic acid, amine salt of sulfonic acid, sulfone amide group, and phthalimide alkyl group, and two or more organic groups may be present in the molecule. The pigment derivative is used in the solvent salt milling or in the wet medium dispersion in the preparation step as will be described below, by preliminarily mixing with an organic black pigment, and the disaggregability of the black pigment in the aqueous dispersion medium can be improved by the adsorbing/loading of the pigment derivative on the surface of the organic black pigment. Amount of the pigment derivative used is preferably at least 1 part by weight in relation to 100 parts by weight of the organic black pigment in view of realizing the effect of promoting the disaggregation of the organic black pigment, and up to 10 parts by weight in view of the heat resistance required for the pixel division layer. More specifically, when the core contains a perylene-based black pigment, the preferred is the combination with a derivative of the copper phthalocyanine-based pigment; and when the core contains an azo-based black pigment, the preferred is the combination with a derivative of the copper phthalocyanine-based pigment and/or a derivative of azo pigment; and the organic group for controlling acidity or basicity is preferably sulfonic acid group in view of its ability to make the core surface anionic to improve disaggregability. Use of the pigment derivative is particularly useful when the core contains perylene-based black pigment and/or azo-based black pigment which is electrically substantially neutral and highly hydrophobic.

The black pigment of the present invention has a coating layer containing (b) silica and/or a metal oxide and/or a metal hydroxide. In the present invention, "coating" means that (a) a core containing at least one organic black pigment selected from the group consisting of benzodifuranone-based black pigments, perylene-based black pigments, azo-based black pigments, and isomers thereof is coated by the coating layer so that that the average coverage rate as will be described below would be preferably at least 50%. The average coverage rate is more preferably 80 to 100% in view of further reduction of the development residue. In the present invention, the average coverage rate of the black pigment can be calculated as described below. First, the black pigment is impregnated with a two-part room temperature-curable acryl transparent resin (Techovit 4006 manufactured by Heraeus Kulzer) which is used for the embedding resin, and after promoting the reaction and the curing, a specimen for observation wherein the black pigment has been embedded in the resin is obtained. In order to facilitate the observation by reducing the vacant space in the observation specimen, the specimen in the midst of the curing may be placed in an autoclaving apparatus for pressure application, or if desired, further heated to promote filling of the resin to the gaps between the pigment particles to thereby promote the impregnation. Use of the autoclaving apparatus will be more effective when the secondary aggregate of the black pigment has a large particle size. The method used for the preparation of the observation specimen is not limited to the method as described above, and a most suitable production method can be adequately selected by considering the impregnation rate of the organic black pigment and the time allowed before the loss of the fluidity of the embedding resin. Such examples include methods incorporating the use of an automatic thermosetting resin-embedding apparatus ("MECAPRESS" (Registered Trademark) manufactured by PRESI) or a vacuum defoaming apparatus ("Poly'Vac" (Registered Trademark) manufactured by PRESI) which can be used when the embedding resin is a thermosetting acrylic resin or a thermosetting epoxy resin. After roughly polishing the observation specimen by a machine using a diamond abrasive paper, a smooth cross-section is prepared in a part of the observation specimen by argon ion beam polishing using an ion milling apparatus (IM4000 manufactured by Hitachi High-Technologies Corporation). By using a transmission electron microscope (TEM H9500 manufactured by Hitachi High-Technologies Corporation), the cross-section is observed at a magnification of 100,000 at an acceleration voltage of 300 kV, and the image of the cross-section is obtained by adjusting the brightness and contrast of the display monitor so that the outer circumference of the core could be recognized in terms of difference in the contrast. Average coverage rate N (%) can be determined by randomly selecting 100 black pigment particles, determining coverage rate M (%) of each black pigment by the following equation, and calculating the number average value.

Coverage rate $M (\%) = \{L1/(L1+L2)\} \times 100$

L1: total length (nm) of the part covered by the coating layer in the circumference of the core L2: total length (nm) of the part not covered by the coating layer (the part where the boundary directly contacts the embedding resin) in the circumference of the core L1+L2: circumferential length (nm) of the core.

The morphology of the coating layer is not particularly limited as long as it protects the core and functions as a layer contributing for the improvement of the alkali resistance or as a layer contributing for the improvement of the dispersibility. Exemplary morphologies of the coating layer include deposition of a fine particle coating material in the form of a layer on the surface of the core, a consistent film, and a mixture of these morphologies.

In the present invention, the "alkali resistance" is a resistance to an aqueous solution of organic alkali under the conditions of atmospheric pressure and 25° C. A typical index of the alkali resistance of a pigment or a pigment-containing film according to the technical knowledge common to those skilled in the art is resistance to an aqueous solution of inorganic alkali such as 1 to 10% by weight aqueous solution of sodium hydroxide or 1 to 10% by weight aqueous solution of sodium carbonate, and the evaluation criteria used in the present invention is the resistance to an aqueous solution of the organic alkali which is adapted for use in the formation of the pixel division layer. The degree of dissolution and/or decomposition that occurs upon contact of the pigment with the alkaline aqueous solution does not solely depend on the pH value, and the resistance of the organic pigment to the aqueous solution of organic alkali is generally lower than the resistance to the aqueous solution of inorganic alkali.

The coating layer is preferably a dense layer with little space in its interior. However, when the coating layer has at least some parts where the fine particle coating material has deposited in the form of layers, such parts may function as a sacrificial layer in the preparation of the dispersion of the black pigment and exposure of the core may be suppressed upon application of excessive mechanical energy in the dispersion step. Examples of the fine particle coating material shape include sphere and amorphous shapes, and the fine particle coating material may preferably have an average primary particle size of less than 10 nm and more preferably less than 5 nm in view of suppressing diffuse reflection and maintaining the pitch black property inherent to the organic black pigment in the core. When the fine particle is not spherical, the average of the major axis and the minor axis is used for the primary particle size. It is to be noted that the locally deposited coating material is also regarded as a part of the coating layer constituting the black pigment of the present invention.

The coating layer of the black pigment of the present invention may contain two or more silica and/or the metal oxide and/or the metal hydroxide.

When the core contains a benzodifuranone-based black pigment, the silica and/or the metal oxide and/or the metal hydroxide can protect the core and imparts the alkali resistance to the pigment, and therefore, the development residue will be suppressed. On the other hand, when the core contains a perylene-based black pigment and/or an azo-based black pigment, the silica and/or the metal oxide and/or the metal hydroxide has the function of improving wettability of the pigment by reducing the high hydrophobicity and the high aggregation tendency inherent to the pigment, and hence, the affinity with the binder to impart the dispersibility of the pigment in the pigment dispersion and photosensitive composition as will be described below and the dispersibility in the development step, and therefore, the development residue will be suppressed. Irrespective of the type of the organic black pigment in the core, it is also preferable that the coating layer is further provided with hydroxy group on the surface, and presence of such hydroxyl group leads to improvement in the dispersibility in the alkali-soluble resin in the photosensitive composition as will be described below. More specifically, when the film in the unexposed area in the case of the negative type and the film of the exposed area in the case of the positive type is dissolved and removed in the development step, the high dispersibility in the alkaline developer contributes for the decrease of the development residue caused by the presence of the coarse pigment aggregates. Examples of the hydroxy group on the surface of the coating layer are the hydroxyl group remaining on the solid surface and the hydroxyl group generated by the conversion from the silica or the metal oxide in the course of precipitating the silica and/or the metal oxide and/or the metal hydroxide on the core surface. Examples of the coating layer having hydroxy group on its surface include coating layers wherein the coating material having surface hydroxy group such as silica, alumina, aluminum hydroxide, zirconia, zirconium hydroxide, and titanium oxide is located as the outermost layer of the coating layer. The hydroxy group is preferably the hydroxy group bonded to silicon atom (silanol group), the hydroxy group bonded to aluminum atom (aluminol group), the hydroxy group bonded to zirconium atom (zirconol group), or the hydroxy group bonded to titanium atom (titanol group).

Of the silica, the metal oxide, and the metal hydroxide, the coating material preferably contains the silica. Due to the low permittivity of silica, the increase in the permittivity of the pixel division layer can be suppressed even if the coating weight is high.

The silica and/or the metal oxide and/or the metal hydroxide in the coating layer can be analyzed by X-ray diffractometry. The X-ray diffractometer used may be, for example, powder X-ray diffractometer manufactured by MAC Science. The weight of the silicon or the metal in the silica, and/or the metal oxide, and/or the metal hydroxide is calculated down to the first decimal place by rounding to the first decimal place. Weight of the core of the black pigment may be determined by placing the weighed black pigment in a mortar, grinding the black pigment with a pestle to peel the coating layer, immersing the ground black pigment in an amide solvent such as dimethylformamide and N-methyl pyrrolidone to selectively dissolve the core and remove the dissolved content as the filtrate, repeating the procedure as described above until the filtration product is no longer black-tinted, and weighing the filtration product and calculating the difference with the weight of the black pigment. If desired, the dissolution of the core may be conducted by heating the solvent. When the core contains a component which does not dissolve in the amide solvent, the sum of the weight of the residue when the black pigment of the present invention is heated in the presence of air by using a small electric sintering kiln at a temperature higher than the temperature at which the core is volatilized by thermal decomposition for the period until the weight decrease is satisfied and the weight decrease after separately heating at 150° C. for 30 minutes for water removal can be regarded as the weight of the coating layer, and the weight of the core can be calculated from the difference between this weight of the coating layer and the weight of the black pigment before the heating. It is to be noted that the organic black pigment can be volatilized and sufficiently removed by setting the interior temperature of the small sintering kiln to an actual temperature of 700 to 800° C. In addition, when the cured film as will be described below containing the black pigment of the present invention is analyzed, energy dispersive X-ray spectroscopy and wavelength dispersive X-ray spectroscopy using fluorescence X-rays are useful since such analysis can conduct nondestructive simultaneous multielement analysis.

The "silica" as used in the present invention generically refers to silicon dioxide and hydrates thereof including silica ($SiO_2$) and silica hydrates ($SiO_2.nH_2O$). In addition, the "metal oxide" as used in the present invention generically refers to a metal oxide and hydrates thereof. In the case of alumina which is a typical metal oxide, it genetically refers to alumina ($Al_2O_3$) and alumina hydrates ($Al_2O_3.nH_2O$). In the case of the "metal hydroxide", typical metal hydroxides is aluminum hydroxide ($Al(OH)_3$) and the like. The silica and/or the metal oxide and/or the metal hydroxide may be either amorphous or crystalline, and in the case of the crystalline compound, the crystal type is not particularly limited.

The preferred metal oxide and metal hydroxide include those having chemical durability such as alkali resistance, heat resistance, and light resistance as well as physical durability such as Vickers hardness and abrasion resistance that enable endurance to the mechanical energy applied in the course of the dispersion step which is adequately adjusted to be optimal for the dispersion, and examples include alumina, zirconia, zinc oxide, titanium oxide, iron oxide, aluminum hydroxide, and the like which may be used in combination of two or more. Of these, the preferred are alumina and zirconia in view of the insulation properties, UV transmittance, and near infrared transmittance, and the more preferred is alumina in view of the dispersibility in an alkali-soluble resin or solvent. The metal oxide and the metal hydroxide may be surface-modified with a group containing an organic group.

The silica and/or the metal oxide and/or the metal hydroxide may contain water of crystallization. Presence of the water of crystallization may contribute for suppressing the formation of the hard cake pigment precipitates generated with the lapse of time after the dispersion by the wet medium dispersion in the pigment dispersion and/or in the photosensitive composition depending on the dispersion medium. A part or all of the water of crystallization may be removed by heating in the course of forming the pixel division layer by using the photosensitive composition containing the black pigment of the present invention.

The coating layer containing the silica and/or the metal oxide and/or the metal hydroxide may be in the form wherein at least one oxide or hydroxide of the silicon atom or the simple metal atom are deposited on the surface of the core or in the form as a complex oxide wherein silicon and at least one type of the metal or at least two types of the metals are chemically bonded by an intervening oxygen atom. Examples of the complex oxide include silica-alumina complex oxide, silica-zirconia complex oxide, silica-alumina-zirconia, and alumina-zirconia complex oxide. When the coating layer contains a complex oxide at least in some parts of the coating layer, peeling of the coating layer will be suppressed by the improved bond between the different coating materials.

When the coating layer is solely formed from silica, the pattern linearity may likely to be decreased with the increase in its coating weight or with the increase in concentration of the black pigment in the pixel division layer due to surface irregularity of the silica itself, and such decrease in the pattern linearity can be suppressed by forming an alumina coating layer on the surface of the silica layer coating the core. Alumina has marked effects in improving the dispersibility of the pigment in the aqueous suspension of the pigment in the particle formation step after the surface treatment step in the production of the black pigment of the present invention, and it contributes for smooth adjustment of the particle size of the secondary aggregate to the desired range, and hence, to the improvement of productivity as well as quality stability. The coating weight of the alumina is preferably at least 10.0 parts by weight and more preferably at least 20.0 parts by weight in relation to 100 parts by weight of the silica.

When the coating layer contains the silica, the content of the silica in the coating layer is preferably 1.0 to 20.0 parts by weight in 100 parts by weight of the core. The content of the silica is expressed in terms of $SiO_2$ calculated from the Si content according to the technical knowledge common to those skilled in the art in consideration of the case where silica is not the only component in the interior or in the surface layer of the coating layer or the case wherein degree of dehydration varies by the thermal hysteresis. When the silica content is at least 1.0 part by weight, the core will be fully coated by the coating layer and the development residue will be sufficiently suppressed even when the silica is used alone. The content is preferably at least 2.0 parts by weight and more preferably at least 5.0 parts by weight. In the meantime, when the silica content is up to 20.0 parts by weight, the pixel division layer will have an improved pattern linearity, and the content is more preferably up to 15.0 parts by weight.

When the coating layer contains a metal oxide and/or a metal hydroxide, the total content of the metal oxide and the metal hydroxide in the coating layer is preferably 0.1 to 15.0 parts by weight in relation to 100 parts by weight of the core. The "total content of the metal oxide and the metal hydroxide" as used herein is the content of the metal oxide or the metal hydroxide when only one of these has been incorporated, and the total content when both have been incorporated. When the content of the metal oxide is at least 0.1 part by weight, dispersibility and pattern linearity will be improved, and the content is more preferably at least 0.5 parts by weight. When the coating layer does not contain silica, the total content of the metal oxide and the metal hydroxide is preferably at least 2.0 parts by weight and more preferably at least 5.0 parts by weight. In the meantime, when the total content of the metal oxide and the metal hydroxide is up to 15.0 parts by weight, gradient of the pigment concentration will be less likely to be generated in the photosensitive composition for forming the pixel division layer which is typically designed to have a low viscosity of up to 15 mPa·s in view of the consistent film thickness after the coating, and the storage stability will be thereby improved. The content is more preferably up to 10.0 parts by weight. The "content of the metal oxide and the metal hydroxide" as used herein is expressed in terms of the oxide calculated from the metal content according to the technical knowledge common to those skilled as in the case of the silica. More specifically, in the case of the aluminum oxide and the hydrates of the aluminum oxide, the content may be commonly expressed in terms of the alumina irrespective of the presence of the water of crystallization or the content variation by the degree of thermal hysteresis, and content of the alumina and the aluminum hydroxide may be commonly expressed in terms of the $Al_2O_3$ irrespective of the presence of the water of crystallization or the content by the thermal hysteresis. Zirconia and titanium oxide may also be expressed in terms of $ZrO_2$ and $TiO_2$, respectively.

The black pigment of the present invention may have the surface of the coating layer modified with an organic group by using an organosilicon compound (silane coupling agent), and in this case, the reaction point is the hydroxy group on the surface of the silica and/or the metal oxide and/or the metal hydroxide in the coating layer. When the black pigment of the present invention is incorporated in the negative photosensitive composition, a surface treatment using an organosilicon compound having a radical-polymerizable group and a silicon atom may be conducted to impart the black pigment with photo-crosslinkability and promote photocuring with the compound having at least two radical-polymerizable groups in the negative photosensitive composition to strengthen the bond at the boundary between the black pigment and the binder. As a consequence, the development residue generated by the peeling of the film in the exposed region can be further suppressed when the pixel division layer is patterned at a low exposure or when the shower pressure in the development step is strong. Examples of the organosilicon compound having a radical-polymerizable group and silicon atom include vinyltrimethoxysilane, vinyltriethoxysilane, styryltrimethoxysilane, 3-methacryloxypropylmethyldimethoxysilane, 3-methacryloxypropyltrimethoxysilane, and 3-acryloxypropyltrimethoxysilane, which may be used in combination of two or more. When the treatment is conducted by using such organosilicon compound, the outermost surface of the black pigment is preferably modified by a group containing a radical-polymerizable group and silicon atom. In addition, depending on the type of the dispersion medium incorporated in the pigment dispersion or the photosensitive composition as described below, a surface treatment may be optionally conducted by using an organosilicon compound which does not have a radical-polymerizable group such as methyltrimethoxysilane, methyltriethoxysilane, phenyltrimethoxysilane, phenyltriethoxysilane, dimethyldimethoxysilane, or dimethoxydiphenylsilane to control the surface polarity of the black pigment of the present invention to thereby improve the wettability by the dispersion medium.

In the meantime, the outermost layer of the black pigment of the present invention may be further treated by an organic surface treating agent for the purpose of improving the wettability to the dispersant or solvent used in preparing the pigment dispersion. The organic surface treating agent is preferably the one which can be readily removed from the pixel division layer by the heat generated in the curing step as described below, and examples include trimethylol ethane, trimethylolpropane, triethanolamine, and derivatives thereof, which may be used in combination of two or more. By treating with such organic surface treating agent, amount of the coarse particles remaining after the wet medium dispersion in the course of preparation of the pigment dispersion of the black pigment of the present invention can be reduced in some cases.

Next, the method for producing the black pigment of the present invention is described.

The benzodifuranone-based black pigment constituting the core of the black pigment of the present invention can be obtained by cyclization of 2,5-dihydrobenzene-1,4-diacetic acid and an isatine in the presence of an acidic catalyst. More specifically, in an exemplary process, the 2,5-dihydroxybenzene-1,4-diacetic acid and the isatine and/or an isatine derivative are mixed in a molar ratio of 1:2, and after adding p-toluenesulfonic acid monohydrate as a catalyst, the mixture is stirred in a mixed solvent of concentrated acetic acid and water. The resulting reaction mixture is heated to a refluxing temperature and the stirring is continued for at least 20 hours. Next, the reaction mixture is further stirred without heating until the solution temperature decreases to 90° C. After allowing the reaction mixture to cool down to a temperature of 20 to 30° C., the mixture is filtered, and the filtration product is washed with cool concentrated acetic acid, and then with methanol to obtain the reaction product.

This reaction product is added to dimethyl sulfoxide, and after stirring the mixture at 120 to 150° C. for 15 to 20 hours for dissolution of the reaction product, the stirring of the dimethyl sulfoxide solution is continued without heating until the solution temperature is reduced to 100° C. for crystallization of the reaction product to thereby obtain the suspension of pigment crude containing coarse particles. Next, the pigment crude is separated by filtration, washed with dimethyl sulfoxide at 20 to 30° C. and then with water, and the resulting product is dried under reduced pressure at 40° C. for at least 24 hours, and particle formation is conducted by dry pulverization with a ball mill or the like to prepare a benzodifuranone-based black pigment. Use of the isatine or an isatine derivative having the desired substituent for the starting material enables the production of a benzodifuranone-based black pigment having various groups represented by $R^1$ to $R^{10}$ in the general formula (1) and/or (2). The benzodifuranone-based pigment represented by the formula (3) may also be produced by using a commercially available product, for example, "Irgaphor" (Registered Trademark) Black S0100 manufactured by BASF.

The perylene-based black pigment of (a) forming the core of the black pigment of the present invention can be prepared, for example, by cyclization of perylene-3,4,9,10-tetracarboxylic acid dianhydride with o-diamine. More particularly, in an exemplary process, the perylene-3,4,9,10-tetracarboxylic acid dianhydride and the o-diamine in a molar ratio of 1:2 are added to phenol which has been melted at 70° C., and a mixture having a catalyst such as p-toluenesulfonic acid or piperazine is further added. The mixture is heated to a temperature of 170 to 190° C., and the stirring is continued 6 to 10 hours while maintaining the temperature of 170 to 190° C. so that one amino group is bonded to form an imide and the other amino group is bonded to fully promote the cyclization. The water generated is then separated by distillation as an azeotropic mixture with phenol. Next, the mixture was cooled to 130° C., and after adding methanol and stirring at 50 to 70° C. for 1 hour, the reaction product is separated by filtration, and washing with methanol is continued until the filtrate is transparent, and then with water. After drying at reduced pressure at 40° C. for at least 24 hours, the pigment crude is obtained. The pigment crude is pulverized by dry pulverization with a ball mill or the like, and wet pulverization by solvent salt milling or the like is optionally conducted for particle formation to thereby produce a perylene-based black pigment.

Use of o-phenylenediamine and/or the o-phenylenediamine having a desired substituent for the o-diamine (the starting material) enables the production of a perylene-based black pigment having various groups represented by $R^{13}$ to $R^{20}$ in the general formula (4) and/or (5).

The azo-based black pigment of (a) in the core of the black pigment of the present invention can be produced by azo coupling reaction of a diazo compound prepared by diazotizing a monoamine with a compound having 11H- benzo [a] carbazole structure in a molar ratio of 1:1. More specifically, in an exemplary process, a monoamine having isoindolinone structure or a monoamine having isoindoline structure is added in nitrobenzene or o-dichlorobenzene, and hydrochloric acid is added to prepare a hydrochloride. Sodium nitrite aqueous solution is then added for diazotization to prepare a diazonium salt solution. In the meantime, a compound having 11H-benzo [a] carbazole structure and sodium hydroxide are dissolved in methanol to prepare a coupling solution. Next, the coupling solution is gradually added to the solution of the diazonium salt solution maintained at a temperature of 10 to 20° C., and the pH is adjusted to 6 to 8 by using sodium acetate. After stirring the solution for at least 2 hours, the heating temperature is adequately adjusted, and azo coupling reaction is completed by stirring for at least 3 hours. After optionally heating the reaction product in an amide-based organic solvent for crystallization, the reaction product is separated by filtration. The separated product is washed with methanol until the filtrate is transparent, and then with water, and dried under reduced pressure at 40° C. for at least 24 hours. The resulting pigment crude is subjected to a dry pulverization with a ball mill or the like, and then to an optional wet pulverization by solvent salt milling method or the like for particle formation, to thereby produce an azo-based black pigment having various groups represented by the general formula (8).

Use of a combination of a monoamine having isoindolinone structure or a monoamine having isoindoline structure having a desired substituent with a compound having 11H-benzo [a] carbazole structure having a desired substituent for the starting material enables production of an azo-based black pigment having various groups represented by X and (Y)n in the general formula (8). When 3-(4-aminophenylimino)-1-oxo-4,5,6,7-tetrachloro isoindoline is diazotized for use as a monoamine having isoindoline structure, and this compound is subjected to a coupling reaction with N-(2-methyl-4-methoxyphenyl)-2-hydroxy-11H-benzo [a] carbazole-3-carboamide, an azo-based black pigment represented by the formula (9) is produced. On the other hand, when 2-[3-[(4-aminophenyl) amino]-1H-isoindol-1-ilidene]-2-cyano-N-methyl acetamide is diazotized for use as a monoamine having isoindoline structure, and this compound is subjected to a coupling reaction with N-(2-methyl-4-methoxyphenyl)-2-hydroxy-11H-benzo [a] carbazole-3-carboamide, an azo-based black pigment represented by the formula (10) is produced.

The methods used for the formation of the coating layer on the surface of the a core include, for example, a method wherein the silica and/or the metal oxide and/or the metal hydroxide is coated by precipitation method wherein an alkali metal salt is used for the silicon source and/or the metal element source, a method wherein the metal oxide and/or the metal hydroxide is coated by hydrolysis method wherein a water-soluble metallic compound is used for the metal element source, a method wherein the silica and/or the metal oxide and/or the metal hydroxide is coated by sol-gel method wherein a tetrafunctional metal alkoxide is used for the silicon source and/or the metal element source, and a method wherein the silica is coated by polysilazane method by using perhydropolysilazane for the silicon source. Of these, the precipitation method, the hydrolysis method, and the sol-gel method are preferable due to the ease of the reaction control and the high productivity, and the precipitation method is more preferable in view of the ease of producing a coating layer having a high alkali resistance and simultaneously exhibiting sufficient hardness and dispersibility. When the pixel division layer of the organic EL display is formed by including the black pigment of the present invention in the photosensitive composition as will be described below, the alkali resistance to be realized by the formation of the coating layer as represented by means of the time index based on the development time is preferably at least 1.5 folds and more preferably at least 2 folds of the development time which will be adequately set in the development step as described below. In other words, the pigment is preferably prepared so that the core in the black pigment of the present invention can retain the state before the development step as long as possible upon contact with the alkaline developer, and the coating layer is preferably formed by various production methods as described below so that this time index is well satisfied. The black pigment of the present invention prepared by various production methods may preferably generate minimum amount of gas in the high-temperature condition of at least 200° C. and more preferably at least 250° C. in view of improving the heat resistance required for the pixel division layer.

The method for producing a black pigment using the precipitation method is preferably a method comprising at least steps (a) to (b) as described below, and more preferably a method further comprising the steps (c) to (f). The steps (a) to (f) are preferably included in this order.

(a) preparation step wherein an aqueous suspension of the pigment containing the core is prepared;

(b) surface treatment step wherein an alkali metal salt and an inorganic acid are added to the aqueous suspension of the pigment containing the core having its pH maintained in the range of at least 2 and less than 7 to coat a coating material containing silica and/or a metal oxide and/or a metal hydroxide on the surface of the core;

(c) washing step wherein filtration and washing with water are conducted at least once to remove the water-soluble components;

(d) particle formation step wherein the aqueous suspension of the pigment is formed again and pulverization is conducted to adjust the secondary aggregate particle size to the desired range;

(e) ion trap step wherein ionic impurities are removed; and (f) separation step wherein the black pigment is separated from the aqueous suspension of the pigment.

In the preparation step (a), the core containing the organic black pigment is preferably added to a dispersion medium at least containing water so that the solid content is 1 to 20% by weight, and the mixture is stirred for disaggregation to prepare the aqueous suspension of the pigment. The "aqueous suspension of the pigment" as used herein is a water-containing slurry wherein content of water in the components other than the solid content is 10 to 100% by weight, and if desired, an organic solvent may be simultaneously used as a part of the dispersion medium by considering wettability of the core surface. The organic solvent used in combination with the water in the preparation step (a) is, for example, an organic solvent such as an alcohol, a glycol, or an ether. Exemplary agitators include those having a blade such as a homodisper and a dissolver.

When the disaggregation of the core is sufficiently accomplished in the preparation step (a), the average coverage rate can be readily increased in the subsequent surface treatment step (b). When sufficient disaggregation of the core is difficult in the aqueous suspension of the pigment at a temperature of 10 to 30° C., the disaggregation can be further promoted, for example, by the procedure wherein the stirring is conducted by setting the suspension temperature at 40 to 80° C., a procedure wherein a minute amount of a nonionic surfactant is added to the extent not adversely affecting the coating, namely, in an amount of less than 1 part by weight in relation to 100 parts by weight of the core, and a procedure wherein the core is pulverized by wet medium dispersion or the like in a bead mill dispersion apparatus filled with ceramic beads. Exemplary nonionic surfactants include surfactants such as polyoxyethylene alkyl ether, polyoxyethylene lauryl ether, and polyethylene glycol, and when the black pigment of the present invention is used for the pixel division layer of the organic EL display, use of a lowest possible amount is desirable for improving the heat resistance of the black pigment of the present invention. When a pretreatment is conducted by using a wet medium dispersion apparatus, the pigment particles became smaller with the progress of the disaggregation and increase of the surface energy is likely to invite re-aggregation, and accordingly, the takt time between the completion of the preparation step (a) and the start of the surface treatment step (b) as will be described below should preferably be designed as short as possible, and both steps may be continuously conducted by connecting the steps in in-line system. However, it is only that the disaggregated state of the core needs to be temporally maintained at least in the period between the completion of the preparation step (a) and the completion of the surface treatment step (b) as described below, and the aqueous suspension of the pigment prepared in the preparation step (a) does not necessarily retain its highly stable dispersion state. In order to suppress the local variation of the pH in the surface treatment step (b) as described below, the aqueous suspension after the preparation is preferably adjusted so that the viscosity of the suspension is up to 20 mPa·s.

In the surface treatment step (b), a coating material containing silica and/or a metal oxide and/or a metal hydroxide is coated on the surface of the core by adding an alkali metal salt and an inorganic acid to the aqueous suspension of the pigment containing the core obtained in the preparation step (a) while maintaining the pH in the range of at least 2 and less than 7. The alkali metal salt and the inorganic acid are preferably added by a method allowing simultaneous addition of these components with each of their addition speeds adjusted so that the pH can be maintained within the desirable range. The coating weight can be adjusted to the desired range by controlling the amount of addition. The addition may be conducted by injecting the alkali metal salt and the inorganic acid from a plurality of ports to prevent the uneven distribution and realize the coverage rate at a higher consistency, and this method is more advantageous in the case when the aqueous suspension of the pigment has a larger volume. Compared to the inorganic black pigment such as carbon black and titanium black, organic black pigments exhibit excellent near-infrared transmittance, and the photosensitive composition as will be described below containing such organic black pigment enables positional adjustment of the exposure mask in relation to the substrate using a near-infrared irradiation system and a near-infrared camera, namely, the near-infrared alignment at a high precision in the subsequent exposure step, and this leads to improvement in the productivity of the organic EL display. In particular, when the benzodifuranone-based black pigment is in the core, the light-shielding property and the near-infrared transmittance inherent to the pigment in the core can be maintained by conducting the simultaneous addition while maintaining the pH of the aqueous suspension of the pigment in the range of at least 2 and less than 7, and the near-infrared alignment at a high precision can be accomplished by using the photosensitive composition containing the black pigment of the present invention.

For example, when silica is coated as the coating material, the alkali metal salt used is preferably an alkaline metal silicate salt which is a silicon source. Silica may be precipitated on the surface of the core by neutralization of the alkaline metal silicate salt with the inorganic acid and the coating layer may be thereby formed. Examples of the alkaline metal silicate salt include sodium silicate and potassium silicate. The sodium silicate may be the one commercially available in the form of an aqueous solution in the trivial name of water glass and exemplary inorganic acids used include mineral acids such as sulfuric acid and hydrochloric acid and phosphoric acid.

For example, when alumina is coated as the coating material, the alkali metal salt used is preferably an alkali metal aluminate which is an aluminum source. Aluminum hydroxide may be precipitated on the surface of the core by neutralization of the alkali metal aluminate with the inorganic acid and the water of crystallization may be dissociated from the aluminum hydroxide for conversion into alumina by heating to a temperature of at least 200° C. to thereby form the coating layer. Examples of the alkali metal aluminate used include sodium aluminate and potassium aluminate, and the inorganic acid used may be those mentioned as the inorganic acid used for the coating of the silica.

For example, when silica-alumina complex oxide is coated, an alkaline metal silicate salt or an alkali metal aluminate is preferably used for the alkali metal salt.

The alkali metal salt used is preferably a high purity product. However, when the impurity cannot be removed in the washing step (c) and the ion trap step (e) as described below or when the alkali metal salt contains impurity which has adverse effects in the operation of the organic EL display, a pretreatment may be optionally conducted to remove the impurities.

In the surface treatment step (b), the aqueous suspension of the pigment is preferably kept at a pH in the range of at least 2 and less than 7 from the beginning to the completion. In order to suppress local pH variation, the aqueous suspension of the pigment is preferably stirred sufficiently without cease. When the pH of the aqueous suspension of the pigment is at least 2, the formation of the coating layer will be promoted since the re-aggregation of the already disaggregated core is suppressed. The formation of the coating layer is also promoted when the pH of the aqueous suspension of the pigment is less than 7 since decomposition of the pigment surface in the alkaline pH is avoided. The pH is preferably less than 6. The pH of the aqueous suspension of the pigment can be measured by a pH meter, and the maximum value and the minimum value of the pH continuously indicated by the pH meter for at least 10 seconds during the period from the beginning to the end of the surface treatment step (b) is preferably within the range as described above. In addition, the temperature of the aqueous suspension of the pigment during the surface treatment step (b) is preferably in the range of 40 to 80° C.

If necessary, a water-soluble polymer may be added as a stabilization aid to suppress the re-aggregation in the course of the surface treatment step (b). Amount of the water-soluble polymer added is preferably less than 1 part by weight in relation to 100 parts by weight of the core. The water-soluble polymer is preferably the one which can be removed in the subsequent washing step (c), and examples include polyacrylic acid, poly(sodium acrylate), a copolymer of acrylic acid and maleic acid, and methylcellulose. However, when the black pigment of the present invention is used for the pixel division layer of the organic EL display, amount of the water-soluble polymer added is preferably reduced to the utmost in view of increasing the heat resistance of the black pigment, and the surface treatment may be conducted while suppressing the re-aggregation by an ultrasonic apparatus.

In the washing step (c), the solid content concentration of the aqueous suspension of the pigment is increased to at least 30% by weight by using pressure filtration apparatus, centrifuge, or the like so that the pigment is in the form a cake and water is again added to this cake. This procedure is preferably repeated until the sodium ion or the potassium ion from the alkali metal salt and sulfuric acid ion or chlorine ion from the inorganic acid, and the water-soluble impurities are removed.

In the particle formation step (d), the aqueous suspension of the pigment is prepared again, and the pulverization is conducted by wet medium dispersion in a ball mill, a bead mill, or the like filled with ceramic beads to adjust the particle size of the secondary aggregate to the desired range. The aqueous suspension of the pigment preferably has a solid content concentration of 1 to 20% by weight. The water used for the suspension is preferably deionized water.

In the ion trap step (e), an ion exchange resin is added to the aqueous suspension of the pigment which has been formed into particles and after stirring the mixture, and the ionic impurities are preferably removed by adsorption to the ion exchange resin. Since the ion exchange treatment is conducted in wet state for the aqueous suspension of the pigment as it is, adsorption ability of the ion exchange resin for the ionic impurities will be improved. Exemplary ion exchange resins include "Diaion" (Registered Trademark) (manufactured by Mitsubishi Chemical Corporation) and "Umberlite" (Registered Trademark) (manufactured by ORGANO CORPORATION). The ion exchange treatment is preferably conducted by simultaneously using a cation-exchange resin and an anion-exchange resin and choosing the type of the ion exchange resin, amount used, and the agitation time so that the ionic impurities remaining in the black pigment after the separation step (f) is up to 50 ppm, and more preferably up to 10 ppm. The agitation time is preferably at least 6 hours. The treatment is preferably conducted so that electrical conductivity is up to 500 μS/cm, and more preferably up to 200 μS/cm. The content of the ionic impurities can be qualitatively and quantitatively measured by ICP-MS of the sintered ash or ion chromatography of the water-soluble content using the black pigment after the separation step (f) for the sample.

In the separation step (f), the aqueous suspension of the pigment is filtered, and the filtration product is dried for water removal in a drying oven at an actual temperature of 80 to 150° C. for at least 6 hours. If desired, dry pulverization, shifting, classification, or the like may be conducted for particle formation. The apparatus used for the dry pulverization is preferably a ball mill in view of the productivity, or an air stream/gyratory crusher such as jet mill in view of the more precise control of the secondary aggregate particle size without applying excessive mechanical energy for a long time. These processes may be combined to conduct a multi-stage dry pulverization. Also, an organic surface treating agent that had been vaporized or atomized may be sprayed into the mill to conduct the surface treatment during the pulverization. After the particle formation, the low boiling point organic components such as the adsorption water, the water of crystallization, the surfactant and/or the water-soluble polymer in the coating layer may be volatilized by a heating treatment depending on the component in the coating layer. In view of further improving the alkali resistance and the hardness of the coating layer to thereby reduce the development residue in the development step as will be described below, the temperature is preferably elevated to at least 180° C. and more preferably to a temperature of at least 200° C. in the heating treatment. In the meantime, in view of further suppressing the thermal decomposition of the organic black pigment to retain the optical properties inherent to the organic black pigment and leave the hydroxy groups on the surface of the coating material to an adequate degree to further improve the dispersibility of the black pigment, the temperature is preferably elevated to up to 350° C. and more preferably to up to 300° C. In addition, in view of further improving the alkali resistance and the hardness of the coating layer to reduce the development residue in the development step as described below, the heating is preferably conducted for at least 10 minutes and more preferably 30 minutes. In the meantime, in view of further suppressing the thermal decomposition of the organic black pigment to retain the optical properties inherent to the organic black pigment and leave the hydroxy groups on the surface of the coating material to an adequate degree to further improve the dispersibility of the black pigment, the heating is preferably conducted for up to 3 hours. Exemplary heaters include a drying oven.

The method for producing a black pigment using the hydrolysis method is preferably a method comprising at least steps (a) to (b) as described below, and more preferably a method further comprising the steps (c) to (f). The steps (a) to (f) are preferably included in this order.

(a) preparation step wherein an aqueous suspension of the pigment containing the core is prepared;

(b) surface treatment step wherein a water-soluble metallic compound is added to the aqueous suspension of the pigment containing the core having its pH maintained in the range of at least 2 and less than 7 to coat a coating material containing a metal oxide and/or a metal hydroxide on the surface of the core;

(c) washing step wherein filtration and washing with water are conducted at least once to remove the water-soluble components;

(d) particle formation step wherein the aqueous suspension of the pigment is formed again and pulverization is conducted to adjust the secondary aggregation particle size to the desired range;

(e) ion trap step wherein ionic impurities are removed; and (f) separation step wherein the black pigment is separated from the aqueous suspension of the pigment.

The preparation step (a), the washing step (c), the particle formation step (d), the ion trap step (e), and the separation step (f) may be conducted as in the case of the precipitation method as described above. The surface treatment step (b) of the hydrolysis method may be conducted as in the case of the surface treatment step (b) of the precipitation method except that the alkali metal salt and the inorganic acid are replaced with a water-soluble metallic compound.

For example, when the zirconia is coated, zirconium oxychloride ($ZrOCl_2 \cdot 8H_2O$) which is a zirconium source is preferably used for the water-soluble metallic compound. The aqueous suspension of the pigment prepared in the preparation step (a) is placed in a flask equipped with a reflux condenser, and an aqueous solution of the zirconium oxychloride is added to promote hydrolysis at a temperature of 70 to 100° C. to thereby precipitate the zirconia on the surface of the core and form the coating layer. Preferably, the washing step (c) is conducted after neutralizing the hydrochloric acid generated as a byproduct in the hydrolysis.

For example, when the titanium oxide is coated, a water-soluble titanium compound such as titanyl sulfate or titanium tetrachloride which is a titanium source is preferably used for the water-soluble metallic compound, and the preferred is the aqueous solution of titanyl sulfate in view of the ease of controlling the reaction and untroublesome process. The aqueous suspension of the pigment prepared in the preparation step (a) is placed in a flask equipped with a reflux condenser, and an aqueous solution of the titanyl sulfate ($TiOSO_4$) is added to promote hydrolysis at a temperature of 70 to 100° C. and to thereby precipitate the titanium oxide on the surface of the core and form the coating layer. Preferably, the washing step (c) is conducted after neutralizing the sulfuric acid generated as a byproduct in the hydrolysis.

The acid generated as a byproduct in the surface treatment by hydrolysis may be neutralized with an alkali component such as ammonia solution.

The method for producing a black pigment using the sol-gel method is preferably a method comprising at least steps (a) to (b) as described below, and more preferably a method further comprising the steps (c) to (f). The steps (a) to (f) are preferably included in this order.

(a) preparation step wherein an aqueous suspension of the pigment containing the core is prepared;

(b) surface treatment step wherein a tetrafunctional metal alkoxide is added to the aqueous suspension of the pigment containing the core having its pH maintained in the range of at least 2 and less than 7 to coat a coating material containing silica and/or a metal oxide and/or a metal hydroxide on the surface of the core;

(c) washing step wherein filtration and washing with water are conducted at least once to remove the water-soluble components;

(d) particle formation step wherein the aqueous suspension of the pigment is formed again and pulverization is conducted to adjust the secondary aggregate particle size to the desired range;

(e) ion trap step wherein ionic impurities are removed; and (f) separation step wherein the black pigment is separated from the aqueous suspension of the pigment.

The preparation step (a), the washing step (c), the particle formation step (d), the ion trap step (e), and the separation step (f) may be conducted as in the case of the precipitation method as described above. The surface treatment step (b) of the sol-gel method may be conducted as in the case of the surface treatment step (b) of the precipitation method except that the alkali metal salt and the inorganic acid are replaced with a tetrafunctional metal alkoxide.

For example, when the silica is coated, a tetrafunctional silane alkoxide may be used for the silicon source, and when the zirconia is coated, a tetrafunctional zirconium alkoxide may be used for the zirconium source, and when the titanium oxide is coated, a tetrafunctional titanium alkoxide may be used. Examples of the preferable tetrafunctional silane alkoxide include tetramethoxy silane and tetraethoxy silane, and examples of the tetrafunctional zirconium alkoxide include tetra(n-butoxy) zirconium and tetra(tert-butoxy) zirconium, and examples of the tetrafunctional titanium alkoxide include tetramethoxy titanium, tetraethoxy titanium, tetra(n-butoxy) titanium, and tetra(tert-butoxy) titanium.

To the aqueous suspension of the pigment prepared in the preparation step (a), a tetrafunctional metal alkoxide is added, and after promoting the hydrolysis at a temperature of 30 to 80° C. and then elevating the temperature, dehydration condensation is promoted at a temperature of 90 to 150° C. In the initial stage of the dehydration condensation, a sol derived from a tetrafunctional metal alkoxide is deposited on the surface of the core to thereby precipitate the silica, the metal oxide, or the metal hydroxide to form a coating layer. If desired, an acid catalyst or a base catalyst may be used to sufficiently proceed the hydrolysis. Use of the catalyst is particularly useful when the tetrafunctional silane alkoxide is used for the silicon source. The catalyst is preferably an acid catalyst in view of the ease of removing the catalyst in the subsequent ion trap step (e). In addition, the preferable acid catalysts used are weak acids such as phosphoric acid and acetic acid in view of suppressing the generation of the gelation products not involved in the coating of the core by allowing the dehydration condensation to proceed at an adequate reaction speed.

When the desired average coverage rate is not realized by increasing the amount of the coating material source or when there is a need to improve the average coverage rate without excessively increasing the coating weight in various production methods of the black pigment of the present invention, the surface treatment step (b) may be conducted two or more times. In an exemplary such method, (b-1) the step of the first surface treatment, (b-2) the step of disaggregation by wet medium dispersion, and (b-3) the step of the second surface treatment may be conducted in this order.

In the first surface treatment step (b-1), a certain amount of coating material is coated, and at least a part of the pigment surface becomes hydrophilic, resulting in the improved self-diffusion in the aqueous dispersion medium. This facilitates the disaggregation in the step of disaggregation by wet medium dispersion (b-2) and less likeliness of the subsequent re-aggregation, and in turn, improvement in the average coverage rate per coating weight in the second surface treatment step (b-3). This trend is the result of the higher wettability of the coating layer containing the silica and/or the metal oxide and/or the metal hydroxide to the aqueous medium compared to the wettability of the core to the aqueous medium, and the method conducting two or more surface treatment steps is particularly effective in coating a coating material on the core containing a perylene-based black pigment. In addition, the number of the surface treatment steps conducted is preferably up to 3 and more preferably up to 2 in view of the productivity.

Next, the pigment dispersion of the present invention is described. The pigment dispersion of the present invention contains the black pigment, the dispersant, and the solvent.

The dispersant as used herein is the one having both a group having an affinity for the black pigment which has the function of chemically bonding to or adsorbing onto the surface of the pigment and a polymer chain or group having an affinity for the solvent. The action mechanism of the dispersant is associated not only with the acid-base interaction but also multiply with the hydrogen bond, Van-der-Waals forces, and the like, and in the wet medium dispersion conducted in the preparation of the pigment dispersion, the dispersant has the effect of promoting steric repulsion between the black pigments, and accordingly, the effect of promoting the disaggregation of the black pigment. Preferable examples of the dispersant used in the present invention are an alkali-soluble resin and a polymer resin dispersant having a basic adsorption group which are preferably used in combination in view of reducing the viscosity of the pigment dispersion, suppressing the re-aggregation of the black pigment which occur with the lapse of time, and improving the stability of the dispersion. The dispersion stability of the pigment dispersion has an influence on the storage stability of the photosensitive composition as described below prepared by using the pigment dispersion, and also, on the development when the pixel division layer is formed. In the preparation of the photosensitive composition, various components are added to the pigment dispersion, and as a consequence, equilibrium of the desorption and resorption of the dispersant on the pigment surface shifts toward the desorption side, and the dispersion state in the resulting photosensitive composition is destroyed and the viscosity may increase with the lapse of time. The pigment dispersion of the present invention has high storage stability, and also, when a photosensitive composition is prepared by using such pigment dispersion of the present invention, the photosensitive composition also enjoys the high storage stability, and therefore, the problem of the development residue will be improved.

The alkali-soluble resin is a resin which contains carboxyl group and/or hydroxy group in its structure as an alkali-soluble group.

Since the carboxyl group and/or the hydroxy group has an affinity for the pigment, the dispersion stability of the black pigment in the pigment dispersion can be further improved. In addition, when the black pigment of the present invention has hydroxy group on its surface, the formation of the hydrogen bond with the carboxyl group and/or the hydroxy group of the alkali-soluble resin results in the improvement of the dispersion stability. Furthermore, the presence of the carboxyl group and/or the hydroxy group results in the solubility in the alkaline developer, and in the photolithography using the negative (or positive) photosensitive composition as will be described below containing such group, selective removal of the unexposed area (or the exposed area) is enabled to thereby enable the patterning of the pixel division layer. The acid value of the alkali-soluble resin is preferably at least 10 mg KOH/g in view of the dispersion stability. In the meantime, in view of suppressing the peeling at the pattern edge of the pixel division layer in the development step as will be described below, the acid value is preferably up to 300 mg KOH/g.

Examples of the alkali-soluble resin include an alkali-soluble polyimide resin, alkali-soluble polyimide precursor, alkali-soluble polybenzoxazole resin, alkali-soluble polybenzoxazole precursor, alkali-soluble cardo resin, alkali-soluble acrylic resin, alkali-soluble polysiloxane resin, alkali-soluble novolac resin, and alkali-soluble urethane resin, which may be used in combination of two or more. Of these, the preferred is the inclusion of the alkali-soluble polyimide resin in view of the heat resistance.

The polymer resin dispersant having a basic adsorption group is preferably a polymer resin dispersant containing a tertiary amino group and/or quaternary ammonium base, heterocyclic structure, or the like as the basic adsorption group, and the dispersion stability of the black pigment in the pigment dispersion can be further improved by the adsorption of the basic adsorption group of the polymer resin dispersant on the surface of the black pigment.

The polymer resin dispersant having the basic adsorption group used may be a commercially available product, and examples include Disper BYK-142, 145, 164, 167, 2001, 2008, 2009, 2010, 2020, 2025, 9076, 9077, BYK-LPN6919, and BYK-LPN21116 (products manufactured by BYK-Chemie), "Solsperse" (Registered Trademark) 9000, 11200, 13650, 20000, 24000, 24000SC, 24000GR, 32000, 32500, 32550, 326000, 33000, 34750, 35100, 35200, 37500, 39000, and 56000 (products manufactured by Lubrizol), Efka-PX4310 and 4320 (products manufactured by BASF), which may also be used in combination of two or more.

When the pigment dispersion of the present invention contains the alkali-soluble resin as the dispersant, the content of the alkali-soluble resin is preferably at least 20 parts by weight and more preferably at least 40 parts by weight in relation to 100 parts by weight of the black pigment in view of improving the dispersion stability. In the meantime, the content is preferably up to 200 parts by weight and more preferably up to 150 parts by weight in relation to 100 parts by weight of the black pigment in view of suppressing re-aggregation by overdispersion.

When the pigment dispersion of the present invention contains the polymer resin dispersant having the basic adsorption group as the dispersant, the content of the polymer resin dispersant having the basic adsorption group is preferably at least 10 parts by weight and more preferably at least 20 parts by weight in relation to 100 parts by weight of the black pigment in view of improving the dispersion stability. In the meantime, the content is preferably up to 100 parts by weight and more preferably up to 60 parts by weight in relation to 100 parts by weight of the black pigment in view of suppressing re-aggregation by overdispersion.

Exemplary solvents include ethers, acetates, esters, ketones, aromatic hydrocarbons, and alcohols, which may be used in combination of two or more. Examples of the ether include ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, dipropylene glycol dimethyl ether, dipropylene glycol methyl-n-butyl ether, tripropylene glycol monomethyl ether, tripropylene glycol monoethyl ether, diethylene glycol dimethyl ether, diethylene glycol methyl ethyl ether, diethylene glycol diethyl ether, and tetrahydrofuran. Examples of the acetate include butyl acetate, ethylene glycol monomethyl ether acetate, ethylene glycol monoethyl ether acetate, propylene glycol monomethyl ether acetate, 3-methoxybutyl acetate, ethyleneglycol monobutyl ether acetate, diethylene glycol monomethyl ether acetate, diethylene glycol monoethyl ether acetate, diethylene glycol monobutyl ether acetate, cyclohexanol acetate, propylene glycol diacetate, propylene glycol monomethyl ether acetate (hereinafter referred to as "PGMEA"), propylene glycol monoethyl ether acetate, dipropylene glycol methyl ether acetate, 3-methoxy-3-methyl-1-butyl acetate, 1,4-butanediol diacetate, 1,3-butylene glycol diacetate, and 1,6-hexanediol diacetate. Examples of the ester include alkyl lactate esters such as methyl 2-hydroxypropionate and ethyl 2-hydroxypropionate, ethyl 2-hydroxy-2-methylpropionate, methyl 3-methoxypropionate, ethyl 3-methoxypropionate, methyl 3-ethoxypropionate, ethyl 3-ethoxypropionate, ethoxyethyl acetate, ethyl hydroxyacetate, methyl 2-hydroxy-3-methyl butanate, 3-methoxy butyl acetate (hereinafter referred to as "MBA"), 3-methyl-3-methoxy butyl acetate, 3-methyl-3-methoxy butyl propionate, ethyl acetate, n-propyl acetate, i-propyl acetate, n-butyl acetate, i-butyl acetate, n-pentyl formate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate, ethyl 2-oxobutanoate, and examples of the ketone include methyl ethyl ketone, cyclohexanone, 2-heptanone, and 3-heptanone. Examples of the aromatic hydrocarbon include toluene and xylene, and examples of the alcohol include isopropyl alcohol, butyl alcohol, isobutyl alcohol, pentanol, 4-methyl-2-pentanol, 3-methyl-2-butanol, 3-methyl-3-methoxy butanol, and diacetone alcohol.

In the present invention, the content of the solvent in 100 parts by weight of the pigment dispersion is preferably at least 50 parts by weight and more preferably at least 70 parts by weight in view of suppressing viscosity increase with time after the production of the pigment dispersion. In the meantime, the content of the solvent in 100 parts by weight of the pigment dispersion is preferably up to 95 parts by weight and more preferably up to 90 parts by weight in view of suppressing the precipitation of the pigment after the production of the pigment dispersion.

The black pigment in the pigment dispersion of the present invention may preferably have an average dispersion particle size of at least 50 nm in view of the stability in the mixing with the compound having the radical-polymerizable group and temperature change during the preparation of the photosensitive composition. In the meantime, the average dispersion particle size is preferably up to 200 nm in view of improving the pattern linearity of the pixel division layer. The average dispersion particle size as used herein is the number average particle size of the black pigment, which can be measured by using a particle size distribution analyzer. The particle size distribution analyzer used may be a particle size distribution analyzer by dynamic light scattering "SZ-100 (manufactured by HORIBA)" or a particle size distribution analyzer by laser diffraction or scattering "MT-3000 (manufactured by Microtrac)".

The pigment dispersion of the present invention can be prepared by mixing the black pigment, the dispersant, and the solvent as described above and optional other components and dispersing the black pigment. The dispersion is preferably accomplished by wet medium dispersion. Typical dispersion apparatus used for the wet medium dispersion are horizontal and vertical bead mills, roll mill, and the like, for example, "DYNO-MILL" (Registered Trademark) (manufactured by Willy A. Bachofen), "Spike Mill" (Registered Trademark) (manufactured by INOUE MFG., INC.), and "Sand Grinder" (Registered Trademark) (manufactured by DuPont). Typical media filled in the vessel of the dispersion apparatus include zirconia beads, zircon beads, and alkali-free glass beads, and use of beads free from the components that would be the source of metal and metal ion impurities is preferable for avoiding contamination by the defects and pulverization. The beads may preferably have a diameter of 0.03 to 5 mm and a higher sphericity is preferable. The conditions used for the operation of the dispersion apparatus can be adequately set by considering the average primary particle size of the black pigment, the hardness of the coating layer, the hardness of the beads, and productivity. In general, the coating layer containing the silica and/or the metal oxide and/or the metal hydroxide is less likely to be aggregated compared to the aggregation of the organic black pigment, and therefore, in the preparation of the pigment dispersion, size of the black pigment of the present invention can be reduced and residue of the coarse particles can also be reduced without increasing the amount of the dispersant incorporated and by using a reduced amount of energy.

Next, the photosensitive composition of the present invention is described.

The photosensitive composition of the present invention contains the black pigment as described above, an alkali-soluble resin, a photosensitive agent, and either one of negative photosensitivity and positive photosensitivity. In other words, the photosensitive composition of the present invention includes both negative photosensitive compositions and positive photosensitive compositions.

The content of the black pigment in the photosensitive composition of the present invention is preferably at least 5 parts by weight and more preferably at least 10 parts by weight in relation to 100 parts by weight of the total solid content of the photosensitive composition in view of improving the light-shielding property. In the meantime, the content of the black pigment in the photosensitive composition is preferably up to 50 parts by weight and more preferably up to 40 parts by weight in relation to 100 parts by weight of the total solid content of the photosensitive composition in view of realizing sufficient sensitivity to the exposure and sufficient development property. The black pigment is incorporated in the photosensitive composition preferably in the form of pigment dispersion as described above during the production of the photosensitive composition.

The "alkali-soluble resin" in the photosensitive composition of the present invention is the same as the "alkali-soluble resin" in the pigment dispersion, and the examples are the alkali-soluble resins mentioned for the pigment dispersion. In view of improving the development properties, the acid value of the alkali-soluble resin is preferably at least 10 mg KOH/g. In the meantime, the acid value is preferably up to 300 (mg KOH/g) in view of suppressing the peeling at the pattern edge of the pixel division layer. When the cured film comprising the cured product of the photosensitive composition is used for the pixel division layer of the organic EL display, the preferred are alkali-soluble polyimide resins, alkali-soluble polyimide precursors, alkali-soluble polybenzoxazole resins, alkali-soluble polybenzoxazole precursors, and alkali-soluble cardo resins in view of the heat resistance, and the more preferred are alkali-soluble polyimide resins and alkali-soluble cardo resins in view of the heat resistance and the storage stability of the photosensitive composition, and in view of the dispersibility to the black pigment of the present invention, the still more preferred are the alkali-soluble polyimide resin having the structure represented by the following general formula (11):

[Chemical formula 8]

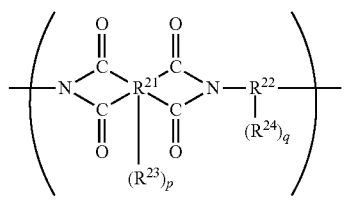

(11)

In the general formula (11), $R^{21}$ represents a tetravalent to decavalent organic group; $R^{22}$ represents a divalent to octavalent organic group; $R^{23}$ and $R^{24}$ independently represent phenolic hydroxyl group, sulfonic acid group, or thiol group, and p and q independently represent a real number in the range of 0 to 6.

In the general formula (11), $R^{21}$—$(R^{23})p$ represents an acid dianhydride residue, and $R^{21}$ is preferably an organic group containing 5 to 40 carbon atoms having an aromatic ring or a cyclic aliphatic group.

Exemplary acid dianhydrides include tetracarboxylic dianhydrides having an aromatic ring such as pyromellitic dianhydride, 3,3',4,4'-biphenyltetracarboxylic dianhydride, 3,3',4,4'-benzophenonetetracarboxylic dianhydride, bis(3,4-dicarboxyphenyl)sulfonic dianhydride, bis(3,4-dicarboxyphenyl)ether dianhydride, and 2,2-bis(3,4-dicarboxyphenyl)hexafluoropropane dianhydride; tetracarboxylic dianhydrides having an aliphatic group such as butanetetracarboxylic dianhydride; and tetracarboxylic dianhydrides having a cycloaliphatic group such as 1,2,3,4-cyclopentane tetracarboxylic dianhydride, bicyclo[2.2.2]oct-7-ene-tetracarboxylic dianhydride, and bicyclo[2.2.2]octanetetracarboxylic dianhydride.

In the general formula (11), $R^{22}$—$(R^{24})q$ represents a diamine residue, and $R^{22}$ is preferably an organic group containing 5 to 40 carbon atoms having an aromatic ring or a cyclic aliphatic group.

Exemplary diamines include diamines having an aromatic ring such as m-phenylenediamine, p-phenylenediamine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(4-aminophenoxy)phenyl]propane, bis[4-(4-amino phenoxy)phenyl]hexafluoropropane, bis[4-(3-aminophenoxy)phenyl]sulfone, 9,9-bis(4-aminophenyl)fluorene, diaminodiphenyl ether, diaminodiphenylsulfone, diaminodiphenylmethane, diaminodiphenylpropane, diaminodiphenylhexafluoropropane, diaminodiphenyl thioether, benzidine, 2,2'-bistrifluoromethylbenzidine, and 3,3'-bistrifluoromethylbenzidine; and diamines having a cyclic aliphatic group such as 2,5-bis(aminomethyl)bicyclo[2.2.1]heptane, and 2,6-bis(aminomethyl)bicyclo[2.2.1]heptane.

The alkali-soluble polyimide resin having the structure represented by the general formula (11) preferably has carboxyl group, phenolic hydroxyl group, sulfonic acid, and/or thiol group at the end of the backbone. When the end of the alkali-soluble polyimide resin is capped with an end capping agent having carboxyl group, phenolic hydroxyl group, sulfonic acid, and/or thiol group, this group can be introduced at the end of the backbone. Exemplary end-capping agents include monoamine, acid anhydride, monocarboxylic acid, monoacid chloride compound, and monoactive ester compound. The alkali-soluble polyimide resin preferably has a weight average molecular weight of at least 10,000 in view of the hardness of the pixel division layer, and also, a weight average molecular weight of up to 100,000 in view of the solubility in the alkaline developer.

The alkali-soluble cardo resin is an alkali-soluble resin having cardo skeleton, and the cardo skeleton is a skeleton having 2 aromatic groups connected by single bond to the quaternary carbon atom which is a ring carbon atom constituting a cyclic structure. Examples of the "cyclic structure" as used therein include fluorene and 1-phenyl-2,3-dihydro-1H-indene, and the example of the aromatic group include phenyl group, and examples of the cardo skeleton include a skeleton wherein 2 phenyl groups are connected by carbon-carbon single bond to 9th position in fluorene skeleton or 3rd position in 1-phenyl-2,3-dihydro-1H-indene skeleton.

The alkali-soluble cardo resin used may be a commercially available product, and examples include "ADEKA ARKLS" (Registered Trademark) WR-301 (manufactured by ADEKA) and "OGSOL" (Registered Trademark) CR-TR1, CR-TR2, CR-TR3, CR-TR4, CR-TR5, and CR-TR6 (all manufactured by Osaka Gas Chemicals Co., Ltd.). The alkali-soluble cardo resin may preferably have a weight average molecular weight of at least 2,000 in view of the development properties. In the meantime, the weight average molecular weight is preferably up to 30,000 in view of suppressing the gelation in the course of the alkali-soluble cardo resin production. In the present invention, the weight average molecular weight (Mw) can be determined by the analysis using gel permeation chromatography and depicting a calibration curve using the standard polystyrene for conversion.

When the photosensitive composition of the present invention has negative photosensitivity, the composition preferably contains a compound having at least two radical-polymerizable groups and a photoinitiator as the photosensitive agent. When the compound having at least two radical-polymerizable groups is used in combination with the photoinitiator as described below, patterning of the pixel division layer can be accomplished by generating the radical polymerization by the exposure which results in the photo-curing. The radical-polymerizable group as used herein is an ethylenically unsaturated double bond group, and preferable examples of such radical-polymerizable group include vinyl group and (meth)acryl group in view of the reactivity, the (meth)acryl group being preferred. The (meth)acryl group as used herein designates methacryl group or acryl group. Examples of the compound having at least two (meth)acryl groups include diethylene glycol di(meth)acrylate, triethylene glycol di(meth)acrylate, tetraethylene glycol di(meth)acrylate, propylene glycol di(meth)acrylate, trimethylolpropane di(meth)acrylate, trimethylolpropane tri(meth)acrylate, ethoxylated trimethylolpropane di(meth)acrylate, ethoxylated trimethylolpropane tri(meth)acrylate, ditrimethylolpropane tri(meth)acrylate, ditrimethylolpropane tetra(meth)acrylate, 1,3-butanediol di(meth)acrylate, neopentyl glycol di(meth)acrylate, 1,4-butanediol di(meth)acrylate, 1,6-hexanediol di(meth)acrylate, 1,9-nonanediol di(meth)acrylate, 1,10-decanediol di(meth)acrylate, dimethylol-tricyclodecane di(meth)acrylate, ethoxylated glycerin tri(meth)acrylate, pentaerythritol tri(meth)acrylate, pentaerythritol tetra(meth)acrylate, ethoxylated pentaerythritol tri(meth)acrylate, ethoxylated pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, tetrapentaerythritol nona (meth)acrylate, tetrapentaerythritol deca(meth)acrylate, ethoxylated bisphenol A di(meth)acrylate, 2,2-bis[4-(3-(meth)acryloxy-2-hydroxypropoxy)phenyl]propane, 1,3,5-tris((meth)acryloxyethyl)isocyanuric acid, 1,3-bis((meth)acryloxyethyl)isocyanuric acid, 9,9-bis[4-(2-(meth)acryloxyethoxy)phenyl]fluorene, 9,9-bis[4-(3-(meth)acryloxypropoxy)phenyl]fluorene, 9,9-bis(4-(meth)acryloxyphenyl)fluorine, and acid modified products thereof, ethylene oxide modified products thereof, and propylene oxide modified products thereof.

Of these, the compound having at least two radical-polymerizable groups preferably contains a compound having a structure derived from a compound having at least 3 hydroxyl groups, at least 3 ethylenically unsaturated double bond groups, and at least one aliphatic chain in the molecule in view of its capability of adjusting density of the photo-crosslink points in the film to an adequate range to thereby increase reaction rate during the exposure to prevent peeling of the film on the top and/or side surface of the exposed area to thereby suppress the generation of the development residue.

A preferable example of the "structure derived from a compound having at least 3 hydroxyl groups in the molecule" is a structure derived from a polyhydric alcohol compound having at least 3 hydroxy groups in the molecule.

Examples of the polyhydric alcohol compound having at least 3 hydroxy groups in the molecule include trimethylolmethane, trimethylolethane, trimethylolpropane, trimethylolbutane, trimethylolhexane, ditrimethylolmethane, ditrimethylolethane, ditrimethylolpropane, glycerin, pentaerythritol, dipentaerythritol, tripentaerythritol, tetrapentaerythritol, and pentapentaerythritol.

The "at least 3 ethylenically unsaturated double bond groups" is preferably a structure derived from an unsaturated carboxylic acid derivative having an ethylenically unsaturated double bond group. Of these, the more preferred is a structure derived from (meth)acrylic acid in view of improving the reactivity during the exposure and reduce the development residue.

Examples of the unsaturated carboxylic acid derivative having an ethylenically unsaturated double bond group include (meth)acrylic acid, itaconic acid, maleic acid, fumaric acid, mono(2-acryloxyethyl) succinate, mono(2-acryloxyethyl) phthalate, mono(2-acryloxyethyl) tetrahydrophthalate, tetrahydrophthalic acid, 3-methyl-tetrahydrophthalic acid, 2-vinylacetic acid, 2-vinylcyclohexane carboxylic acid, 3-vinylcyclohexane carboxylic acid, 4-vinylcyclohexane carboxylic acid, 2-vinylbenzoic acid, 3-vinylbenzoic acid, 4-vinylbenzoic acid, carboxylate anhydrides thereof, carboxylic acid chloride, and carboxylic acid active ester.

The "at least 1 aliphatic chain" is preferably a structure derived from at least one member selected from the group consisting of lactone compounds, epoxy compounds, oxetane compounds, lactam compounds, aziridin compound, carboxylic acid derivative having hydroxy group in the molecule, and carboxylic acid amide compound having hydroxy group in the molecule. Exemplary lactone compounds include β-propiolactone, γ-butyrolactone, δ-valerolactone, and ε-caprolactone, and exemplary epoxy compounds include ethylene oxide, propylene oxide, butylene oxide, and hexylene oxide. Exemplary oxetane compounds include oxetane, 2-methyloxetane, 2-ethyloxetane, and 2-propyl oxetane, and exemplary lactam compounds include β-propiolactam, γ-butyrolactam, δ-valerolactam, and ε-caprolactam. Exemplary aziridin compounds include aziridin, 2-methylaziridin, 2-ethylaziridin, and 2-propylaziridin, and exemplary carboxylic acid derivatives having hydroxy group in the molecule include hydroxyacetic acid, 3-hydroxypropionic acid, 4-hydroxybutyric acid, 5-hydroxyvaleric acid, and 6-hydroxycaproic acid. Exemplary carboxylic acid amide compounds having hydroxy group in the molecule include N-(2-hydroxyethyl)propionamide and N-(2-hydroxyethyl)methacrylamide. Of these, the preferred is the structure derived from a lactone compound and/or a lactam compound in view of improving reaction rate during the exposure and reduce the generation of the development residue.

Examples of such compound include ε-caprolactone-modified dipentaerythritol penta(meth)acrylate, ε-caprolactone-modified dipentaerythritol hexa(meth)acrylate, δ-valerolactone-modified dipentaerythritol penta(meth)acrylate, δ-valerolactone-modified dipentaerythritol hexa(meth)acrylate, γ-butyrolactone-modified dipentaerythritol penta(meth)acrylate, γ-butyrolactone-modified dipentaerythritol hexa(meth)acrylate, β-propiolactone-modified dipentaerythritol penta(meth)acrylate, β-propiolactone-modified dipentaerythritol hexa(meth)acrylate, ε-caprolactam-modified dipentaerythritol penta(meth)acrylate, ε-caprolactam-modified dipentaerythritol hexa(meth)acrylate, δ-valerolactam-modified dipentaerythritol penta(meth)acrylate, δ-valerolactam-modified dipentaerythritol hexa(meth)acrylate, γ-butylolactam modified dipentaerythritol penta(meth)acrylate, γ-butylolactam modified dipentaerythritol hexa(meth)acrylate, β-propiolactam-modified dipentaerythritol penta(meth)acrylate, and β-propiolactam-modified dipentaerythritol hexa(meth)acrylate.

The average molecular weight of the at least one aliphatic chain is preferably 40 to 500, and more preferably 70 to 300 in view of improving the reaction rate upon exposure and further reduce the generation of the development residue.

A more preferable example of the compound having a structure derived from a compound having at least 3 hydroxyl groups, at least 3 ethylenically unsaturated double bond groups, and at least one aliphatic chain in the molecule, wherein the aliphatic chain has an average molecular weight of 40 to 500 is a compound having a structure derived from dipentaerythritol as the compound having at least 3 hydroxy groups, at least 3 ethylenically unsaturated double bond groups derived from an unsaturated carboxylic acid derivative, and a modified chain derived from a lactone as the at least one aliphatic chain in the molecule, which is the compound represented by the general formula (12):

[Chemical formula 9]

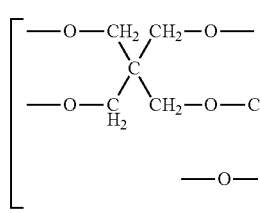 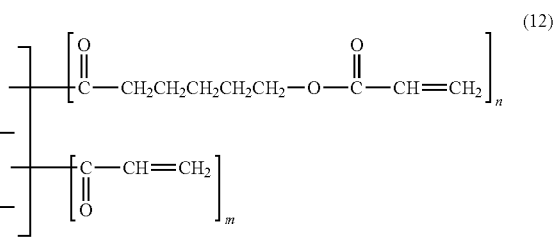

(12)

(in the general formula (12), n represents an integer of 1 to 6; m represents an integer of 0 to 5; and n and m satisfy the relation: n+m=6.)

Exemplary commercially available products of the compound represented by the general formula (12) include "KAYARAD" (Registered Trademark) DPCA-20 (n=2, m=4), "KAYARAD" DPCA-30 (n=3, m=3), and "KAYARAD" DPCA-60 (n=6, m=0) (all manufactured by Nippon Kayaku Co., Ltd.).

The content of the compound having at least two radical-polymerizable groups is preferably at least 5 parts by weight and more preferably at least 15 parts by weight in relation to the total content of the alkali-soluble resin and the compound having at least two radical-polymerizable groups (100 parts by weight) in view of improving the sensitivity for the exposure. In the meantime, the content of the compound having at least two radical-polymerizable groups is preferably up to 80 parts by weight and more preferably up to 60 parts by weight in relation to the total content of the alkali-soluble resin and the compound having at least two radical-polymerizable groups (100 parts by weight) in view of the reflow property in the curing step for obtaining the pixel division layer with small taper angle.

When the photosensitive composition of the present invention has a negative photosensitivity, the composition further comprises a photoinitiator as the photosensitive agent. A photoinitiator is a compound which undergoes bond cleavage and/or reaction upon exposure to generate a radical active species. The inclusion of the photoinitiator enables formation of a negative pattern by photo-curing of the compound having at least two radical-polymerizable groups by the exposure so that the exposed area is insolubilized to the alkaline developer thereby forming a negative pattern.

Exemplary photoinitiators include carbazole photoinitiators such as "ADEKA optomer" (Registered Trademark) N-1818 and N-1919 and "ADEKA CRUISE" (Registered Trademark) NCI-831 (all manufactured by ADEKA); acylphosphine oxide photoinitiators such as 2,4,6-trimethylbenzoyl-diphenyl-phosphine oxide ("Irgacure" (Registered Trademark) TPO manufactured by BASF); oxime ester photoinitiators such as 1,2-octanedione, 1-[4-(phenylthio)-2-(O-benzoyl oxime)] ("Irgacure" (Registered Trademark) OXE01 manufactured by BASF), ethanone, and 1-[9-ethyl-6-(2-methylbenzoyl)-9H-carbazole-3-yl]-1-(O-acetyl oxime) ("Irgacure" (Registered Trademark) OXE02 manufactured by BASF); and α-amino alkylphenone photoinitiators such as 2-methyl-1-(4-methylthiophenylphenyl)-2-morpholinopropane-1-one ("Irgacure" (Registered Trademark) 907 manufactured by BASF), 2-benzyl-2-dimethylamino-1-(4-morpholinophenyl)-butanone-1 ("Irgacure" (Registered Trademark) 369 manufactured by BASF), and 2-(dimethylamino)-2-[(4-methylphenyl)methyl]-1-[4-(4-morpholinyl) phenyl]-1-butanone ("Irgacure" (Registered Trademark) 379EG manufactured by BASF), which may be included in combination of two or more. Of these, the photoinitiator preferably contains a carbazole photoinitiator or an oxime ester photoinitiator in view of improving reaction rate during the exposure and suppress the generation of the development residue.

The content of the photoinitiator is preferably at least 5 parts by weight and more preferably at least 10 parts by weight in relation to 100 parts by weight of the compound having at least two radical-polymerizable groups in view of improving the sensitivity to the exposure. In the meantime, the content of the photoinitiator is preferably up to 60 parts by weight and more preferably up to 40 parts by weight in relation to 100 parts by weight of the compound having at least two radical-polymerizable groups for improving the reactivity in the exposure and suppressing the development residue.

When the photosensitive composition of the present invention has positive photosensitivity, the composition preferably contains a photo-acid generator as the photosensitive agent. The content of the black pigment in the positive photosensitive composition of the present invention is preferably at least 5 parts by weight and more preferably at least 10 parts by weight in relation to the total solid content in the positive photosensitive composition (100 parts by weight) in view of improving the light-shielding property. In the meantime, the content of the black pigment in the positive photosensitive composition is preferably up to 50 parts by weight and more preferably up to 40 parts by weight in relation to the total solid content in the positive photosensitive composition (100 parts by weight) in view of realizing sufficient sensitivity for the exposure and development properties. Preferably, the black pigment is incorporated in the course of producing the positive photosensitive composition by preliminarily formulating a pigment dispersion.

The acid value of the alkali-soluble resin in the positive photosensitive composition is preferably at least 10 mg KOH/g. In the meantime, the acid value is preferably up to 300 (mg KOH/g) in view of suppressing the peeling of the pattern edge of the pixel division layer.

When the cured film comprising the cured product of the positive photosensitive composition is used for the pixel division layer of an organic EL display, the alkali-soluble resin is preferably an alkali-soluble polyimide resin, an alkali-soluble polyimide precursor, an alkali-soluble polybenzoxazole resin, or an alkali-soluble polybenzoxazole precursor in view of the heat resistance, and the more preferred in view of the heat resistance and the storage stability of the positive photosensitive composition is the alkali-soluble polyimide resin having the structure represented by the general formula (11).

The photo-acid generator is preferably a quinone diazide compound. The quinone diazide compound is more preferably a reaction product prepared by esterifying a compound having a phenolic hydroxyl group with quinone diazide sulfonyl acid chloride. Presence of the photo-acid generator contributes for the solubility in the alkali of the exposed area upon exposure in relation to the unexposed area and removal of the exposed area by an alkaline developer is enabled to thereby accomplish the patterning and form the pixel division layer.

Examples of the compound containing the phenolic hydroxyl group include Bis-Z, BisP-EZ, TekP-4HBPA, TrisP-HAP, TrisP-PA, TrisP-PHBA, BisOCHP-Z, BisP-MZ, BisP-PZ, BisP-IPZ, BisOCP-IPZ, BisP-CP, BisRS-2P, BisRS-3P, BisP-OCHP, methylene tris-p-CR, methylene tetra-p-CR, BisRS-26X, Bis-PFP-PC (all manufactured by Honshu Chemical Industry Co., Ltd.), and BIR-OC, BIP-PC, BIR-PC, BIR-PTBP, BIR-PCHP, BIP-BIOC-F, 4PC, BIR-BIPC-F, TEP-BIP-A (all manufactured by ASAHI YUKIZAI CORPORATION).

Examples of the quinone diazide sulfonyl acid chlorides include 4-naphthoquinone diazide sulfonyl acid chloride and 5-naphthoquinone diazide sulfonyl acid chloride. Use of such quinone diazide compound is preferable due to the high sensitivity to the mixed ray of i-ray (365 nm), h-ray (405 nm), and g-ray (436 nm) in the exposure step as described below.

Such quinone diazide compound is preferably added in an amount of 1 to 50 parts by weight in relation to 100 parts by weight of the alkali soluble resin in view of the pattern processing ability and heat resistance of the finally obtained pixel division layer. When there is a need to improve the alkali solubility of the positive photosensitive composition, a part of the phenolic hydroxyl group in the compound having the phenolic hydroxyl group may be intentionally left without esterification.

The photosensitive composition of the present invention may further contain a thermal crosslinking agent irrespective of whether the composition is negative or positive. When a thermal crosslinking agent is incorporated, the film strength and the heat resistance of the finally obtained pixel division layer can be improved by thermal crosslinking in the curing step. Exemplary thermal crosslinking agents include a compound having at least two alkoxymethyl groups and/or methylol groups and a compound having at least two epoxy groups.

Examples of the compound having at least two alkoxymethyl groups and/or methylol groups include NIKALAC (Registered Trademark) MW-100LM, MX-270, MX-280, and MX-290 (manufactured by Sanwa Chemical) and DML-PC (manufactured by Honshu Chemical Industry Co., Ltd.).

Examples of the compound having at least two epoxy groups include "Epolite" (Registered Trademark) 40E, "Epolite" 100E, "Epolite" 200E, "Epolite" 400E, "Epolite" 70P, "Epolite" 200P, "Epolite" 400P, "Epolite" 4000, and "Epolite" 3002(N) (all manufactured by Kyoeisha Chemical Co., Ltd.), "jER" (Registered Trademark) 828, "jER" 1002, "jER" 1750, "jER" 1007, "jER" YX8100-BH30, "jER" E1256, "jER" E4250, and "jER" E4275 (all manufactured by Mitsubishi Chemical Corporation), "TECHMORE" (Registered Trademark) VG-3101L (manufactured by Printec Corporation), and "TEPIC" (Registered Trademark) S, "TEPIC" G, "TEPIC" P, and "TEPIC" L (all manufactured by Nissan Chemical Corporation).

Exemplary solvents include the solvents mentioned for the pigment dispersion of the present invention.

The content of the solvent in the photosensitive composition of the present invention is preferably at least 70% by weight in view of the uniform thickness of the coating film in the coating step. Also, the content of the solvent is preferably up to 95% by weight in view of suppressing the pigment precipitation.

The photosensitive composition of the present invention may further contain a toning agent for adjusting the transmission spectrum and reflected color of the pixel division layer to the desired range. Exemplary toning agents include dyes, organic pigments, and inorganic pigments, which may be used in combination of two or more. In view of the alkali resistance and the light resistance, the preferred are an organic pigment and an inorganic pigment, and the more preferred is an organic pigment in view of the low permittivity.

Examples of the organic pigment include organic yellow pigments such as C.I. pigment yellow 12, 13, 17, 20, 24, 83, 86, 93, 95, 109, 110, 117, 125, 129, 137, 138, 139, 147, 148, 150, 153, 154, 166, 168, and 185; organic orange pigments such as C.I. pigment orange 13, 36, 38, 43, 51, 55, 59, 61, 64, 65, and 71; organic red pigments such as C.I. pigment red 9, 48, 97, 122, 123, 144, 149, 166, 168, 177, 179, 180, 192, 209, 215, 216, 217, 220, 223, 224, 226, 227, 228, 240, and 254; organic violet pigments such as C.I. pigment violet 19, 23, 29, 30, 32, 37, 40, and 50; organic blue pigments such as C.I. pigment blue 15:1, 15:2, 15:3, 15:4, 15:6, 22, 60, 64, 66, and 75; and organic green pigments such as C.I. pigment green 7, 10, 36, 58, and 59.

The photosensitive composition of the present invention may further contain a dispersant for the toning agent in addition to the dispersant for dispersing the black pigment. Exemplary dispersants for the toning agent include the alkali-soluble resin as described above and those mentioned as the polymer resin dispersant having a basic adsorption group, and any suitable type of the dispersant may be selected by considering the stability upon mixing of the color.

The photosensitive composition of the present invention may contain a surfactant. When a surfactant is incorporated, coating properties and surface smoothness of the coated film will be improved, and generation of the coating defects such as benerd cell will also be suppressed. The surfactant as used herein is a so-called levelling agent. Exemplary surfactants include anionic surfactants such as lauryl ammonium sulfate and polyoxyethylene alkyl ether sulfuric acid triethanolamine, cationic surfactants such as stearyl amine acetate and lauryltrimethyl ammonium chloride, amphoteric surfactants such as lauryl dimethylamine oxide and laurylcarboxymethylhydroxyethyl imidazolium betaine, nonionic surfactants such as polyoxyethylene lauryl ether, polyoxyethylene stearyl ether, and sorbitan monostearate, silicone surfactants having polydimethylsiloxane as its backbone, and fluorosurfactants.

Next, the cured film of the present invention is described. The cured film of the present invention is a cured product of the photosensitive composition as described above, and it is well adapted for use as the pixel division layer of an organic EL display.

For the stable operation of the organic EL display, a low permittivity of the pixel division layer is advantageous. For example, in view of suppressing the brightness unevenness, the permittivity at a frequency of 1 kHz is preferably up to 7 and more preferably up to 5. The "permittivity" as used herein can be measured by a permittivity measuring apparatus such as LCR meter manufactured by Agilent Technologies. With regard to the permittivity of the components constituting the black pigment of the present invention, for example, the organic black pigment in the core is 3.5 to 4, the silica in the coating layer is 4, the alumina in the coating layer is 9, the zirconia in the coating layer is 33, and the titanium oxide in the coating layer is 48. The permittivity of the cured film of the present invention and the pixel division layer may be adjusted to the desired range by considering the content of these components, and also, the permittivity of the binder components other than the black pigment.

The pixel division layer preferably has an optical density (OD value) per 1.0 μm (thickness) of at least 0.5 and more preferably at least 1.0. The OD value may be determined by measuring the intensity of the incident light and the light transmitted through the pixel division layer by using an optical densitometer (361T manufactured by X-Rite), and calculating the OD value by the following equation. The higher OD value corresponds to the higher light-shielding property.

$$\text{OD value} = \log_{10}(I_0/I)$$

$I_0$: intensity of the incident light
$I$: intensity of the transmitted light

The transmittance spectrum and the reflectivity spectrum of the cured film of the present invention can be controlled by adjusting the proportion of the organic black pigment in the core as desired. When the cured film of the present invention is used for the pixel division layer of the organic EL display, and, for example, the black pigment of the present invention comprising the perylene-based black pigment and the coating layer is mixed with the black pigment of the present invention comprising the benzodifuranone-based black pigment and the coating layer, transmittance/reflectivity at a wavelength of 650 to 780 nm in the visible light range can be reduced, and a pixel division layer having optical properties with reduced wavelength dependency and black color with reduced redness for the reflected color (namely, neutral black) can be produced. Furthermore, fine adjustment may be conducted by adding a toning agent as described above to realize the desired optical properties.

When the cured film which is the cured product of the photosensitive composition of the present invention is used for the pixel division layer of the organic EL display, opening rate of the pixel division layer is preferably up to 20% in view of increasing the precision of the display area, improving displaying quality of the image or motion picture, and improving the value as a display. The "opening rate" as used herein is the area percentage of the opening of the pixel division layer in relation to the area of the pixel division layer. When the opening rate is low, the area occupied by the pixel division layer in the display area will be large, and the area of the openings corresponding to the light emitting pixels will be small, and therefore, generation of the dark spots caused by the development residue seriously affects the display quality. In other words, the effects of the present invention are clear when the organic EL display has a lower opening rate and the display area has a higher precision.

When the cured film which is the cured product of the photosensitive composition of the present invention is used for the pixel division layer which also serves the function of a spacer in the panel member constitution, the pixel division layer may include the part where the cured film has different thickness, namely, bump (step) morphology in the plane. The method used to prepare the pixel division layer having the bump (step) with different thickness may be a method wherein the pixel division layer is formed by using a patterned exposure wherein the exposure is conducted through a negative or positive half-tone exposure mask formed with two or more types of openings each having different light transmittance of the exposure light area in the exposure step as described below. When the photosensitive composition of the present invention has negative photosensitivity, the parts in the exposed area which locally receive high light exposure will exhibit reduced dissolution to the alkaline developer, and these parts will be left as bumps in the finally obtained pixel division layer. On the other hand, when the photosensitive composition of the present invention has positive photosensitivity, the parts in the exposed area which locally receive low light exposure will exhibit reduced dissolution to the alkaline developer, and these parts will be left as bumps in the finally obtained pixel division layer.

Next, the method for producing the cured film of the present invention is described. The cured film of the present invention may be produced, for example, by a method including a coating step, a prebaking step, an exposure step, a development step, and a curing step in this order. When the cured film is used for the pixel division layer, a multiple production wherein several organic EL displays are arranged and formed per one substrate may be conducted in view of improving the productivity.

In the coating step, the photosensitive composition of the present invention is coated on the substrate to prepare a coating film. For example, in the case of a top emission type organic display, the substrate is typically a multilayer substrate wherein a reflective layer comprising a patterned silver/copper alloy or the like and an ITO electrode having the same pattern are disposed on the surface of a glass substrate or a flexible film substrate in this order. The flexible film substrate is preferably a substrate containing carbon atom as its main component having a high heat resistance and flexibility, and of these, the more preferred is a substrate having a polyimide film securely fixed on the glass substrate which is the support.

Examples of the coating apparatus used in the coating step include a slit coater, a spin coater, a gravure coater, a dip coater, a curtain flow coater, a roll coater, a spray coater, a screen printer, and an ink jet coater. The pixel division layer typically has a thickness of approximately 0.5 to 3 μm in view of the member constitution convenience, and accordingly, use of a slit coater or a spin coater is preferable since they are well suited for use in the thin film coating and the resulting thin film is less likely to suffer from coating defects, and also in view of the high thickness consistency and high productivity, and use of a slit coater is more preferable in view of reducing the amount of the composition used for the coating.

In the prebaking step, the solvent in the coating film is removed through volatilization by heating to prepare a prebaked film. The heater apparatus used may be, for example, a hot air oven, a hot plate, or an IR oven, and the prebaking may also be conducted by pin gap prebaking or contact prebaking. The temperature of the prebaking is preferably 50 to 150° C., and the prebaking is preferably conducted for 30 seconds to several hours. A multi-stage prebaking in two or more stages is also preferable, and in such case, the prebaking may be conducted at 80° C. for 2 minutes, and then at 120° C. for 2 minutes. In order to further improve the film thickness consistency, the solvent in the coating film may be partly removed by volatilization using a vacuum drier or dryer at a reduced pressure after the coating step and before the prebaking by the heating.

In the exposure step, an actinic ray is irradiated from the film surface side of the prebaked film through a photomask to prepare an exposed film. Exemplary exposure apparatus used in the exposure step includes a stepper, a mirror projection mask aligner (MPA), and a parallel light mask aligner (PLA). Examples of the actinic ray irradiated in the exposure include UV ray, visible light ray, electron beam, X-ray, KrF (wavelength 248 nm) laser, ArF (wavelength 193 nm) laser, and the like, and of these, the preferred are j-ray (wavelength, 313 nm), i-ray (wavelength, 365 nm), h-ray (wavelength, 405 nm), and g-ray (wavelength, 436 nm) of mercury lamp, and the mixtures of these rays are more preferable. The typical exposure is approximately 10 to 4000 mJ/cm$^2$ (in terms of the i-ray). The mask used may be the one comprising a substrate of glass, quart, or a film which transmits the light having the wavelength used for the exposure and a patterned thin film disposed on one surface of the substrate which shields the exposure light comprising a metal such as chromium or a black organic resin. In the formation of the pixel division layer using the photosensitive composition of the present invention, either one of the mask for the negative exposure and the mask for the positive exposure can be used, and the patterned exposure is conducted by allowing the actinic ray to pass through only the opening of the mask to thereby obtain the exposed film comprising the patterned exposed areas and the unexposed areas other than the patterned exposed areas in one plane. When the photosensitive composition of the present invention has negative photosensitivity, the unexposed areas will be the patterned opening, and when the photosensitive composition of the present invention has positive photosensitivity, the exposed areas will be the patterned opening by the development step as described below, and the openings will finally be the light emitting pixels of the organic EL display. The "exposed area" as used herein is the area where the light for the exposure has been irradiated through the opening of the mask, and the "unexposed area" is the area where the light for the exposure has not been irradiated.

In the development step, a patterned developed film is obtained by the development. A typical method used for the development include a method wherein the exposed film is immersed in an aqueous solution of organic alkali or an aqueous solution of inorganic alkali which is the development solution for 10 seconds to 10 minutes by showering, dipping, puddling, or the like. In the exposed film, the exposed area and the unexposed area have different solubility in the developer solution, and the unexposed area or the exposed area is dissolved by utilizing this difference in the solubility in the developer solution, thereby obtaining a patterned developed film.

Examples of the developer solution include aqueous solution of organic alkali such as 2.38% by weight tetramethylammonium hydroxide (hereinafter referred to as the aqueous solution of "TMAH"), 0.4% by weight aqueous solution of TMAH, and 0.2% by weight aqueous solution of TMAH and aqueous solution of inorganic alkali such as 0.45% by weight aqueous solution of potassium hydroxide (hereinafter referred to as "KOH"), 0.045% by weight aqueous solution of KOH, 1% by weight aqueous solution of sodium hydrogencarbonate, 0.2% by weight aqueous solution of sodium hydrogencarbonate, and 0.1% by weight aqueous solution of sodium hydroxide. The preferred is use of an aqueous solution of organic alkali since impurities such as sodium ion and potassium ion from the developer solution does not remain in the pixel division layer when the cured film of the present invention is used for the pixel division layer of the organic display. The preferred is TMAH in view of readily removing the solvent from the pixel division layer by volatilizing the developer solution immersed and retained in the film surface layer or in the interior of the film in the curing step after the development. If desired, a washing treatment by a shower of deionized water and/or a water drainage treatment by air spraying may be conducted after the development as an optional step.

In the curing step, the developed film is thermally cured by heating, and simultaneously, the moisture, the residual developer solution, and other components are volatilized to prepare the cured film. Examples of the heater apparatus include a hot air oven and an IR oven. The temperature is preferably elevated to 180 to 300° C. preferably for a period of 15 to 90 minutes. The heating atmosphere is air or nitrogen atmosphere, and the pressure during the heating is preferably atmospheric pressure.

EXAMPLES

Next, the present invention is described in detail by referring to the Examples and the Comparative Examples which by no means limit the embodiments of the present invention.

First, the procedures used for the evaluation in each Example and Comparative Example are described.

(1) Evaluation of Black Pigment (i) Evaluation of Average Coverage Rate

The black pigments prepared in Examples 1 to 20 and Comparative Examples 1 to 18 were respectively impregnated with two-part room temperature-curable acryl transparent resin (Techovit 4006 manufactured by Heraeus Kulzer) and allowed to stand at 25° C. for 3 hours to prepare the specimen for observation. After roughly polishing the observation specimen by a machine using a diamond abrasive paper, a smooth cross-section was prepared in a part of the observation specimen by argon ion beam polishing using an ion milling apparatus (IM4000 manufactured by Hitachi High-Technologies Corporation). By using a transmission electron microscope (TEM H9500 manufactured by Hitachi High-Technologies Corporation), the cross-section was observed at a magnification of 100,000 at an acceleration voltage of 300 kV, and the image of the cross-section was obtained by adjusting the brightness and contrast of the display monitor so that the outer circumference of the core could be recognized in terms of difference in the contrast. Average coverage rate N (%) was determined by randomly selecting 100 black pigment images, determining coverage rate M (%) of each black pigment by the following equation, and calculating the number average value. It is to be noted that the black pigment where a space was observed between the outer circumference of the core and the embedding resin was not included in the calculation of the average coverage rate N (%) to avoid inclusion of the case where the impregnation of the embedding resin was insufficient in the course of preparing the observation specimen which may have resulted in the loss of some parts of the coating layer during the polishing resulting in the reduced coverage rate.

Coverage rate $M$ (%)=$\{L1/(L1+L2)\} \times 100$

L1: total length (nm) of the part covered by the coating layer in the circumference of the core L2: total length (nm) of the part not covered by the coating layer (the part where the boundary directly contacts the embedding resin) in the circumference of the core L1+L2: circumferential length (nm) of the core.

(ii) Evaluation of Alkali Resistance 0.5 g of the black pigment was collected from those obtained in Examples 1 to 20 and Comparative Examples 1 to 18 and each black pigment was immersed in a glass bottle containing 49.5 g of 2.38% by weight TMAH aqueous solution (pH12 at 25° C.), and after placing the lid, the mixture was stirred for 1 minute on a shaker. After allowing to stand for 1 hour, the mixture was stirred again for 1 minute, and a pigment suspension for the alkali resistance evaluation was thereby prepared. Filtration of the pigment suspension for the alkali resistance evaluation was repeated until no particle component was observed in the filtrate, and washing with water was conducted until the pH indicated by the test paper was neutral. The filtration product trapped by the filter was transferred to an aluminum cup and heated on a hot plate for 30 minutes at an actual temperature of 120° C. for drying. The weight after heating was measured for use as the weight of the undissolved residue. The value obtained by subtracting the weight of the insoluble residue from the initial weight of the black pigment (0.5 g) was regarded as the weight of the content that dissolved in the 2.38% by weight TMAH aqueous solution, and this weight divided by the initial weight of the black pigment and multiplied by 100 was regarded as the weight proportion (% by weight) of the black pigment dissolved in the 2.38% by weight TMAH aqueous solution. The alkali resistance was evaluated by the following criteria, and AA and A to C were evaluated "pass" and D was evaluated "fail".

AA: less than 5% by weight

A: at least 5% by weight and less than 10% by weight

B: at least 10% by weight and less than 30% by weight

C: at least 30% by weight and less than 50% by weight

D: at least 50% by weight (iii) Evaluation of Dispersibility

To a glass bottle (volume, 300 ml), a mixed solution of 5.00 g of Solsperse 20000 (dispersion having tertiary amino group and polyether structure in the molecule) which is a polymer resin dispersant having a basic adsorption group and 75.00 g of PGMEA which is an organic solvent as the standard dispersion medium for evaluating the dispersibility and 10.00 g of black pigment obtained in Examples 1 to 20 and Comparative Examples 1 to 18 were added, and the mixture was preliminarily stirred by a dissolver. 200 g of zirconia beads having a diameter of 1.0 mm ("Torayceram" (Registered Trademark) manufactured by Toray Industries, Inc.) was then added, and after tightly sealing the glass bottle by a stopper, a batchwise simple dispersion treatment was conducted for 30 minutes by using a paint conditioner to obtain a pigment dispersion for dispersibility evaluation having a solid content of 15.0% by weight. After allowing this pigment dispersion to stand in an incubator box set at 25° C. for 24 hours, 1.0 g of the pigment dispersion was aliquoted to measure the average dispersion particle size (nm) by using a particle size distribution analyzer by dynamic light scattering "SZ-100 (manufactured by HORIBA). The dispersibility inherent to the pigment was evaluated under the same dispersion conditions by the following criteria, and AA and A to C were evaluated "pass" and D was evaluated "fail".

AA: less than 200 nm
A: at least 200 nm and less than 300 nm
B: at least 300 nm and less than 500 nm
C: at least 500 nm and less than 1000 nm
D: at least 1000 nm (2) Evaluation of Dispersion Stability of the Pigment Dispersion The pigment dispersions prepared in Examples 21 to 42 and Comparative Examples 19 to 40 were added to 10 g glass bottle and tightly sealed by a stopper within 1 hour of the preparation of the pigment dispersion. After allowing to stand for 24 hours in an incubator box set at 25° C., 1.0 g was aliquoted and dropped on a stage of a Type E viscometer (cone plate-type viscometer), and the viscosity measured after 3 minutes with a shear force applied under the condition of a rotation speed of 50 rpm was recorded as the initial viscosity (mPa·s). The viscosity after allowing to stand at 25° C. for 7 days was also measured by the same method, and this viscosity was used as the viscosity with the lapse of time (mPa·s) and used for calculating the increase in the viscosity (%) by the following equation. The dispersion with lower absolute value of the increase in the viscosity (%) was evaluated as a dispersion having a higher stability, and the dispersion stability was evaluated according to the following criteria, and A to C were evaluated "pass" while "D to F" were evaluated "fail" with the proviso that the evaluation was "E" in the case where the precipitates generated irrespective of the value of the viscosity increase. In addition, the evaluation was "F" when either one of the initial viscosity and the viscosity with the lapse of time of the pigment dispersion was in excess of 100 (mPa·s) irrespective of the presence or absence of the precipitates and the value of the viscosity increase since comparison under the identical conditions is not possible due to the unmeasurability.

Increase in the viscosity (%)=(viscosity with the lapse of time−initial viscosity)/initial viscosity× 100

It is to be noted that, while the positive value and negative value of the viscosity increase respectively indicate the increase and the decrease of the viscosity, the case wherein the evaluation was "A to D" in Examples 21 to 42 and Comparative Examples 19 to 40 included no case with the viscosity increase of a negative value.

A: less than 5%
B: at least 5% and less than 10%
C: at least 10% and less than 30%
D: at least 30%
E: generation of precipitates
F: viscosity was unmeasurable due to the excessively high viscosity (3) Evaluation of Light-Shielding Property of the Cured Film The substrate produced in Examples 43 to 66 and Comparative Examples 41 to 65 having a cured film on the surface of the TEMPAX was used as the substrate for evaluating the light-shielding property. OD value was measured from the film surface side at 3 locations in the surface by using an optical densitometer (X-rite 361T manufactured by X-Rite), and the average was calculated down to the first decimal place by rounding to the first decimal place. This average was divided by the thickness (μm) of the cured film to calculate the OD value (OD/μm) per 1.0 μm (thickness) of the cured film. In the meantime, the OD value inherent to the TEMPAX substrate having no cured film thereon was measured, and since the measurement was 0.00, the OD value of the substrate for evaluating the light-shielding property was regarded as the OD value of the cured film.

The thickness of the cured film was measured at 3 locations on the surface by a probe type film thickness measuring apparatus (SURFCOM manufactured by TOKYO SEIMITSU CO., LTD.), and the average was calculated down to the first decimal place by rounding to the first decimal place.

(4) Evaluation of Pixel Division Layer
(i) Evaluation of Development Residue on ITO in the Opening 10 openings near the center of the substrate formed with the pixel division layer obtained in Examples 67 to 90 and Comparative Examples 66 to 90 were observed by using an optical microscope at a magnification of 50 folds, and number of development residues having a major axis of at least 0.1 μm and less than 3.0 μm in each opening was counted. The evaluation was conducted by using the average number of the development residues observed per 1 opening according to the following criteria, and AA and A to C were evaluated "pass" while D to E were evaluated "fail" with the proviso that the case including the residue having a major axis in excess of 3.0 μm was evaluated "E" irrespective of the average number of residues.

AA: no development residue is observed
A: less than 5 development residues are observed
B: at least 5 and less than 10 development residues are observed
C: at least 10 and less than 20 development residues are observed
D: at least 20 development residues are observed
E: development residue having a major axis in excess of 3.0 μm is observed (ii) Evaluation of Pattern Linearity 10 openings in the central portion of the substrate formed with a pixel division layer prepared in Examples 67 to 90 and Comparative Examples 66 to 90 were observed at 50-fold magnification by using an optical microscope, and width of the ripple at the pattern edge was measured and the maximum width (μm) was calculated by the method as described below.

The length of the minimum line width a and the maximum line width b in the transverse direction as well as the minimum line width c and the maximum line width d in the longitudinal direction were measured, and $W^1$ (μm) and $W^2$ (μm) were respectively determined by the following equation, and the larger one of the $W^1$ (μm) and the $W^2$ (μm) was used for the maximum value W (μm) of the ripple. It is to be noted that the angle in measuring the line widths a to d was determined so that the angle was parallel to the edge of the substrate formed with the pixel division layer by using the edge for the standard.

$(b-a)/2=W^1$ $(d-c)/2=W^2$

Figure 2:
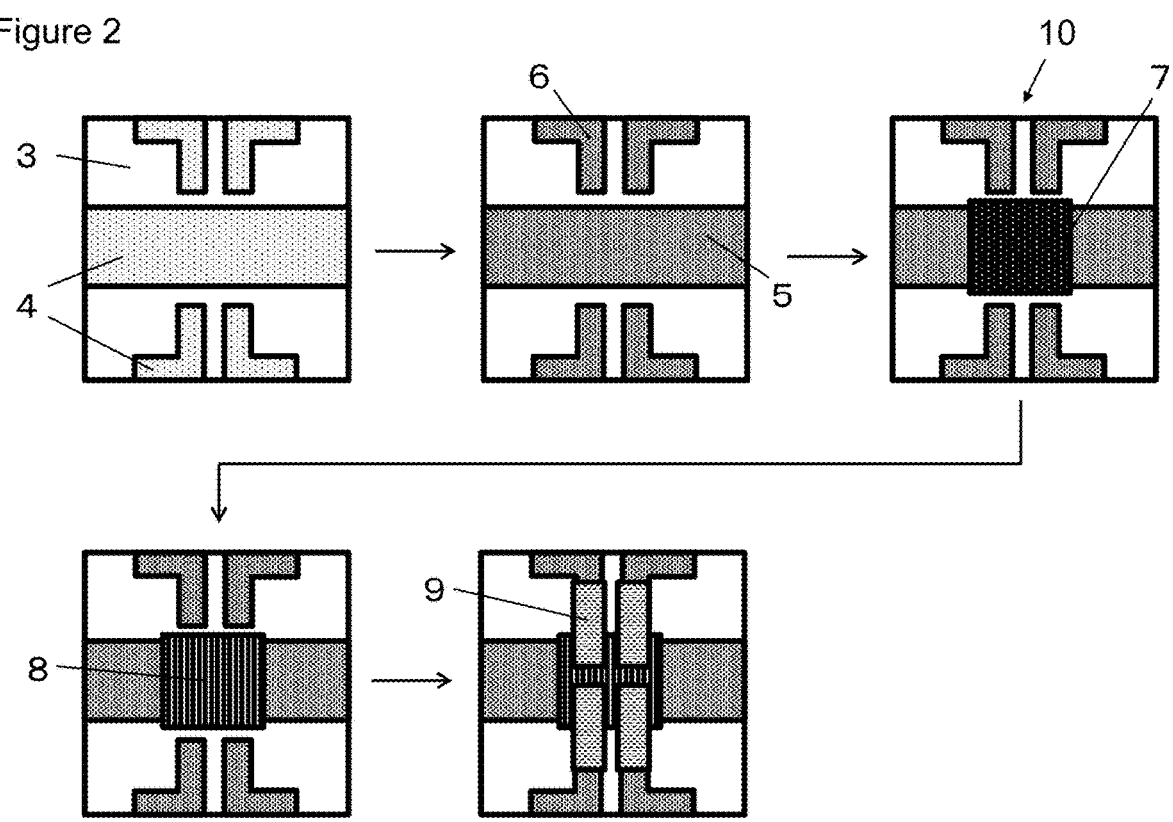
FIG. 2 is a schematic view showing the production method of the organic EL display having the pixel division layer containing the black pigment of the present invention in the Example.

FIG. 1 is a schematic view showing the ripple of the pattern edge of the pixel division layer. The numeral 1 in FIG. 1 represents the opening, and the numeral 2 represents the pixel division layer. Arrows a and b in FIG. 1 are straight lines parallel to the edges in the transverse direction of the substrate formed with the pixel division layer, and arrows c and d are straight lines parallel to the edges in the longitudinal direction of the substrate formed with the pixel division layer. It is to be noted that the edges in the transverse direction and the longitudinal direction of the substrate formed with the pixel division layer used for the standard are the edges in transverse direction and longitudinal direction of the alkali-free glass substrate indicated by the numeral 3 in FIG. 2 showing the production process of the organic EL display having the pixel division layer as will be described below.

The pattern linearity is high when the maximum width W is small, and the visibility of the organic EL display will also be high. The pattern linearity was evaluated from the maximum width W according to the following criteria, and A to C were evaluated "pass" while D to E were evaluated "fail". It is to be noted that the ripple caused by the development residue was included in the calculation of the maximum width W in addition to the pattern morphology of the pattern edge itself, and the length was accordingly measured.

A: maximum width is less than 1.0 μm
B: maximum width is at least 1.0 μm and less than 1.5 μm
C: maximum width is at least 1.5 μm and less than 2.0 μm
D: maximum width is at least 2.0 μm and less than 3.0 μm
E: maximum width is at least 3.0 μm (4) Evaluation of Organic EL Display
(i) Evaluation of Dark Spots (Non-Light Emitting Spots)

The organic EL display prepared in Examples 67 to 90 and Comparative Examples 66 to 90 was driven by direct current of 10 mA/cm². Of the light-emitting pixels formed in the area of 16 mm (longitudinal)/16 mm (transverse), 10 pixels near the center were observed at a magnification of 50 folds on a monitor, and number of the non-light emitting spots having a major axis of at least 0.1 μm and less than 15.0 μm in each opening was counted. The evaluation was conducted by using the average number of the non-light emitting spots observed per each opening according to the following criteria, and AA and A to C were evaluated "pass" while D to E were evaluated "fail".

AA: no dark spots is observed
A: less than 5 dark spots are observed
B: at least 5 and less than 10 dark spots are observed
C: at least 10 and less than 20 dark spots are observed
D: at least 20 dark spots are observed
E: no luminescence was observed in all 10 pixels (ii) Evaluation of Brightness Unevenness The organic EL display prepared in Examples 67 to 90 and Comparative Examples 66 to 90 was driven by direct current of 10 mA/cm². Of the light-emitting pixels formed in the area of 16 mm (longitudinal)/16 mm (transverse), 10 pixels near the center were observed at a magnification of 50 folds on a monitor, and presence of the brightness unevenness was evaluated according to the following criteria, and A to C were evaluated "pass" while D to F were evaluated "fail".

A: brightness unevenness was not observed
B: slight brightness unevenness was observed
C: brightness unevenness was observed
D: significant brightness unevenness was observed
E: no luminescence was observed in all 10 pixels
F: adequate evaluation was not possible due to excessive dark spots Example 1

150 g of "Irgaphor" (Registered Trademark) Black S0100 (non-surface treated product; pH of the pigment surface, 4.5; average primary particle size, 50 nm; manufactured by BASF; hereinafter referred to as "S0100") which is a benzodifuranone-based black pigment represented by the formula (3) was added to a glass vessel containing 2850 g of deionized water, and the mixture was stirred by a dissolver to prepare an aqueous suspension of the pigment. This suspension was sucked by a tube pump and fed to a horizontal bead mill filled with zirconia beads (diameter, 0.4 mm; "Torayceram" (Registered Trademark) manufactured by Toray Industries, Inc.) to conduct 2 pass dispersion at a discharge rate of 30 ml/min. Total volume was discharged to the original glass vessel and again stirred by the dissolver. When a pH meter was set so that its tip electrode part was immersed at a depth of 3 to 5 cm from the surface of the aqueous suspension of the pigment being stirred in the glass vessel and the pH of the resulting aqueous suspension of the pigment was measured, the pH was 4.5 (liquid temperature, 25° C.). The liquid temperature of the aqueous suspension of the pigment was raised to 60° C. with the stirring continued, and the stirring was temporarily stopped after 30 minutes. The stirring was started again in 2 minutes after confirming that no precipitate was present in the bottom of the glass vessel.

A sodium silicate aqueous solution ($Na_2O \cdot nSiO_2 \cdot mH_2O$; 30% by weight in terms of sodium oxide and 10% by weight in terms of silicon dioxide) which had been diluted 100 folds by deionized water and 0.001 mol/L sulfuric acid were simultaneously added to the aqueous suspension of the pigment so that the coating weight of silica in terms of $SiO_2$ in relation to 100 parts by weight of the core was 10.0 parts by weight. During the addition, the addition speed was controlled so that the pH was kept in the range of at least 2 and less than 7. Silica was thereby precipitated on the surface of the core to thereby coat the surface of the core. Next, a sodium aluminate aqueous solution ($Na_2O \cdot nAl_2O_3 \cdot mH_2O$; 40% by weight in terms of sodium oxide and 50% by weight in terms of alumina) which had been diluted 100 folds by deionized water and 0.001 mol/L sulfuric acid were simultaneously added to the aqueous suspension of the pigment so that the coating weight of alumina in terms of $Al_2O_3$ in relation to 100 parts by weight of the core was 2.0 parts by weight. During the addition, the addition speed was controlled so that the pH was kept in the range of at least 2 and less than 7. Aluminum hydroxide was precipitated on the silica coating layer to thereby coat the silica coating layer. Subsequently, the operation of filtration and washing with water was repeated three times to remove a part of the water-soluble impurities in the aqueous suspension of the pigment, and the suspension was fed to a horizontal bead mill filled with zirconia beads (diameter, 0.4 mm) to conduct 1 pass dispersion at a discharge rate of 300 ml/min. Then, 10 g of a cation-exchange resin and 10 g of an anion-exchange resin (Umberlite, both manufactured by ORGANO CORPORATION) were added to the aqueous suspension of the pigment to thereby remove ionic impurities, and the suspension was stirred for 12 hours and filtration was conducted to obtain a black filtration product. This product was heated in a drying oven at an actual temperature of 90° C. for 6 hours, and then in a drying oven at 200° C. for 30 minutes for dissociation of water of crystallization from the coated aluminum hydroxide and conversion into alumina, and particles were formed by dry pulverization using a jet mill to prepare black pigment 1 having an average primary particle size of 56 nm.

As a result of the Time-of-flight secondary ion mass spectrometry and X-ray diffractometry, the black pigment 1 had a silica and alumina coating weights respectively in terms of $SiO_2$ and $Al_2O_3$ in relation to 100.0 parts by weight of the core of 10.0 parts by weight and 2.0 parts by weight.

The black pigment 1 produced by the production method as described above was evaluated for the average coverage rate by the procedure as described above, and the alkali resistance and the dispersibility were also evaluated. The proportional ratio of the constituents of the black pigment is shown in Table 1 and the results of the evaluation are shown in Table 2.

Example 2

The production procedure of Example 1 was repeated except that the coating weight of the silica in terms of $SiO_2$ was 10.0 parts by weight and the alumina was not coated to prepare black pigment 2 having an average primary particle size of 54 nm. The average coverage rate was determined, and the alkali resistance and the dispersibility were also evaluated. The proportional ratio of the constituents of the black pigments is shown in Table 1 and the results of the evaluation are shown in Table 2.

Example 3

The production procedure of Example 1 was repeated except that the coating weight of the silica in terms of $SiO_2$ was 5.0 parts by weight and the coating weight of the alumina in terms of $Al_2O_3$ was 1.0 parts by weight to prepare black pigment 3 having an average primary particle size of 53 nm. The average coverage rate was determined, and the alkali resistance and the dispersibility were also evaluated. The proportional ratio of the constituents of the black pigment is shown in Table 1 and the results of the evaluation are shown in Table 2.

Example 4

The production procedure of Example 1 was repeated except that the coating weight of the silica in terms of $SiO_2$ was 2.0 parts by weight and the alumina was not coated to prepare black pigment 4 having an average primary particle size of 51 nm. The average coverage rate was determined, and the alkali resistance and the dispersibility were also evaluated. The proportional ratio of the constituents of the black pigment is shown in Table 1 and the results of the evaluation are shown in Table 2.

Example 5

The production procedure of Example 1 was repeated except that the coating weight of the silica in terms of $SiO_2$ was 20.0 parts by weight and the alumina was not coated to prepare black pigment 5 having an average primary particle size of 66 nm. The average coverage rate was determined, and the alkali resistance and the dispersibility were also evaluated. The proportional ratio of the constituents of the black pigment is shown in Table 1 and the results of the evaluation are shown in Table 2.

Example 6

The production procedure of Example 1 was repeated except that the coating weight of the silica in terms of $SiO_2$ was 1.0 part by weight and the alumina was not coated to prepare black pigment 6 having an average primary particle size of 51 nm. The average coverage rate was determined, and the alkali resistance and the dispersibility were also evaluated. The proportional ratio of the constituents of the black pigment is shown in Table 1 and the results of the evaluation are shown in Table 2.

Example 7

The production procedure of Example 1 was repeated except that the coating weight of the silica in terms of $SiO_2$ was 21.0 parts by weight and the alumina was not coated to prepare black pigment 7 having an average primary particle size of 71 nm. The average coverage rate was determined, and the alkali resistance and the dispersibility were also evaluated. The proportional ratio of the constituents of the black pigment is shown in Table 1 and the results of the evaluation are shown in Table 2.

Example 8

The production procedure of Example 1 was repeated except that the coating weight of the silica in terms of $SiO_2$ was 0.9 part by weight and the alumina was not coated to prepare black pigment 8 having an average primary particle size of 50 nm. The average coverage rate was determined, and the alkali resistance and the dispersibility were also evaluated. The proportional ratio of the constituents of the black pigment is shown in Table 1 and the results of the evaluation are shown in Table 2.

Example 9

The production procedure of Example 1 was repeated except that the silica was not coated and the coating weight of the alumina in terms of $Al_2O_3$ was 5.0 parts by weight to prepare black pigment 9 having an average primary particle size of 56 nm. The average coverage rate was determined, and the alkali resistance and the dispersibility were also evaluated. The proportional ratio of the constituents of the black pigment is shown in Table 1 and the results of the evaluation are shown in Table 2.

Example 10

The production procedure of Example 1 was repeated except that the alumina was not coated, and zirconia was coated to a coating weight in terms of $ZrO_2$ of 1.0 part by weight by the procedure as will be described below to prepare black pigment 10 having an average primary particle size of 55 nm. The average coverage rate was determined, and the alkali resistance and the dispersibility were also evaluated. The proportional ratio of the constituents of the black pigment is shown in Table 1 and the results of the evaluation are shown in Table 2.

The coating of the zirconia was accomplished by moving the aqueous suspension of the pigment after the silica coating to a flask equipped with a reflux condenser; adding 0.01 mol/L of zirconium oxychloride ($ZrOCl_2.8H_2O$); and precipitating the zirconia by promoting hydrolysis at a temperature of 80° C. After neutralizing the hydrochloric acid generated as a byproduct with ammonia solution, the subsequent steps of filtration, washing with water, impurity removal, drying, pulverization, and the like were conducted by repeating the procedure of Example 1.

Example 11

The procedure of Example 1 was repeated except that, instead of separately coating the silica and the alumina, sodium silicate aqueous solution, sodium aluminate aqueous solution, and sulfuric acid were added to the aqueous suspension of the pigment to coat a silica-alumina complex oxide (5.0 parts by weight in terms of $SiO_2$ and 1.0 parts by weight in terms of $Al_2O_3$). During the addition, the addition speed was controlled so that the pH was in the range of at least 2 and less than 7. Black pigment 11 having an average primary particle size 54 nm was thereby prepared. The average coverage rate was determined, and the alkali resistance and the dispersibility were also evaluated. The proportional ratio of the constituents of the black pigment is shown in Table 1 and the results of the evaluation are shown in Table 2.

Example 12

The procedure of Example 1 was repeated except that the silica coating weight in terms of $SiO_2$ was 5.0 parts by weight and alumina was not coated to prepare black pigment A, and by the procedure as will be described below, black pigment 12 having an average primary particle size 57 nm was prepared by silane coupling wherein the silica surface was treated so that the group containing 3-methacryloxypropyl group and the silicon atom constitute 3.0 parts by weight in relation to 100.0 parts by weight of the core. The average coverage rate was determined, and the alkali resistance and the dispersibility were also evaluated. The proportional ratio of the constituents of the black pigment is shown in Table 1 and the results of the evaluation are shown in Table 2.

The silane coupling was conducted by adding acetic acid (acid catalyst) to deionized water at a temperature of 40° C. to adjust the pH to 4; adding 5.00 g of 3-methacryloxypropyltrimethoxysilane (KBM-503 manufactured by Shin-Etsu Chemical Co., Ltd.) to promote hydrolysis; adding the hydrolysis product to an aqueous suspension of the pigment prepared by mixing 100.00 g of black pigment A and 400.00 g of deionized water and maintaining at a temperature of 70° C.; stirring the mixture for 30 minutes; raising the temperature to 100° C.; stirring for another 1 hour; and stopping the heating; cooling in a vessel containing ice water. The subsequent steps of filtration, washing with water, impurity removal, drying, pulverization, and the like were conducted by repeating the procedure of Example 1.

Example 13

200.00 g of 2,5-dihydroxybenzene-1,4-diacetic acid and 401.79 g of isatine sulfonic acid were mixed (molar ratio, 1:2) as starting materials, and 152.27 g of p-toluenesulfonic acid monohydrate was added as a catalyst, and this mixture was stirred in 60% by weight aqueous solution of acetic acid. The resulting reaction mixture was heated to 120° C. under reflux with stirring for at least 20 hours, and the stirring was continued without heating until the reaction mixture was cooled to a temperature of 90° C. After allowing the reaction mixture to cool to a temperature of 25° C., the mixture was filtered, and the filtration product was washed with 60% by weight aqueous solution of acetic acid, and then with methanol. The reaction product was added to dimethyl sulfoxide, and the mixture was stirred at 130° C. for 20 hours to promote the dissolution. The stirring of the dimethyl sulfoxide solution was continued without heating until the solution temperature was 100° C. to promote crystallization of the reaction product to thereby prepare dimethyl sulfoxide solution of the pigment crude including coarse particles. Next, the pigment crude was filtered and washed with dimethyl sulfoxide at a temperature of 25° C., and then with water. The resulting product was dried under reduced pressure of 100 Pa at 40° C. for 30 hours, and particle formation was conducted by dry pulverization with a ball mill to an average primary particle size of 50 nm to thereby prepare black pigment 13 which is benzodifuranone-based black pigment wherein $R^1$, $R^2$, $R^4$, $R^5$, $R^6$, $R^7$, $R^9$, and $R^{10}$ are hydrogen atom and $R^3$ and $R^8$ are $SO_3H$ in the general formula (1).

The production method of Example 1 was repeated except that the black pigment 13 was used for the core and the alumina was not coated to obtain black pigment 14 having an average primary particle size of 52 nm. This pigment was evaluated for the average coverage rate, and the alkali resistance and the dispersibility were also evaluated. The proportional ratio of the constituents of the black pigment is shown in Table 1 and the results of the evaluation are shown in Table 2.

Example 14

The procedure of Example 13 was repeated except that 200.00 g of 2,5-dihydroxybenzene-1,4-diacetic acid and 285.01 g of 5-methyl isatine (corresponding to a molar ratio of 1:2) were used for the starting material to prepare black pigment 15 which is benzodifuranone-based black pigment wherein $R^1$, $R^2$, $R^4$, $R^5$, $R^6$, $R^7$, $R^9$, and $R^{10}$ are hydrogen atom and $R^3$ and $R^8$ are $CH_3$ in the general formula (1).

The production method of Example 1 was repeated except that the black pigment 15 was used for the core and the alumina was not coated to obtain black pigment 16 having an average primary particle size of 53 nm. This pigment was evaluated for the average coverage rate, and the alkali resistance and the dispersibility were also evaluated. The proportional ratio of the constituents of the black pigment is shown in Table 1 and the results of the evaluation are shown in Table 2.

Example 15

The production method of Example 1 was repeated except that the alumina was not coated and the drying was conducted in the drying oven at 280° C. for 2 hours to obtain black pigment 17 having an average primary particle size of 49 nm. This pigment was evaluated for the average coverage rate, and the alkali resistance and the dispersibility were also evaluated. The proportional ratio of the constituents of the black pigment is shown in Table 1 and the results of the evaluation are shown in Table 2.

Example 16

As the core, 150 g of the mixture of the perylene-based black pigments represented by the formula (6) and the formula (7) (non-surface treated product; pH of the pigment surface, 8.0; average primary particle size, 55 nm; 3,4,9,10-perylene tetracarboxylic acid bisbenzimidazole; mixing weight ratio of the cis-isomer and trans-isomer, 1:1; "formula (6)+formula (7)" in the Table) was added to a glass vessel containing 2850 g aqueous dispersion medium A (deionized water:isopropyl alcohol=80:20 (weight ratio)), and the mixture was stirred by a dissolver to prepare an aqueous suspension of the pigment. This suspension was sucked by a tube pump and fed to a horizontal bead mill filled with zirconia beads (diameter, 0.4 mm; "Torayceram" (Registered Trademark) manufactured by Toray Industries, Inc.) to conduct 4 pass dispersion at a discharge rate of 30 ml/min. Total volume was discharged to the original glass vessel and again stirred by the dissolver.

When a pH meter was set so that its tip electrode part was immersed at a depth of 3 to 5 cm from the surface of the aqueous suspension of the pigment being stirred in the glass vessel and the pH of the resulting aqueous suspension of the pigment was measured, the pH was 8.0 (liquid temperature, 25° C.). The liquid temperature of the aqueous suspension of the pigment was raised to 60° C. with the stirring continued, and the stirring was temporarily stopped after 30 minutes. The stirring was started again in 2 minutes after confirming that no precipitate was present in the bottom of the glass vessel. A sodium silicate aqueous solution ($Na_2O.nSiO_2.mH_2O$; 30% by weight in terms of sodium oxide and 10% by weight in terms of silicon dioxide) which had been diluted 100 folds by deionized water and 0.001 mol/L sulfuric acid were simultaneously added to the aqueous suspension of the pigment so that the coating weight of silica in terms of $SiO_2$ in relation to 100 parts by weight of the core was 10.0 parts by weight. During the addition, the addition speed was controlled so that the pH was kept in the range of at least 2 and less than 7. Silica was thereby precipitated on the surface of the core. Subsequently, the operation of filtration and washing with water was repeated three times to remove a part of the water-soluble impurities in the aqueous suspension of the pigment, and the suspension was fed to a horizontal bead mill filled with zirconia beads (diameter, 0.4 mm) to conduct 1 pass dispersion at a discharge rate of 300 ml/min. Then, 10 g of a cation-exchange resin and 10 g of an anion-exchange resin (Umberlite, both manufactured by ORGANO CORPORATION) were added to the aqueous suspension of the pigment to thereby remove ionic impurities, and the suspension was stirred for 12 hours and filtration was conducted to obtain a black filtration product. This product was dried in a drying oven at an actual temperature of 90° C. for 6 hours, and then in a drying oven at 250° C. for 2 hours, and particles were formed by dry pulverization using a jet mill to prepare black pigment 18 having an average primary particle size of 59 nm.

As a result of the Time-of-flight secondary ion mass spectrometry and X-ray diffractometry, the black pigment 18 had a silica coating weight in terms of $SiO_2$ in relation to 100.0 parts by weight of the core of 10.0 parts by weight.

The black pigment 18 produced by the production method as described above was evaluated for the average coverage rate, and the alkali resistance and the dispersibility were also evaluated. The proportional ratio of the constituents of the black pigment is shown in Table 1 and the results of the evaluation are shown in Table 2.

Example 17

The procedure of Example 16 was repeated except that 147.00 g of a mixture of the perylene-based black pigments represented by the formula (6) and the formula (7) and 13.60 g of pigment derivative A (copper phthalocyanine derivative having sulfonic acid group derived from C.I. Pigment Blue 15:3; average number of substituents (sulfonic acid group) on the copper phthalocyanine residue, 1.8) were used for the core to prepare a black pigment 19 having an average primary particle size of 55 nm. The average coverage rate was determined, and the alkali resistance and the dispersibility were also evaluated. The proportional ratio of the constituents of the black pigment is shown in Table 1 and the results of the evaluation are shown in Table 2. It is to be noted that a part of the pigment derivative A was lost in the process of producing the black pigment 19, and the core of the finally obtained black pigment 19 was constituted from 98.0 parts by weight of the mixture of the perylene-based black pigments represented by the formula (6) and the formula (7) and 2.0 parts by weight of the pigment derivative A. The black pigment 19 had a silica coating weight in terms of $SiO_2$ in relation to 100.0 parts by weight of the core of 10.0 parts by weight.

Example 18

The procedure of Example 16 was repeated to prepare an aqueous suspension of the pigment containing the mixture of the perylene-based black pigments represented by the formula (6) and the formula (7) as the core. The first surface treatment step and the preceding steps were conducted so that the coating weight of the silica in terms of $SiO_2$ in relation to 100.0 parts by weight of the core was 3.0 parts by weight to prepare an aqueous suspension of the pigment containing black pigment B having the first layer silica deposited on the surface of the core. This suspension was again supplied to a horizontal bead mill filled with zirconia beads (diameter, 0.4 mm) and 1 pass dispersion was conducted at a discharge rate of 100 ml/min. Second surface treatment step was conducted so that total coating weight of the first and second layer silica in terms of $SiO_2$ in relation to 100.0 parts by weight of the core was 10.0 parts by weight. The subsequent steps of filtration, washing with water, impurity removal, drying, pulverization, and the like were conducted by repeating the procedure of Example 16 to prepare black pigment 20 having an average primary particle size of 59 nm. The average coverage rate was determined, and the alkali resistance and the dispersibility were also evaluated. The proportional ratio of the constituents of the black pigment is shown in Table 1 and the results of the evaluation are shown in Table 2.

Example 19

200.00 g of "CHROMOFINE BLACK" (Registered Trademark) A1103 (pH of the pigment surface, 7.5; average primary particle size 430 nm; manufactured by Dainichiseika Color & Chemicals Mfg. Co., Ltd.; hereinafter referred to as "A1103") which is an azo-based black pigment represented by the formula (9), 2000.00 g of sodium chloride which is a water-soluble inorganic salt, and 500 g of diethylene glycol which is a water-soluble solvent were mixed, and the mixture was kneaded in a kneader for 4 hours while retaining the mixture at 100 to 110° C. Next, water was added to the resulting black kneaded product, and water-soluble components were dissolved in 3 L water maintained at 70° C. Washing with water was repeated until the content of the free chlorine in the black filtration product was under 100 ppm, and separation by filtration was conducted to obtain black pigment 21 having an average primary particle size of 65 nm. The procedure as described above is the treatment of reducing the primary particle size by solvent salt milling. The subsequent steps were conducted by repeating the procedure of Example 16 except that the black pigment 21 was used for the core to coat the black pigment 21 with silica and produce black pigment 22 having an average primary particle size of 71 nm. The average coverage rate was determined, and the alkali resistance and the dispersibility were also evaluated. The proportional ratio of the constituents of the black pigment is shown in Table 1 and the results of the evaluation are shown in Table 2. The black pigment 22 had a silica coating weight in terms of $SiO_2$ in relation to 100.0 parts by weight of the core of 10.0 parts by weight.

Example 20

317.35 g (1.00 mole) of 2-[3-[(4-aminophenyl)amino]-1H-isoindol-1-idene]-2-cyano-N-methyl acetamide was added to 1000 g of nitrobenzene, and after adding concentrated hydrochloric acid to generate a hydrochloride, sodium nitrite aqueous solution was added for diazotization to prepare a diazonium salt solution. In the meantime, 396.45 g (1.00 mol) of N-(2-methyl-4-methoxyphenyl)-2-hydroxy-11H-benzo [a] carbazole-3-carboamide as a coupling component was added to a solution of 4.00 g of sodium hydroxide in 1500.00 g of methanol to prepare coupling solution. The diazonium salt solution as described above was maintained to a temperature of up to 15° C., and the coupling solution as described above was added to this solution. Sodium acetate was added to adjust the pH to 7.0, and the solution was stirred for 1 hour, and then at 25° C. for 2 hours. The temperature was raised to 40° C., and the stirring was continued for 3 hours while maintaining the temperature at 40° C. to complete the coupling reaction. The resulting reaction product was filtered to obtain a black filtration product, and this product was washed with methanol, and then with water, and dried to obtain a pigment crude. Next, the primary particle size was reduced by conducting the solvent salt milling by a procedure similar to Example 19 to produce a black pigment 23 which is an azo-based black pigment represented by the formula (10) having an average primary particle size of 60 nm. Next, the black pigment 23 was coated with silica by repeating the procedure of Example 16 for the subsequent steps except that the black pigment 23 was used for the core to produce black pigment 24 having an average primary particle size of 67 nm. The average coverage rate was determined, and the alkali resistance and the dispersibility were also evaluated. The proportional ratio of the constituents of the black pigment is shown in Table 1 and the results of the evaluation are shown in Table 2. The black pigment 24 had a silica coating weight in terms of $SiO_2$ in relation to 100.0 parts by weight of the core of 10.0 parts by weight.

TABLE 1

| | Core | | | | Coating layer | | | | |
|---|---|---|---|---|---|---|---|---|---|
| | Pigment | | | | Silica and/or metal oxide and/or metal hydroxide (parts by weight) in terms of | | | | Group containing 3-methacryl-oxypropyl group and silicon atom (parts by weight) |
| | Pigment | Type of chemical structure | Pigment Name | Parts by weight | Pigment derivative A (parts by weight) | $SiO_2$ | $Al_2O_3$ | $ZrO_2$ | $SiO_2/Al_2O_3$ complex oxide | |
| Example 1 | Black pigment 1 | Benzodifuranone-based | S0100 | 100.0 | — | 10.0 | 2.0 | — | — | — |
| Example 2 | Black pigment 2 | Benzodifuranone-based | S0100 | 100.0 | — | 10.0 | — | — | — | — |
| Example 3 | Black pigment 3 | Benzodifuranone-based | S0100 | 100.0 | — | 5.0 | 1.0 | — | — | — |
| Example 4 | Black pigment 4 | Benzodifuranone-based | S0100 | 100.0 | — | 2.0 | — | — | — | — |
| Example 5 | Black pigment 5 | Benzodifuranone-based | S0100 | 100.0 | — | 20.0 | — | — | — | — |
| Example 6 | Black pigment 6 | Benzodifuranone-based | S0100 | 100.0 | — | 1.0 | — | — | — | — |
| Example 7 | Black pigment 7 | Benzodifuranone-based | S0100 | 100.0 | — | 21.0 | — | — | — | — |
| Example 8 | Black pigment 8 | Benzodifuranone-based | S0100 | 100.0 | — | 0.9 | — | — | — | — |
| Example 9 | Black pigment 9 | Benzodifuranone-based | S0100 | 100.0 | — | — | 5.0 | — | — | — |
| Example 10 | Black pigment 10 | Benzodifuranone-based | S0100 | 100.0 | — | 10.0 | — | 1.0 | — | — |
| Example 11 | Black pigment 11 | Benzodifuranone-based | S0100 | 100.0 | — | — | — | — | 5.0/1.0 | — |
| Example 12 | Black pigment 12 | Benzodifuranone-based | S0100 | 100.0 | — | 5.0 | — | — | — | 3.0 |
| Example 13 | Black pigment 14 | Benzodifuranone-based | Black pigment 13 | 100.0 | — | 10.0 | — | — | — | — |
| Example 14 | Black pigment 16 | Benzodifuranone-based | Black pigment 15 | 100.0 | — | 10.0 | — | — | — | — |
| Example 15 | Black pigment 17 | Benzodifuranone-based | S0100 | 100.0 | — | 10.0 | — | — | — | — |
| Example 16 | Black pigment 18 | Perylene-based | Formulae (6) + (7) | 100.0 | — | 10.0 | — | — | — | — |
| Example 17 | Black pigment 19 | Perylene-based | Formulae (6) + (7) | 98.0 | 2.0 | 10.0 | — | — | — | — |
| Example 18 | Black pigment 20 | Perylene-based | Formulae (6) + (7) | 100.0 | — | 3.0 + 7.0 | — | — | — | — |
| Example 19 | Black pigment 22 | Azo-based | Black pigment 21 | 100.0 | — | 10.0 | — | — | — | — |
| Example 20 | Black pigment 24 | Azo-based | Black pigment 23 | 100.0 | — | 10.0 | — | — | — | — |

TABLE 2

| | | Evaluation of pigment | | | | |
|---|---|---|---|---|---|---|
| | | (i) | (ii) Alkali resistance | | (iii) Dispersibility | |
| | Pigment | Average coverage N (%) | Pigment dissolution (% by weight) | Evaluation | Average dispersion particle size (nm) | Evaluation |
| Example 1 | Black pigment 1 | 97.5 | 4.4 | AA | 174 | AA |
| Example 2 | Black pigment 2 | 97.0 | 7.1 | A | 262 | A |
| Example 3 | Black pigment 3 | 95.3 | 8.3 | A | 181 | AA |
| Example 4 | Black pigment 4 | 73.9 | 22.6 | B | 275 | A |
| Example 5 | Black pigment 5 | 98.7 | 5.1 | A | 352 | B |
| Example 6 | Black pigment 6 | 65.1 | 29.5 | B | 285 | A |
| Example 7 | Black pigment 7 | 98.9 | 6.7 | A | 363 | B |
| Example 8 | Black pigment 8 | 62.4 | 35.7 | C | 284 | A |
| Example 9 | Black pigment 9 | 87.3 | 4.9 | A | 163 | AA |
| Example 10 | Black pigment 10 | 97.2 | 4.5 | AA | 223 | A |
| Example 11 | Black pigment 11 | 95.5 | 6.0 | A | 189 | AA |
| Example 12 | Black pigment 12 | 95.8 | 9.9 | A | 265 | A |
| Example 13 | Black pigment 14 | 96.1 | 4.9 | A | 251 | A |
| Example 14 | Black pigment 16 | 88.6 | 12.7 | B | 273 | A |
| Example 15 | Black pigment 17 | 97.0 | 6.0 | A | 168 | AA |
| Example 16 | Black pigment 18 | 64.5 | 1.1 | AA | 734 | C |
| Example 17 | Black pigment 19 | 78.8 | 1.1 | AA | 342 | B |
| Example 18 | Black pigment 20 | 84.5 | 1.0 | AA | 288 | A |
| Example 19 | Black pigment 22 | 63.7 | 0.5 | AA | 392 | B |
| Example 20 | Black pigment 24 | 65.6 | 0.6 | AA | 455 | B |

Comparative Example 1

S0100 which is a benzodifuranone-based black pigment was evaluated for the alkali resistance and the dispersibility. The proportional ratio of the constituents of the black pigment is shown in Table 3 and the results of the evaluation are shown in Table 4.

Comparative Example 2

Black pigment 13 which is a benzodifuranone-based black pigment was evaluated for the alkali resistance and the dispersibility. The proportional ratio of the constituents of the black pigment is shown in Table 3 and the results of the evaluation are shown in Table 4.

Comparative Example 3

Black pigment 15 which is a benzodifuranone-based black pigment was evaluated for the alkali resistance and the dispersibility. The proportional ratio of the constituents of the black pigment is shown in Table 3 and the results of the evaluation are shown in Table 4.

Comparative Example 4

The mixture of the perylene-based black pigments represented by the formula (6) and the formula (7) was evaluated for its alkali resistance and dispersibility. The proportional ratio of the constituents of the black pigment is shown in Table 3 and the results of the evaluation are shown in Table 4.

Comparative Example 5

Black pigment 21 which is an azo-based black pigment was evaluated for the alkali resistance and the dispersibility. The proportional ratio of the constituents of the black pigment is shown in Table 3 and the results of the evaluation are shown in Table 4.

Comparative Example 6

Black pigment 23 which is an azo-based black pigment was evaluated for the alkali resistance and the dispersibility. The proportional ratio of the constituents of the black pigment is shown in Table 3 and the results of the evaluation are shown in Table 4.

Comparative Example 7

150 g of S0100 as the core was added to a glass vessel containing 2850 g of deionized water, and the mixture was stirred by a dissolver to prepare an aqueous suspension of the pigment. This suspension was sucked by a tube pump and fed to a horizontal bead mill filled with zirconia beads (diameter, 0.4 mm) to conduct 2 pass dispersion at a discharge rate of 30 ml/min. Total volume was discharged to the original glass vessel and again stirred by the dissolver. The liquid temperature of the aqueous suspension of the pigment was raised to 60° C. with the stirring continued, and the stirring was temporarily stopped after 30 minutes. The stirring was started again in 2 minutes after confirming that no precipitate was present in the bottom of the glass vessel. To this aqueous suspension of the pigment, barium hydroxide aqueous solution having a solid content of 1.00% by weight and 0.001 mol/L sulfuric acid were simultaneously added with stirring while maintaining the pH in the range of at least 2 and less than 7 by controlling addition speed of each component so that coating weight in terms of $BaSO_4$ of the barium sulfate in relation 100 parts by weight of the core was 30.0 parts by weight. The barium sulfate was thereby precipitated on the surface of the core and the core was thereby coated. Subsequently, the operation of filtration and washing with water was repeated three times to remove a part of the water-soluble impurities in the aqueous suspension of the pigment, and the suspension was fed to a horizontal bead mill filled with zirconia beads (diameter, 0.4 mm) to conduct 1 pass dispersion at a discharge rate of 300 ml/min. Then, 10 g of a cation-exchange resin and 10 g of an anion-exchange resin (Umberlite, both manufactured by ORGANO CORPORATION) were added to the aqueous suspension of the pigment to thereby remove ionic impurities, and the suspension was stirred for 12 hours and filtration was conducted to obtain a black filtration product. This product was heated in a drying oven at an actual temperature of 90° C. for 6 hours, and then in a drying oven at 200° C. for 30 minutes, and particles were formed by dry pulverization using a jet mill to prepare black pigment 25 having an average primary particle size of 62 nm.

As a result of the Time-of-flight secondary ion mass spectrometry and X-ray diffractometry, the black pigment 25 had a barium sulfate coating weight in terms of the $BaSO_4$ in relation to 100.0 parts by weight of the core of 30.0 parts by weight.

The black pigment 25 produced by the production method as described above was evaluated for the average coverage rate, and the alkali resistance and the dispersibility were also evaluated. The proportional ratio of the constituents of the black pigment is shown in Table 3 and the results of the evaluation are shown in Table 4. It is to be noted that the barium sulfate as used herein is an inorganic coating material (an ion crystal) which does not belong to any one of the silica, the metal oxide, and the metal hydroxide.

Comparative Example 8

150 g of S0100 as the core was added to a glass vessel containing 1000 g of deionized water, and the mixture was stirred by a dissolver to prepare an aqueous suspension of the pigment. This suspension was sucked by a tube pump and fed to a horizontal bead mill filled with zirconia beads (diameter, 0.4 mm) to conduct 2 pass dispersion at a discharge rate of 30 ml/min. Total volume was discharged to the original glass vessel and again stirred by the dissolver. The liquid temperature of the aqueous suspension of the pigment was raised to 60° C. with the stirring continued, and the stirring was temporarily stopped after 30 minutes. The stirring was started again in 2 minutes after confirming that no precipitate was present in the bottom of the glass vessel. In the meantime, "jER" which is an epoxy resin (Registered Trademark) 828 (bisphenol A epoxy resin manufactured by Mitsubishi Chemical Corporation) and toluene were mixed to separately prepare epoxy resin solution A (solid content, 10% by weight). After gradually adding the epoxy resin solution A to the aqueous suspension of the pigment so that the coating weight of the epoxy resin in relation to 100 parts by weight of the core was 10.0 parts by weight, the mixture was stirred for 1 hour and filtration was conducted to obtain a black filtration product, which was dried in a drying oven at an actual temperature of 90° C. for 6 hours and then in a drying oven of 220° C. for 30 minutes for thermal curing of the epoxy resin. Since blocking between the coating layers was significant, strong pulverization by continuous-type swing hammer mill was conducted, and particles were formed by dry pulverization using a jet mill to prepare black pigment 26 having an average primary particle size of 75 nm.

The black pigment 26 produced by the production method as described above was evaluated for the average coverage rate, and the alkali resistance and the dispersibility were also evaluated. The proportional ratio of the constituents of the black pigment is shown in Table 3 and the results of the evaluation are shown in Table 4. It is to be noted that the epoxy resin as used herein is an organic coating material which does not belong to any one of the silica, the metal oxide, and the metal hydroxide.

Comparative Example 9

150 g of S0100 as the core was added to a glass vessel containing 2850 g of ethyl acetate, and the mixture was stirred by a dissolver to prepare a suspension of the oil-based pigment. This suspension was sucked by a tube pump and fed to a horizontal bead mill filled with zirconia beads (diameter, 0.4 mm) to conduct 2 pass dispersion at a discharge rate of 30 ml/min. Total volume was discharged to the original glass vessel and again stirred by the dissolver. The liquid temperature of the suspension of the oil-based pigment was raised to 60° C. with the stirring continued, and the stirring was temporarily stopped after 30 minutes. After 2 minutes, the suspension of the oil-based pigment was transferred to a new synthesis flask for synthesis after confirming that no precipitate was present in the bottom of the glass vessel. The mixture was heated to a temperature of 80° C. with stirring while introducing nitrogen gas to the interior of the synthesis flask so that coating weight in relation to 100 parts by weight of the core of the acrylic resin was 10.0 parts by weight by using 20.00 g of methyl methacrylate, 5.00 g of trimethylolpropanetriacrylate, and 0.50 g of azobisisobutyronitrile as the thermal polymerization initiator for the source of the coating, and the mixture was stirred at 80° C. for 6 hours to promote the thermal polymerization to thereby coat the acrylic resin on the surface of the core. The gelated content which was not involved in the coating was removed by gel trap filter, and the resulting black filtration product was dried in a drying oven at actual temperature of 90° C. for 6 hours, and then in a drying oven at 230° C. for 3 hours to decompose the thermal polymerization initiator and inactivate the active species and to also volatilize the monomers which had failed to undergo the reaction. Since blocking between the coating layers was significant, strong pulverization by continuous-type swing hammer mill was conducted, and particles were formed by dry pulverization using a jet mill to prepare black pigment 27 having an average primary particle size of 63 nm.

The black pigment 27 produced by the production method as described above was evaluated for the average coverage rate by the procedure as described above, and the alkali resistance and the dispersibility were also evaluated. The proportional ratio of the constituents of the black pigment is shown in Table 3 and the results of the evaluation are shown in Table 4. It is to be noted that the acrylic resin as used herein is an organic coating material which does not belong to any one of the silica, the metal oxide, and the metal hydroxide.

Comparative Example 10

The procedure of Comparative Example 7 was repeated except that, in the preparation of the aqueous suspension of the pigment, the mixture of the perylene-based black pigments represented by the formula (6) and the formula (7) was used for the core, an aqueous dispersion medium A was used, and 4 pass dispersion was conducted by the horizontal bead mill under the dispersion condition of the discharge rate of 30 ml/min to prepare black pigment 28 having an average primary particle size of 71 nm. The average coverage rate was determined and the alkali resistance and the dispersibility were also evaluated. The proportional ratio of the constituents of the black pigment is shown in Table 3 and the results of the evaluation are shown in Table 4.

Comparative Example 11

The procedure of Comparative Example 8 was repeated except that, in the preparation of the aqueous suspension of the pigment, a mixture of the perylene-based black pigments represented by the formula (6) and the formula (7) was used for the core, an aqueous dispersion medium A was used, and 4 pass dispersion was conducted by the horizontal bead mill under the dispersion condition of the discharge rate of 30 ml/min to prepare black pigment 29 having an average primary particle size of 73 nm. The average coverage rate was determined and the alkali resistance and the dispersibility were also evaluated. The proportional ratio of the constituents of the black pigment is shown in Table 3 and the results of the evaluation are shown in Table 4.

Comparative Example 12

The procedure of Comparative Example 9 was repeated except that, in the preparation of the suspension of the oil-based pigment, the mixture of the perylene-based black pigments represented by the formula (6) and the formula (7) was used for the core, and 4 pass dispersion was conducted by the horizontal bead mill under the dispersion condition of the discharge rate of 30 ml/min to prepare black pigment 30 having an average primary particle size of 62 nm. The average coverage rate was determined and the alkali resistance and the dispersibility were also evaluated. The proportional ratio of the constituents of the black pigment is shown in Table 3 and the results of the evaluation are shown in Table 4.

Comparative Example 13

The procedure of Comparative Example 7 was repeated except that, in the preparation of the aqueous suspension of the pigment, black pigment 21 was used for the core, an aqueous dispersion medium A was used, and 4 pass dispersion was conducted by the horizontal bead mill under the dispersion condition of the discharge rate of 30 ml/min to prepare black pigment 31 having an average primary particle size of 71 nm. The average coverage rate was determined and the alkali resistance and the dispersibility were also evaluated. The proportional ratio of the constituents of the black pigment is shown in Table 3 and the results of the evaluation are shown in Table 4.

Comparative Example 14

The procedure of Comparative Example 8 was repeated except that, in the preparation of the aqueous suspension of the pigment, black pigment 21 was used for the core, an aqueous dispersion medium A was used, and 4 pass dispersion was conducted by the horizontal bead mill under the dispersion condition of the discharge rate of 30 ml/min to prepare black pigment 32. The average coverage rate was determined and the alkali resistance and the dispersibility were also evaluated. The proportional ratio of the constituents of the black pigment is shown in Table 3 and the results of the evaluation are shown in Table 4.

Comparative Example 15

The procedure of Comparative Example 9 was repeated except that, in the preparation of the suspension of the oil-based pigment, black pigment 21 was used for the core and 4 pass dispersion was conducted by the horizontal bead mill under the dispersion condition of the discharge rate of 30 ml/min to prepare black pigment 33 having an average primary particle size of 66 nm. The average coverage rate was determined and the alkali resistance and the dispersibility were also evaluated. The proportional ratio of the constituents of the black pigment is shown in Table 3 and the results of the evaluation are shown in Table 4.

Comparative Example 16

MA100 (carbon black; C.I. Pigment Black 7; manufactured by Mitsubishi Chemical Corporation; "MA100" in the Table) having an average primary particle size of 25 nm which is an inorganic black pigment not belonging to any one of the benzodifuranone-based black pigment, the perylene-based black pigment, and the azo-based black pigment was evaluated for its alkali resistance and dispersibility. The results of the evaluation are shown in Table 4.

Comparative Example 17

Cromophtal Violet L5805 (dioxazine violet; C.I. Pigment Violet 23; manufactured by BASF; "L5805" in the Table) having an average primary particle size of 45 nm which is an organic violet pigment not belonging to any one of the benzodifuranone-based black pigment, the perylene-based black pigment, and the azo-based black pigment was evaluated for its alkali resistance and the dispersibility. The results of the evaluation are shown in Table 4.

Comparative Example 18

EP193 (copper phthalocyanine blue; C.I. Pigment Blue 15:6; manufactured by DIC Corporation; "EP193" in the Table) having an average primary particle size of 54 nm which is an organic blue pigment not belonging to any one of the benzodifuranone-based black pigment, the perylene-based black pigment, and the azo-based black pigment was evaluated for its alkali resistance and dispersibility. The results of the evaluation are shown in Table 4.

TABLE 3

|  | Pigment | Core Type of chemical structure | Pigment Name | Parts by weight | Coating layer In terms of BaSO₄ (parts by weight) | Epoxy resin (parts by weight) | Acryl resin (parts by weight) |
|---|---|---|---|---|---|---|---|
| Comparative Example 1 | S0100 | Benzodifuranone-based | S0100 | 100.0 | — | — | — |
| Comparative Example 2 | Black pigment 13 | Benzodifuranone-based | Black pigment 13 | 100.0 | — | — | — |
| Comparative Example 3 | Black pigment 15 | Benzodifuranone-based | Black pigment 15 | 100.0 | — | — | — |
| Comparative Example 4 | Formulae (6) + (7) | Perylene-based | Formulae (6) + (7) | 100.0 | — | — | — |
| Comparative Example 5 | Black pigment 21 | Azo-based | Black pigment 21 | 100.0 | — | — | — |
| Comparative Example 6 | Black pigment 23 | Azo-based | Black pigment 23 | 100.0 | — | — | — |
| Comparative Example 7 | Black pigment 25 | Benzodifuranone-based | S0100 | 100.0 | 30.0 | — | — |
| Comparative Example 8 | Black pigment 26 | Benzodifuranone-based | S0100 | 100.0 | — | 10.0 | — |
| Comparative Example 9 | Black pigment 27 | Benzodifuranone-based | S0100 | 100.0 | — | — | 10.0 |
| Comparative Example 10 | Black pigment 28 | Perylene-based | Formulae (6) + (7) | 100.0 | 30.0 | — | — |
| Comparative Example 11 | Black pigment 29 | Perylene-based | Formulae (6) + (7) | 100.0 | — | 10.0 | — |
| Comparative Example 12 | Black pigment 30 | Perylene-based | Formulae (6) + (7) | 100.0 | — | — | 10.0 |
| Comparative Example 13 | Black pigment 31 | Azo-based | Black pigment 21 | 100.0 | 30.0 | — | — |
| Comparative Example 14 | Black pigment 32 | Azo-based | Black pigment 21 | 100.0 | — | 10.0 | — |
| Comparative Example 15 | Black pigment 33 | Azo-based | Black pigment 21 | 100.0 | — | — | 10.0 |
| Comparative Example 16 | MA100 | Carbon black-based | MA100 | 100.0 | — | — | — |
| Comparative Example 17 | L5805 | Dioxadine-based | L5805 | 100.0 | — | — | — |
| Comparative Example 18 | EP193 | Copper phthalocyanine-based | EP193 | 100.0 | — | — | — |

TABLE 4

|  | Pigment | Evaluation of pigment | | | | |
|---|---|---|---|---|---|---|
|  |  | (i) Average coverage N (%) | (ii) Alkali resistance | | (iii) Dispersibility | |
|  |  |  | Pigment dissolution (% by weight) | Evaluation | Average dispersion particle size (nm) | Evaluation |
| Comparative Example 1 | S0100 | 0.0 | 61.6 | D | 255 | A |
| Comparative Example 2 | Black pigment 13 | 0.0 | 66.9 | D | 201 | A |
| Comparative Example 3 | Black pigment 15 | 0.0 | 62.7 | D | 212 | A |
| Comparative Example 4 | Formulae (6) + (7) | 0.0 | 1.3 | AA | 3014 | D |
| Comparative Example 5 | Black pigment 21 | 0.0 | 0.8 | AA | 2873 | D |
| Comparative Example 6 | Black pigment 23 | 0.0 | 0.9 | AA | 2403 | D |
| Comparative Example 7 | Black pigment 25 | 73.4 | 52.3 | D | 786 | C |
| Comparative Example 8 | Black pigment 26 | 75.0 | 54.3 | D | 647 | C |
| Comparative Example 9 | Black pigment 27 | 97.3 | 55.0 | D | 543 | C |
| Comparative Example 10 | Black pigment 28 | 42.3 | 1.3 | AA | 2247 | D |
| Comparative Example 11 | Black pigment 29 | 41.0 | 5.7 | A | 3748 | D |
| Comparative Example 12 | Black pigment 30 | 45.0 | 10.3 | B | 3004 | D |
| Comparative Example 13 | Black pigment 31 | 65.8 | 0.9 | AA | 2437 | D |
| Comparative Example 14 | Black pigment 32 | 45.6 | 6.1 | A | 2604 | D |
| Comparative Example 15 | Black pigment 33 | 50.1 | 10.5 | B | 2275 | D |
| Comparative Example 16 | MA100 | 0.0 | 0.8 | AA | 269 | B |
| Comparative Example 17 | L5805 | 0.0 | 5.1 | A | 653 | C |
| Comparative Example 18 | EP193 | 0.0 | 6.3 | A | 305 | B |

As demonstrated by the results of the evaluation as described above, Comparative Examples 1 to 3 experienced higher pigment dissolution compared to Comparative Examples 4 to 6 and Comparative Examples 16 to 18, indicating that the benzodifuranone-based black pigment is an organic pigment having poor alkali resistance. In contrast, Examples 1 to 15 demonstrate that the black pigment of the present invention having the coating layer containing the silica and/or the metal oxide and/or the metal hydroxide exhibits drastically improved alkali resistance. In addition, Comparative Examples 7 to 9 demonstrate that other coating materials are insufficient in the effect of improving the alkali resistance. More specifically, barium sulfate which is an inorganic coating material has poor effect of preventing the liquid permeation despite its high alkali resistance as the coating material itself while organic coating materials such as epoxy resin and acrylic resin are insufficient in their alkali resistance, and all of these materials are conceived to be insufficient in the function as a protective layer protecting the core. Comparison of Comparative Examples 1 to 3 and Comparative Examples 16 to 18 with Comparative Examples 4 to 6 demonstrates that the perylene-based black pigments and the azo-based black pigments are the pigments having a large average dispersion particle size with poor dispersibility despite their good alkali resistance. On the other hand, Examples 16 to 20, namely, the black pigments of the present invention exhibits greatly improved dispersibility.

Synthetic Example: Synthesis of Alkali-Soluble Polyimide Resin Solution A

In dry nitrogen stream, 150.15 g of 2,2-bis(3-amino-4-hydroxyphenyl)hexafluoropropane (0.41 mol), 6.20 g of 1,3-bis(3-aminopropyl)tetramethyldisiloxane (0.02 mol), and 13.65 g of 3-aminophenol (0.13 mol) (an end-capping agent) were dissolved in 500.00 g of N-methyl-2-pyrrolidone (hereinafter referred to as "NMP", a solvent), and to this solution, 155.10 g of bis(3,4-dicarboxyphenyl) ether dianhydride (0.50 mol) and 150 g of NMP were added. After stirring the solution at 20° C. for 1 hour, stirring of the solution was continued at 180° C. for 4 hours while removing the water. After the completion of the reaction, the reaction solution was added to 10 L of water, and the precipitate generated was collected by filtration, washed 5 times with water, and dried in a vacuum dryer at 80° C. for 20 hours to synthesize a powder of alkali-soluble polyimide resin having a weight average molecular weight (Mw) of 25,000. This powder was dissolved in PGMEA to obtain alkali-soluble polyimide resin solution A having a solid content 30% by weight.

Example 21

45.00 g of the alkali-soluble polyimide resin solution A (the resin solution to be dispersed) and 9.00 g of Solsperse 20000 were mixed with 223.50 g of PGMEA, and after stirring the mixture for 10 minutes, 22.50 g of the black pigment 1 was added. After stirring the mixture for 20 minutes, circulation wet medium dispersion was conducted for 30 minutes by using a horizontal bead mill filled with zirconia beads (diameter, 0.4 mm). For further size reduction, the circulation wet medium dispersion was conducted for 1 hour by using a horizontal bead mill filled with zirconia beads (diameter, 0.05 mm) to prepare pigment dispersion 1 having a solid content 15% by weight, and the dispersion stability was evaluated. Amount (g) of the materials incorporated and the results of the evaluation are shown in Table 5.

Examples 22 to 34 and 37 to 42 and Comparative Examples 19 to 21, 23 to 26, and 28 to 40

The production procedure of Example 21 was repeated except that the black pigments, S0100, the mixture of perylene-based black pigments represented by the formula (6) and formula (7), and MA100 shown in Tables 1 and 3 were respectively used instead of the black pigment 1 to prepare pigment dispersions 2 to 14, 17 to 25, 27 to 30, and 32 to 44, and the dispersion stability was evaluated. Amount (g) of the materials incorporated and the results of the evaluation are shown in Tables 5 and 6.

Examples 35 to 36

The production procedure of Example 21 was repeated except that the black pigment 2 or the black pigment 18 was used instead of the black pigment 1 and the Solsperse 20000 was not used to prepare pigment dispersions 15 and 16, and the dispersion stability was evaluated. Amount (g) of the materials incorporated and the results of the evaluation are shown in Table 5.

Comparative Example 22

45.00 g of the alkali-soluble polyimide resin solution A and 9.00 g of Solsperse 20000 were mixed with 223.50 g of PGMEA, and after stirring the mixture for 10 minutes, 20.25 g of S0100 and 2.25 g of AEROSIL 200 (manufactured by Evonik, silica fine particles) were added. After stirring the mixture for 20 minutes, the circulation wet medium dispersion was conducted for 30 minutes by using a horizontal bead mill filled with zirconia beads (diameter, 0.4 mm). For further size reduction, the circulation wet medium dispersion was conducted for 1 hour by using a horizontal bead mill filled with zirconia beads (diameter, 0.05 mm) to prepare pigment dispersion 26 having a solid content 15% by weight, and the dispersion stability was evaluated. Amount (g) of the materials incorporated and the results of the evaluation are shown in Table 6.

Comparative Example 27

45.00 g of the alkali-soluble polyimide resin solution A and 9.00 g of Solsperse 20000 were mixed with 223.50 g of PGMEA, and after stirring the mixture for 10 minutes, 21.15 g of the mixture of the perylene-based black pigments represented by the formula (6) and the formula (7) and 1.35 g of pigment derivative A were added. After stirring the mixture for 20 minutes, the circulation wet medium dispersion was conducted for 30 minutes by using a horizontal bead mill filled with zirconia beads (diameter, 0.4 mm). For further size reduction, the circulation wet medium dispersion was conducted for 1 hour by using a horizontal bead mill filled with zirconia beads (diameter, 0.05 mm) to prepare pigment dispersion 31 having a solid content 15% by weight, and the dispersion stability was evaluated. Amount (g) of the materials incorporated and the results of the evaluation are shown in Table 6.

TABLE 5

| | Pigment dispersion | Pigment Type | Weight (g) | Alkali-soluble resin (alkali-soluble polyimide resin solution A) solid content, 30% by weight Weight (g) | Polymer resin dispersant (Solsperse 20000) Weight (g) | Solvent (PGMEA) Weight (g) | Solid content of pigment dispersion (% by weight) | Evaluation of dispersion stability of pigment dispersion Viscosity increase (%) | Evaluation |
|---|---|---|---|---|---|---|---|---|---|
| Example 21 | Pigment dispersion 1 | Black pigment 1 | 22.50 | 45.00 | 9.00 | 223.50 | 15.0 | 2.2 | A |
| Example 22 | Pigment dispersion 2 | Black pigment 2 | 22.50 | 45.00 | 9.00 | 223.50 | 15.0 | 5.3 | B |
| Example 23 | Pigment dispersion 3 | Black pigment 3 | 22.50 | 45.00 | 9.00 | 223.50 | 15.0 | 4.8 | A |
| Example 24 | Pigment dispersion 4 | Black pigment 4 | 22.50 | 45.00 | 9.00 | 223.50 | 15.0 | 8.9 | B |

TABLE 5-continued

| Pigment dispersion | Pigment Type | Pigment Weight (g) | Alkali-soluble resin (alkali-soluble polyimide resin solution A) solid content, 30% by weight Weight (g) | Polymer resin dispersant (Solsperse 20000) Weight (g) | Solvent (PGMEA) Weight (g) | Solid content of pigment dispersion (% by weight) | Evaluation of dispersion stability of pigment dispersion Viscosity increase (%) | Evaluation |
|---|---|---|---|---|---|---|---|---|
| Example 25 | Pigment dispersion 5 | Black pigment 5 | 22.50 | 45.00 | 9.00 | 223.50 | 15.0 | 5.2 | B |
| Example 26 | Pigment dispersion 6 | Black pigment 6 | 22.50 | 45.00 | 9.00 | 223.50 | 15.0 | 8.5 | B |
| Example 27 | Pigment dispersion 7 | Black pigment 7 | 22.50 | 45.00 | 9.00 | 223.50 | 15.0 | 10.9 | C |
| Example 28 | Pigment dispersion 8 | Black pigment 8 | 22.50 | 45.00 | 9.00 | 223.50 | 15.0 | 6.5 | B |
| Example 29 | Pigment dispersion 9 | Black pigment 9 | 22.50 | 45.00 | 9.00 | 223.50 | 15.0 | 4.3 | A |
| Example 30 | Pigment dispersion 10 | Black pigment 10 | 22.50 | 45.00 | 9.00 | 223.50 | 15.0 | 5.1 | B |
| Example 31 | Pigment dispersion 11 | Black pigment 11 | 22.50 | 45.00 | 9.00 | 223.50 | 15.0 | 2.9 | A |
| Example 32 | Pigment dispersion 12 | Black pigment 12 | 22.50 | 45.00 | 9.00 | 223.50 | 15.0 | 3.0 | A |
| Example 33 | Pigment dispersion 13 | Black pigment 14 | 22.50 | 45.00 | 9.00 | 223.50 | 15.0 | 5.1 | B |
| Example 34 | Pigment dispersion 14 | Black pigment 16 | 22.50 | 45.00 | 9.00 | 223.50 | 15.0 | 5.4 | B |
| Example 35 | Pigment dispersion 15 | Black pigment 2 | 22.50 | 75.00 | — | 202.50 | 15.0 | 11.5 | C |
| Example 36 | Pigment dispersion 16 | Black pigment 18 | 22.50 | 75.00 | — | 202.50 | 15.0 | 27.5 | C |
| Example 37 | Pigment dispersion 17 | Black pigment 17 | 22.50 | 45.00 | 9.00 | 223.50 | 15.0 | 4.2 | A |
| Example 38 | Pigment dispersion 18 | Black pigment 18 | 22.50 | 45.00 | 9.00 | 223.50 | 15.0 | 20.3 | C |
| Example 39 | Pigment dispersion 19 | Black pigment 19 | 22.50 | 45.00 | 9.00 | 223.50 | 15.0 | 6.3 | B |
| Example 40 | Pigment dispersion 20 | Black pigment 20 | 22.50 | 45.00 | 9.00 | 223.50 | 15.0 | 4.7 | A |
| Example 41 | Pigment dispersion 21 | Black pigment 22 | 22.50 | 45.00 | 9.00 | 223.50 | 15.0 | 11.8 | C |
| Example 42 | Pigment dispersion 22 | Black pigment 24 | 22.50 | 45.00 | 9.00 | 223.50 | 15.0 | 10.8 | C |

TABLE 6

| Pigment dispersion | Pigment Type | Pigment Weight (g) | Pigment derivative A Weight (g) | Silica particle (AEROSIL 200) Weight (g) | Alkali-soluble resin (alkali-soluble polyimide resin solution A) solid content, 30% by weight Weight (g) | Polymer resin dispersant (Solsperse 20000) Weight (g) | Solvent (PGMEA) Weight (g) | Solid content of pigment dispersion (% by weight) | Evaluation of dispersion stability of pigment dispersion Viscosity increase (%) | Evaluation |
|---|---|---|---|---|---|---|---|---|---|---|
| Comparative Example 19 | Pigment dispersion 23 | S0100 | 22.50 | — | — | 45.00 | 9.00 | 223.50 | 15.0 | 12.3 | C |
| Comparative Example 20 | Pigment dispersion 24 | Black pigment 13 | 22.50 | — | — | 45.00 | 9.00 | 223.50 | 15.0 | 10.4 | C |
| Comparative Example 21 | Pigment dispersion 25 | Black pigment 15 | 22.50 | — | — | 45.00 | 9.00 | 223.50 | 15.0 | 11.3 | C |
| Comparative Example 22 | Pigment dispersion 26 | S0100 | 20.25 | — | 2.25 | 45.00 | 9.00 | 223.50 | 15.0 | 12.5 | C |
| Comparative Example 23 | Pigment dispersion 27 | S0100 | 22.50 | — | — | 75.00 | — | 202.50 | 15.0 | 30.7 | D |
| Comparative Example 24 | Pigment dispersion 28 | Black pigment 13 | 22.50 | — | — | 75.00 | — | 202.50 | 15.0 | 30.2 | D |
| Comparative Example 25 | Pigment dispersion 29 | Black pigment 15 | 22.50 | — | — | 75.00 | — | 202.50 | 15.0 | 32.0 | D |
| Comparative Example 26 | Pigment dispersion 30 | Formulae (6) + (7) | 22.50 | — | — | 45.00 | 9.00 | 223.50 | 15.0 | — | F |
| Comuarative Example 27 | Pigment dispersion 31 | Formulae (6) + (7) | 21.15 | 1.35 | — | 45.00 | 9.00 | 223.50 | 15.0 | — | F |
| Comparative Example 28 | Pigment dispersion 32 | Black pigment 21 | 22.50 | — | — | 45.00 | 9.00 | 223.50 | 15.0 | — | F |
| Comparative Example 29 | Pigment dispersion 33 | Black pigment 23 | 22.50 | — | — | 45.00 | 9.00 | 223.50 | 15.0 | — | F |
| Comuarative Example 30 | Pigment dispersion 34 | S0100 Formulae (6) + (7) | 11.25 11.25 | — | — | 45.00 | 9.00 | 223.50 | 15.0 | — | F |

TABLE 6-continued

| | Pigment dispersion | Pigment Type | Pigment Weight (g) | Pigment derivative A Weight (g) | Silica particle (AEROSIL 200) Weight (g) | Alkali-soluble resin (alkali-soluble polyimide resin solution A) solid content, 30% by weight Weight (g) | Polymer resin dispersant (Solsperse 20000) Weight (g) | Solvent (PGMEA) Weight (g) | Solid content of pigment dispersion (% by weight) | Evaluation of dispersion stability of pigment dispersion Viscosity increase (%) | Evaluation |
|---|---|---|---|---|---|---|---|---|---|---|---|
| Comparative Example 31 | Pigment dispersion 35 | Black pigment 25 | 22.50 | — | — | 45.00 | 9.00 | 223.50 | 15.0 | 8.6 | B |
| Comparative Example 32 | Pigment dispersion 36 | Black pigment 26 | 22.50 | — | — | 45.00 | 9.00 | 223.50 | 15.0 | 28.7 | C |
| Comparative Example 33 | Pigment dispersion 37 | Black pigment 27 | 22.50 | — | — | 45.00 | 9.00 | 223.50 | 15.0 | 22.5 | C |
| Comparative Example 34 | Pigment dispersion 38 | Black pigment 28 | 22.50 | — | — | 45.00 | 9.00 | 223.50 | 15.0 | — | D |
| Comparative Example 35 | Pigment dispersion 39 | Black pigment 29 | 22.50 | — | — | 45.00 | 9.00 | 223.50 | 15.0 | — | F |
| Comparative Example 36 | Pigment dispersion 40 | Black pigment 30 | 22.50 | — | — | 45.00 | 9.00 | 223.50 | 15.0 | — | F |
| Comparative Example 37 | Pigment dispersion 41 | Black pigment 31 | 22.50 | — | — | 45.00 | 9.00 | 223.50 | 15.0 | — | D |
| Comparative Example 38 | Pigment dispersion 42 | Black pigment 32 | 22.50 | — | — | 45.00 | 9.00 | 223.50 | 15.0 | — | F |
| Comuarative Example 39 | Pigment dispersion 43 | Formulae (6) + (7) | 22.50 | — | — | 75.00 | — | 202.50 | 15.0 | — | F |
| Comparative Example 40 | Pigment dispersion 44 | MA100 | 22.50 | — | — | 45.00 | 9.00 | 223.50 | 15.0 | 12.5 | C |

Example 43

57.00 g of the pigment dispersion 1, 11.50 g of the alkali-soluble polyimide resin solution A, 2.25 g of dipentaerythritol hexaacrylate (hereinafter referred to as "DPHA") as the compound having at least two radical-polymerizable groups, 0.75 g of NCI-831 as the photoinitiator, 11.50 g of PGMEA as the solvent, and 17.00 g of MBA were mixed, and after sealing hermetically, the mixture was stirred for 30 minutes on a shaker to prepare a negative photosensitive composition 1 having a solid content of 15% by weight.

Negative photosensitive composition 1 was coated on the surface of TEMPAX (a transparent glass substrate of 50 mm×50 mm) with a spin coater by adjusting the rotation speed so that the thickness of the finally obtained cured film was 1.0 μm. The resulting coated film was prebaked by using a hot plate (SCW-636 manufactured by Dainippon Screen Mfg. Co., Ltd.) at 100° C. under atmospheric pressure for 120 seconds. The resulting prebaked film was irradiated with a mixed radiation of j-ray (wavelength, 313 nm), i-ray (wavelength, 365 nm), h-ray (wavelength, 405 nm), and g-ray (wavelength, 436 nm) of ultra-high pressure mercury lamp by using a both-surface alignment one-side surface exposure apparatus (Mask Aligner PEM-6M manufactured by Union Optical Co., Ltd.) at an exposure of 100 mJ/cm$^2$ (in terms of i-ray) to obtain an exposed film. Next, the exposed film was developed by 2.38% by weight TMAH aqueous solution for 60 seconds by using a compact-type developer apparatus for photolithography (AD-2000 manufactured by Takizawa Sangyo Co., Ltd.), and rinsed with deionized water for 30 seconds to obtain a developed film. The developed film was then heated to 230° C. for 60 minutes by using a high-temperature inert gas oven (INH-9CD-S manufactured by Koyo Thermo Systems Co., Ltd) in a nitrogen atmosphere to produce a cured film having a thickness of 1.0 μm.

Amount (g) of the materials incorporated, and the result of evaluating the light-shielding property (OD/μm) of the cured film are shown in Table 7.

Examples 44 to 62 and Comparative Examples 41 to 63

The procedure of Example 43 was repeated except that the pigment dispersions 2 to 44 of Tables 5 to 6 were used instead of the pigment dispersion 1 to prepare negative photosensitive compositions 2 to 20 and 23 to 45 having a solid content of 15% by weight, and the light-shielding property of the cured film was evaluated. Amount (g) of the materials incorporated and the results of the evaluation are shown in Tables 7 to 8.

Examples 63 to 64

The procedure of Example 43 was repeated except that the pigment dispersion 2 shown in Table 5 were used instead of the pigment dispersion 1 and DPCA-20 or DPCA-60 was used instead of the DPHA to prepare negative photosensitive compositions 21 to 22 having a solid content of 15% by weight. A cured film was prepared and the light-shielding property of the cured film was evaluated. Amount (g) of the materials incorporated and the results of the evaluation are shown in Table 7.

TABLE 7

| | Photosensitive composition | Pigment dispersion Type | Pigment dispersion Weight (g) | Alkali-soluble resin (alkali-soluble polyimide resin solution A) solid content, 30% by weight Weight (g) | Compound having at least two radical-polymerizable groups (DPHA) (DPHA) Weight (g) | (DPCA-20) Weight (g) | (DPCA-60) Weight (g) | Photo initiator (NCI-831) Weight (g) | Solvent (PGMEA) Weight (g) | Solvent (MBA) Weight (g) | Evaluation of light-shielding property (OD/μm) |
|---|---|---|---|---|---|---|---|---|---|---|---|
| Example 43 | Negative photosensitive composition 1 | Pigment dispersion 1 | 57.00 | 11.50 | 2.25 | — | — | 0.75 | 11.50 | 17.00 | 1.1 |
| Example 44 | Negative photosensitive composition 2 | Pigment dispersion 2 | 57.00 | 11.50 | 2.25 | — | — | 0.75 | 11.50 | 17.00 | 1.1 |
| Example 45 | Negative photosensitive composition 3 | Pigment dispersion 3 | 57.00 | 11.50 | 2.25 | — | — | 0.75 | 11.50 | 17.00 | 1.2 |
| Example 46 | Negative photosensitive composition 4 | Pigment dispersion 4 | 57.00 | 11.50 | 2.25 | — | — | 0.75 | 11.50 | 17.00 | 1.2 |
| Example 47 | Negative photosensitive composition 5 | Pigment dispersion 5 | 57.00 | 11.50 | 2.25 | — | — | 0.75 | 11.50 | 17.00 | 1.1 |
| Example 48 | Negative photosensitive composition 6 | Pigment dispersion 6 | 57.00 | 11.50 | 2.25 | — | — | 0.75 | 11.50 | 17.00 | 1.2 |
| Example 49 | Negative photosensitive composition 7 | Pigment dispersion 7 | 57.00 | 11.50 | 2.25 | — | — | 0.75 | 11.50 | 17.00 | 1.0 |
| Example 50 | Negative photosensitive composition 8 | Pigment dispersion 8 | 57.00 | 11.50 | 2.25 | — | — | 0.75 | 11.50 | 17.00 | 1.2 |
| Example 51 | Negative photosensitive composition 9 | Pigment dispersion 9 | 57.00 | 11.50 | 2.25 | — | — | 0.75 | 11.50 | 17.00 | 1.2 |
| Example 52 | Negative photosensitive composition 10 | Pigment dispersion 10 | 57.00 | 11.50 | 2.25 | — | — | 0.75 | 11.50 | 17.00 | 1.1 |
| Example 53 | Negative photosensitive composition 11 | Pigment dispersion 11 | 57.00 | 11.50 | 2.25 | — | — | 0.75 | 11.50 | 17.00 | 1.2 |
| Example 54 | Negative photosensitive composition 12 | Pigment dispersion 12 | 57.00 | 11.50 | 2.25 | — | — | 0.75 | 11.50 | 17.00 | 1.2 |
| Example 55 | Negative photosensitive composition 13 | Pigment dispersion 13 | 57.00 | 11.50 | 2.25 | — | — | 0.75 | 11.50 | 17.00 | 1.1 |
| Example 56 | Negative photosensitive composition 14 | Pigment dispersion 14 | 57.00 | 11.50 | 2.25 | — | — | 0.75 | 11.50 | 17.00 | 1.1 |
| Example 57 | Negative photosensitive composition 15 | Pigment dispersion 17 | 57.00 | 11.50 | 2.25 | — | — | 0.75 | 11.50 | 17.00 | 1.1 |
| Example 58 | Negative photosensitive composition 16 | Pigment dispersion 18 | 57.00 | 11.50 | 2.25 | — | — | 0.75 | 11.50 | 17.00 | 1.1 |
| Example 59 | Negative photosensitive composition 17 | Pigment dispersion 19 | 57.00 | 11.50 | 2.25 | — | — | 0.75 | 11.50 | 17.00 | 1.1 |
| Example 60 | Negative photosensitive composition 18 | Pigment dispersion 20 | 57.00 | 11.50 | 2.25 | — | — | 0.75 | 11.50 | 17.00 | 1.1 |
| Example 61 | Negative photosensitive composition 19 | Pigment dispersion 21 | 57.00 | 11.50 | 2.25 | — | — | 0.75 | 11.50 | 17.00 | 0.9 |
| Example 62 | Negative photosensitive composition 20 | Pigment dispersion 22 | 57.00 | 11.50 | 2.25 | — | — | 0.75 | 11.50 | 17.00 | 0.9 |
| Example 63 | Negative photosensitive composition 21 | Pigment dispersion 2 | 57.00 | 11.50 | — | 2.25 | — | 0.75 | 11.50 | 17.00 | 1.1 |

TABLE 7-continued

| | | Pigment dispersion | | Alkali-soluble resin (alkali-soluble polyimide resin solution A) solid content, 30% by weight | Compound having at least two radical-polymerizable groups (DPHA) | | | Photo initiator (NCI-831) | Solvent (PGMEA) | Solvent (MBA) | Evaluation of light-shielding property (OD/µm) |
|---|---|---|---|---|---|---|---|---|---|---|---|
| | Photosensitive composition | Type | Weight (g) | Weight (g) | (DPHA) Weight (g) | (DPCA-20) Weight (g) | (DPCA-60) Weight (g) | Weight (g) | Weight (g) | Weight (g) | |
| Example 64 | Negative photosensitive composition 22 | Pigment dispersion 2 | 57.00 | 11.50 | — | — | 2.25 | 0.75 | 11.50 | 17.00 | 1.1 |

TABLE 8

| | Photosensitive composition | Pigment dispersion Type | Pigment dispersion Weight (g) | Alkali-soluble resin (alkali-soluble polyimide resin solution A) solid content, 30% by weight Weight (g) | Compound having at least two radical-polymerizable groups (DPHA) Weight (g) | Photo initiator (NCI-831) Weight (g) | Solvent (PGMEA) Weight (g) | Solvent (MBA) Weight (g) | Evaluation of light-shielding property (OD/µm) |
|---|---|---|---|---|---|---|---|---|---|
| Comparative Example 41 | Negative photosensitive composition 23 | Pigment dispersion 23 | 57.00 | 11.50 | 2.25 | 0.75 | 11.50 | 17.00 | 1.3 |
| Comparative Example 42 | Negative photosensitive composition 24 | Pigment dispersion 24 | 57.00 | 11.50 | 2.25 | 0.75 | 11.50 | 17.00 | 1.3 |
| Comparative Example 43 | Negative photosensitive composition 25 | Pigment dispersion 25 | 57.00 | 11.50 | 2.25 | 0.75 | 11.50 | 17.00 | 1.3 |
| Comparative Example 44 | Negative photosensitive composition 26 | Pigment dispersion 23 | 45.00 | 17.50 | 2.25 | 0.75 | 17.50 | 17.00 | 1.0 |
| Comparative Example 45 | Negative photosensitive composition 27 | Pigment dispersion 24 | 45.00 | 17.50 | 2.25 | 0.75 | 11.50 | 17.00 | 1.0 |
| Comparative Example 46 | Negative photosensitive composition 28 | Pigment dispersion 25 | 45.00 | 17.50 | 2.25 | 0.75 | 11.50 | 17.00 | 1.0 |
| Comparative Example 47 | Negative photosensitive composition 29 | Pigment dispersion 26 | 57.00 | 11.50 | 2.25 | 0.75 | 11.50 | 17.00 | 1.1 |
| Comparative Example 48 | Negative photosensitive composition 30 | Pigment dispersion 30 | 57.00 | 11.50 | 2.25 | 0.75 | 11.50 | 17.00 | 1.0 |
| Comparative Example 49 | Negative photosensitive composition 31 | Pigment dispersion 31 | 57.00 | 11.50 | 2.25 | 0.75 | 11.50 | 17.00 | 1.0 |
| Comparative Example 50 | Negative photosensitive composition 32 | Pigment dispersion 32 | 57.00 | 11.50 | 2.25 | 0.75 | 11.50 | 17.00 | 0.8 |
| Comparative Example 51 | Negative photosensitive composition 33 | Pigment dispersion 33 | 57.00 | 11.50 | 2.25 | 0.75 | 11.50 | 17.00 | 0.8 |
| Comparative Example 52 | Negative photosensitive composition 34 | Pigment dispersion 34 | 57.00 | 11.50 | 2.25 | 0.75 | 11.50 | 17.00 | 1.0 |
| Comparative Example 53 | Negative photosensitive composition 35 | Pigment dispersion 35 | 57.00 | 17.50 | 2.25 | 0.75 | 11.50 | 17.00 | 0.8 |
| Comparative Example 54 | Negative photosensitive composition 36 | Pigment dispersion 36 | 57.00 | 11.50 | 2.25 | 0.75 | 11.50 | 17.00 | 1.1 |
| Comparative Example 55 | Negative photosensitive composition 37 | Pigment dispersion 37 | 57.00 | 11.50 | 2.25 | 0.75 | 11.50 | 17.00 | 1.1 |
| Comparative Example 56 | Negative photosensitive composition 38 | Pigment dispersion 38 | 57.00 | 11.50 | 2.25 | 0.75 | 11.50 | 17.00 | 0.8 |
| Comparative Example 57 | Negative photosensitive composition 39 | Pigment dispersion 39 | 57.00 | 11.50 | 2.25 | 0.75 | 11.50 | 17.00 | 0.9 |
| Comparative Example 58 | Negative photosensitive composition 40 | Pigment dispersion 40 | 57.00 | 11.50 | 2.25 | 0.75 | 11.50 | 17.00 | 0.9 |

TABLE 8-continued

| | | Pigment dispersion | | Alkali-soluble resin (alkali-soluble polyimide resin solution A) solid content, 30% by weight | Compound having at least two radical-polymerizable groups (DPHA) | Photo initiator (NCI-831) | Solvent (PGMEA) | Solvent (MBA) | Evaluation of light-shielding |
|---|---|---|---|---|---|---|---|---|---|
| | Photosensitive composition | Type | Weight (g) | Weight (g) | Weight (g) | Weight (g) | Weight (g) | Weight (g) | property (OD/μm) |
| Comparative Example 59 | Negative photosensitive composition 41 | Pigment dispersion 41 | 57.00 | 11.50 | 2.25 | 0.75 | 11.50 | 17.00 | 0.7 |
| Comparative Example 60 | Negative photosensitive composition 42 | Pigment dispersion 42 | 57.00 | 11.50 | 2.25 | 0.75 | 11.50 | 17.00 | 0.8 |
| Comparative Example 61 | Negative photosensitive composition 43 | Pigment dispersion 43 | 45.00 | 17.50 | 2.25 | 0.75 | 17.50 | 17.00 | 0.7 |
| Comparative Example 62 | Negative photosensitive composition 44 | Pigment dispersion 44 | 57.00 | 11.50 | 2.25 | 0.75 | 11.50 | 17.00 | 2.1 |
| Comparative Example 63 | Negative photosensitive composition 45 | Pigment dispersion 44 | 26.00 | 27.00 | 2.25 | 0.75 | 27.00 | 17.00 | 1.0 |

Synthetic Example: Synthesis of Quinone Diazide Compound a

In dry nitrogen stream, 21.23 g (0.05 mol) of TrisP-PA (manufactured by Honshu Chemical Industry Co., Ltd.) which is a compound having phenolic hydroxyl group and 33.58 g (0.125 mol) of 5-naphthoquinone diazido sulfonyl acid chloride were dissolved in 450.00 g of 1,4-dioxane, and the solution was kept at room temperature. To this solution, 12.65 g (0.125 mol) of triethylamine mixed with 50.00 g of 1,4-dioxane was added dropwise so that the system was maintained at 25 to 35° C. After the dropwise addition, stirring was continued at 30° C. for 2 hours. Next, the triethylamine salt was filtered, and the filtrate was added to water, and the precipitate was recovered by filtration. This precipitate was dried by a vacuum dryer to prepare quinone diazide compound a represented by the structural formula (13).

[Chemical formula 10]

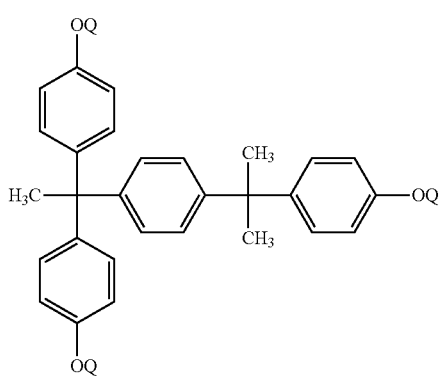

(13)

$Q = $ 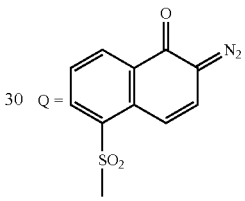

Example 65

20.00 g of the pigment dispersion 15, 30.00 g of the alkali-soluble polyimide resin solution A, 3.00 g of the quinone diazide compound a, 30.00 g of PGMEA, and 17.00 g of MBA were mixed, and after sealing hermetically, the mixture was stirred for 30 minutes on a shaker to prepare a positive photosensitive composition 1 having a solid content of 15% by weight. The procedure of Example 43 was repeated to prepare a cured film and the light-shielding property of the cured film was evaluated. Amount (g) of the materials incorporated and the results of the evaluation are shown in Table 9.

Example 66 and Comparative Examples 64 to 65

The procedure of Example 65 was repeated except that the pigment dispersions 16, 27, and 43 shown in Table 5 to 6 were respectively used instead of the pigment dispersion 1 to prepare positive photosensitive compositions 2 to 4 having a solid content of 15% by weight. The procedure of Example 43 was repeated to prepare a cured film, and the light-shielding property of the cured film was evaluated. Amount (g) of the materials incorporated and the results of the evaluation are shown in Table 9.

TABLE 9

| | Photosensitive composition | Pigment dispersion Type | Pigment dispersion Weight (g) | Alkali-soluble resin (alkali-soluble polyimide resin solution A) solid content, 30% by weight Weight (g) | Quinone diazide compound a Weight (g) | Solvent (PGMEA) Weight (g) | Solvent (MBA) Weight (g) | Evaluation of light-shielding property (OD/μm) |
|---|---|---|---|---|---|---|---|---|
| Example 65 | Positive photosensitive composition 1 | Pigment dispersion 15 | 20.00 | 30.00 | 3.00 | 30.00 | 17.00 | 0.5 |
| Example 66 | Positive photosensitive composition 2 | Pigment dispersion 16 | 20.00 | 30.00 | 3.00 | 30.00 | 17.00 | 0.5 |
| Comparative Example 64 | Positive photosensitive composition 3 | Pigment dispersion 27 | 20.00 | 30.00 | 3.00 | 30.00 | 17.00 | 0.6 |
| Comparative Example 65 | Positive photosensitive composition 4 | Pigment dispersion 43 | 20.00 | 30.00 | 3.00 | 30.00 | 17.00 | 0.6 |

Example 67

FIG. 2 shows the production steps of the organic EL display including the steps of forming the pixel division layer.

A thin film of silver/copper alloy (volume ratio, 10:1) having a thickness of 10 nm was formed on the entire surface of alkali-free glass substrate (3) having the size of 38 mm×46 mm by sputtering, and the film was etched to form a patterned metal reflective layer (4). Next, an ITO transparent electroconductive film having a thickness of 10 nm was formed on the entire surface by sputtering to form a patterned second electrode (5) and an auxiliary electrode (6) as the extracting electrode. The product was then ultrasonically washed with "Semico clean" (Registered Trademark) 56 (manufactured by Furuuchi Chemical) for 10 minutes, and then with ultrapure water to prepare a substrate having the electrode formed.

The negative photosensitive composition 1 prepared in Example 43 was coated on the surface of the substrate having the electrode formed thereon by using a spin coater (MS-A100 manufactured by Mikasa) while controlling the rotation speed so that the finally prepared pixel division layer had a thickness of 1.0 μm. The resulting coated film was prebaked by using a hot plate (SCW-636 manufactured by Dainippon Screen Mfg. Co., Ltd.) at 100° C. under atmospheric pressure for 120 seconds to prepare a prebaked film.

A negative exposure mask was set on the prebaked film so that the edges (in the longitudinal direction and the transverse direction) of the light-shielding part in a rectangular pattern formed in the negative exposure mask were respectively parallel to the edges in the longitudinal direction and the transverse direction of the alkali-free glass substrate 3. The prebaked film was then irradiated with a mixed radiation of j-ray (wavelength, 313 nm), i-ray (wavelength, 365 nm), h-ray (wavelength, 405 nm), and g-ray (wavelength, 436 nm) of ultra-high pressure mercury lamp through the negative exposure mask by using a both-surface alignment one-side surface exposure apparatus (Mask Aligner PEM-6M manufactured by Union Optical Co., Ltd.) at an exposure of 100 mJ/cm$^2$ (in terms of i-ray) to prepare an exposed film. Next, the exposed film was developed by 2.38% by weight TMAH aqueous solution for 60 seconds by using a compact-type developer apparatus for photolithography (AD-2000 manufactured by Takizawa Sangyo Co., Ltd.), and rinsed with deionized water for 30 seconds to obtain a developed film.

The developed film was then heated to 250° C. for 60 minutes by using a high-temperature inert gas oven (INH-9CD-S manufactured by Koyo Thermo Systems Co., Ltd) in a nitrogen atmosphere to form a cured film and produce a pixel division layer-formed substrate 10 having a pixel division layer (7) having a thickness of 1.0 μm. This substrate had openings (70 μm (transverse)/260 μm (longitudinal)) arranged at a pitch of 155 μm (transverse direction)/465 μm (longitudinal direction) in the area of 16 mm (transverse)/16 mm (longitudinal) at the center of the substrate having the electrode formed thereon. It is to be noted that these openings would finally be the light emitting pixel part of the organic EL display after the processing as described below. With regard to the resulting substrate 10 having the pixel division layer formed thereon, the pixel division layer was evaluated by the method as described above, and the results are shown in Table 10.

Next, an organic EL display was prepared by using the substrate 10 having the pixel division layer formed thereon. In order to form an organic EL layer (8) including the luminescent layer by vacuum deposition, the pixel division layer-formed substrate 10 was rotated in relation to the vacuum deposition source under the vacuum deposition conditions of the degree of the vacuum of up to 1×10$^{-3}$ Pa, and compound (HT-1) was deposited to 10 nm as the hole injection layer, and compound (HT-2) was deposited to 50 nm as the hole transport layer. Next, on the luminescent layer, compound (GH-1) was deposited as the host material and compound (GD-1) was deposited as the dopant material to a thickness of 40 nm by vacuum deposition. Subsequently, compound (ET-1) and compound (LiQ) were deposited in a volume ratio of 1:1 to a thickness of 40 nm as the electron transportation material.

Next, the compound (LiQ) was deposited to a thickness of 2 nm by vacuum deposition, and silver/magnesium alloy (volume ratio, 10:1) was deposited to 10 nm by vacuum deposition to prepare a first electrode (9). Subsequently, a cap-shaped glass plate was bonded for sealing in a low humidity/nitrogen atmosphere by using an epoxy resin adhesive to prepare the organic EL display 1. It is to be noted that the thickness as used herein is the one indicated by a quartz oscillator film thickness monitor.

Chemical structures of the compounds used for the formation of the organic EL layer (HT-1, HT-2, GH-1, GD-1, ET-1, and LiQ) are shown below.

[Chemical formula 11]

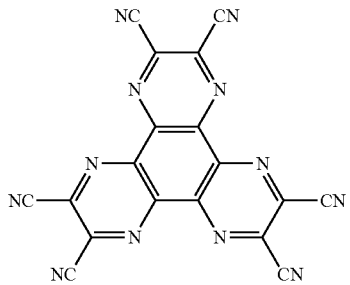

HT-1

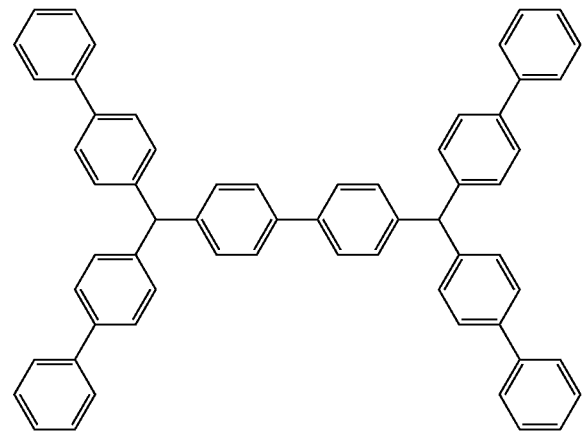

HT-2

[Chemical formula 12]

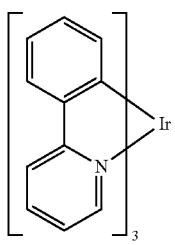

GD-1

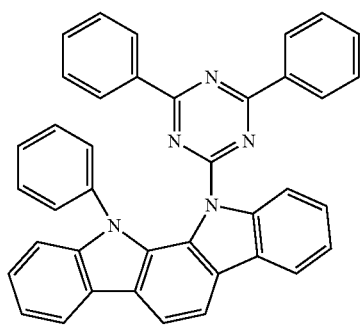

GH-1

[Chemical formula 13]

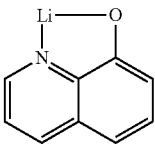

LiQ

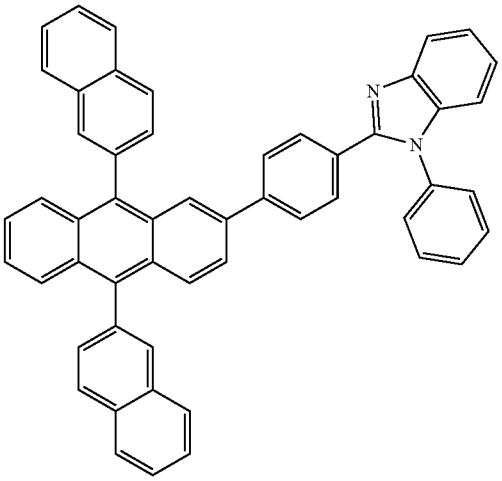

ET-1

The resulting organic EL display 1 was evaluated by the procedure as described above, and the results are shown in Table 10.

Examples 68 to 88 and Comparative Examples 66 to 88

The procedure of Example 67 was repeated except that the negative photosensitive compositions 2 to 45 shown in Tables 7 to 8 were respectively used instead of the negative photosensitive composition 1 to form the pixel division layer and prepare the organic EL display, and the pixel division layer and the organic EL display were evaluated. The negative photosensitive compositions used and the evaluation results are shown in Tables 10 to 11.

Example 89

The procedure of Example 67 was repeated except that the positive photosensitive composition 1 shown in Table 9 was used instead of the negative photosensitive composition 1 and the exposure was conducted by using a positive exposure mask wherein the opening and the light-shielding region were reversed instead of the negative exposure mask as described above to form the pixel division layer and prepare the organic EL display, and the pixel division layer and the organic EL display were evaluate. The positive photosensitive compositions used and the evaluation results are shown in Table 10.

Example 90 and Comparative Examples 89 to 90

The procedure of Example 67 was repeated except that the positive photosensitive compositions 2 to 4 shown in Table 9 were used to form the pixel division layer and prepare the organic EL display, and the pixel division layer and the organic EL display were evaluated. The positive photosensitive compositions used and the evaluation results are shown in Table 10 to 11.

TABLE 10

| | Photosensitive composition | Evaluation of pixel division layer | | Evaluation of organic EL display | |
|---|---|---|---|---|---|
| | | Development residue on the ITO in the opening | Pattern linearity | Dark spot (non-light emitting spots) | Brightness unevenness |
| Example 67 | Negative photosensitive composition 1 | A | A | A | B |
| Example 68 | Negative photosensitive composition 2 | A | B | A | A |
| Example 69 | Negative photosensitive composition 3 | A | A | A | A |
| Example 70 | Negative photosensitive composition 4 | B | A | B | A |
| Example 71 | Negative photosensitive composition 5 | A | B | A | A |
| Example 72 | Negative photosensitive composition 6 | B | A | B | A |
| Example 73 | Negative photosensitive composition 7 | A | C | A | A |
| Example 74 | Negative photosensitive composition 8 | C | C | C | A |
| Example 75 | Negative photosensitive composition 9 | A | A | A | C |
| Example 76 | Negative photosensitive composition 10 | A | B | A | C |
| Example 77 | Negative photosensitive composition 11 | A | B | A | A |
| Example 78 | Negative photosensitive composition 12 | A | A | A | A |
| Example 79 | Negative photosensitive composition 13 | A | B | A | A |
| Example 80 | Negative photosensitive composition 14 | A | B | A | A |
| Example 81 | Negative photosensitive composition 15 | A | AA | A | A |
| Example 82 | Negative photosensitive composition 16 | C | C | C | A |
| Example 83 | Negative photosensitive composition 17 | B | B | B | A |
| Example 84 | Negative photosensitive composition 18 | A | B | A | A |
| Example 85 | Negative photosensitive composition 19 | C | C | C | A |
| Example 86 | Negative photosensitive composition 20 | B | C | B | A |
| Example 87 | Negative photosensitive composition 21 | AA | AA | AA | A |
| Example 88 | Negative photosensitive composition 22 | AA | AA | AA | A |
| Example 89 | Positive photosensitive composition 1 | AA | AA | A | A |
| Example 90 | Positive photosensitive composition 2 | B | B | B | A |

TABLE 11

| | Photosensitive composition | Evaluation of pixel division layer | | Evaluation of organic EL display | |
|---|---|---|---|---|---|
| | | Development residue on the ITO in the opening | Pattern linearity | Dark spot (non-light emitting spots) | Brightness unevenness |
| Comparative Example 66 | Negative photosensitive composition 23 | E | D | D | A |
| Comparative Example 67 | Negative photosensitive composition 24 | E | D | D | A |
| Comparative Example 68 | Negative photosensitive composition 25 | E | D | D | A |
| Comparative Example 69 | Negative photosensitive composition 26 | E | D | D | A |
| Comparative Example 70 | Negative photosensitive composition 27 | E | D | D | A |
| Comparative Example 71 | Negative photosensitive composition 28 | E | D | D | A |
| Comparative Example 72 | Negative photosensitive composition 29 | E | D | D | A |
| Comparative Example 73 | Negative photosensitive composition 30 | D | E | D | F |
| Comparative Example 74 | Negative photosensitive composition 31 | D | E | D | F |
| Comparative Example 75 | Negative photosensitive composition 32 | D | E | D | F |
| Comparative Example 76 | Negative photosensitive composition 33 | D | E | D | F |
| Comparative Example 77 | Negative photosensitive composition 34 | E | D | D | F |
| Comparative Example 78 | Negative photosensitive composition 35 | E | D | D | F |
| Comparative Example 79 | Negative photosensitive composition 36 | E | C | D | C |
| Comparative Example 80 | Negative photosensitive composition 37 | E | C | D | C |
| Comparative Example 81 | Negative photosensitive composition 38 | E | D | D | F |
| Comparative Example 82 | Negative photosensitive composition 39 | E | D | D | D |
| Comparative Example 83 | Negative photosensitive composition 40 | E | D | D | D |

TABLE 11-continued

| | Photosensitive composition | Evaluation of pixel division layer | | | Evaluation of organic EL display | |
| --- | --- | --- | --- | --- | --- | --- |
| | | Development residue on the ITO in the opening | Pattern linearity | Dark spot (non-light emitting spots) | Brightness unevenness | |
| Comparative Example 84 | Negative photosensitive composition 41 | E | D | D | F |
| Comparative Example 85 | Negative photosensitive composition 42 | E | D | D | D |
| Comparative Example 86 | Negative photosensitive composition 43 | D | E | D | F |
| Comparative Example 87 | Negative photosensitive composition 44 | C | C | A | D |
| Comparative Example 88 | Negative photosensitive composition 45 | A | B | A | D |
| Comparative Example 89 | Positive photosensitive composition 3 | E | D | D | A |
| Comparative Example 90 | Positive photosensitive composition 4 | E | D | D | F |

In Examples 67 to 90, generation of the development residue and dark spots on the ITO in the opening is drastically reduced compared to Comparative Examples 66 to 90. Presumably, this difference is the effect realized by the improvement of the alkali resistance for the benzodifuranone-based black pigment, and by the improvement of the dispersibility for the perylene-based black pigment and the azo-based black pigment through the formation of a coating layer containing the silica and/or the metal oxide and/or the metal hydroxide.

As described above, use of the photosensitive composition of the present invention enables pattern formation of the pixel division layer by negative or positive photolithography while suppressing the generation of the development residue, and this leads to the improvement of the luminescent properties of the organic EL display.

INDUSTRIAL APPLICABILITY

The black pigment of the present invention is well adapted for use in the application where the alkali resistance and the dispersibility are simultaneously required in addition to the excellent properties inherent to the organic black pigment, for example, as a colorant in the pixel division layer or TFT planarizing layer of an organic EL display, black column spacer of a liquid crystal display, a near infrared transmitting filter, IR transmitting film or bezel of a cover glass, heat shield coating composition, and heat shield cement.

EXPLANATION OF NUMERALS 1. opening
2. pixel division layer
3. alkali-free glass substrate
4. metal reflective layer
5. second electrode (ITO electrode)
6. auxiliary electrode (ITO electrode)
7. pixel division layer
8. organic EL layer
9. first electrode
10. pixel division layer-formed substrate

The invention claimed is:

1. A black pigment comprising:
   (a) a core containing at least one organic black pigment selected from the group consisting of benzodifuranone-based black pigments, and isomers thereof; and
   (b) a coating layer containing silica and/or a metal oxide and/or a metal hydroxide.

2. A black pigment according to claim 1 wherein the core contains (a) a benzodifuranone-based black pigment represented by the general formula (1) or (2):

[Chemical formula 1]

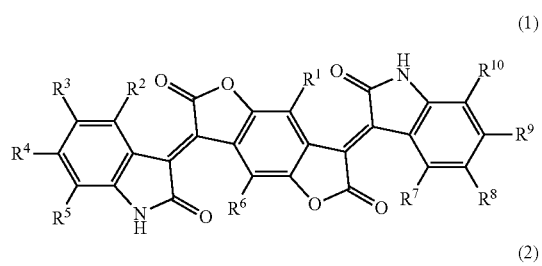

(1)

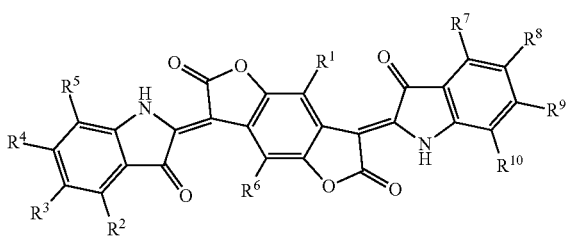

(2)

or an isomer thereof
wherein
   $R^1$ and $R^6$ independently represent hydrogen atom, $CH_3$, $CF_3$, fluorine atom, or chlorine atom;
   $R^2$, $R^3$, $R^4$, $R^5$, $R^7$, $R^8$, $R^9$, and $R^{10}$ independently represent hydrogen atom, a halogen atom, an alkyl group containing 1 to 12 carbon atoms, a cycloalkyl group containing 1 to 12 carbon atoms, an alkenyl group containing 1 to 12 carbon atoms, a cycloalkenyl group containing 1 to 12 carbon atoms, alkynyl group containing 1 to 12 carbon atoms, COOH, $COOR^{11}$, $COO^-$, $CONH_2$, $CONHR^{11}$, $CONR^{11}R^{12}$, CN, OH, $OR^{11}$, $OCOR^{11}$, $OCONH_2$, $OCONHR^{11}$, $OCONR^{11}R^{12}$, $NO_2$, $NH_2$, $NHR^{11}$, $NR^{11}R^{12}$, $NHCOR^{11}$, $NR^{11}COR^{12}$, $N=CH_2$, $N=CHR^{11}$, $N=CR^{11}R^{12}$, SH, $SR^{11}$, $SOR^{11}$, $SO_2R^{11}$, $SO_3R^{11}$, $SO_3H$, $SO_3^-$, $SO_2NH_2$, $SO_2NHR^{11}$, or $SO_2NR^{11}R^{12}$, with the proviso that $R^2$ and $R^3$, $R^3$ and $R^4$, $R^4$ and $R^5$, $R^7$ and $R^8$, $R^8$ and $R^9$, and $R^9$ and $R^{10}$ may be directly bonded or via O, S, NH, or $NR^{11}$; and
   $R^{11}$ and $R^{12}$ independently represent alkyl group containing 1 to 12 carbon atoms, cycloalkyl group containing 1 to 12 carbon atoms, alkenyl group containing 1 to 12 carbon atoms, cycloalkenyl group containing 1 to 12 carbon atoms, or alkynyl group containing 1 to 12 carbon atoms.

3. A black pigment according to claim 1, wherein the benzodifuranone-based black pigment contains a compound represented by the formula (3):

(3)

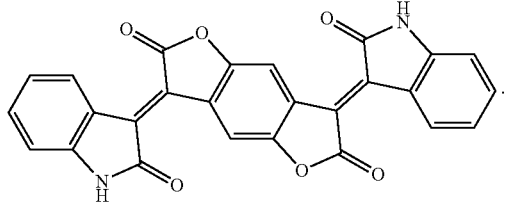

4. A black pigment according to claim 1, wherein the metal oxide comprises alumina.

5. A black pigment according to claim 1, wherein the coating layer contains silica.

6. A black pigment according to claim 5 wherein content of the silica in the coating layer is 1.0 to 20.0 parts by weight in terms of $SiO_2$ in relation to 100 parts by weight of the core.

7. A black pigment according to claim 1, wherein the coating layer contains silica and/or a metal oxide and/or a metal hydroxide and has the surface modified with a radical-polymerizable group and silicon atom-containing group.

8. A pigment dispersion containing a black pigment according claim 1, a dispersant, and a solvent.

9. A pigment dispersion according to claim 8 wherein the dispersant contains an alkali-soluble resin.

10. A photosensitive composition containing a black pigment according to claim 1, an alkali-soluble resin, and a photosensitive agent.

11. A photosensitive composition according to claim 10 wherein the composition contains a compound having at least two radical-polymerizable groups as the photosensitive agent and a photoinitiator as the photosensitive agent, and the photosensitive composition has negative photosensitivity.

12. A photosensitive composition according to claim 11 wherein the compound having at least two radical-polymerizable groups contains a compound having a structure derived from a compound having at least three hydroxy groups, at least three ethylenically unsaturated double bond groups, and at least one aliphatic chain in the molecule, the aliphatic chain having an average molecular weight of 40 to 500.

13. A photosensitive composition according to claim 10, wherein the alkali-soluble resin includes an alkali-soluble polyimide resin having a structure represented by the general formula (11):

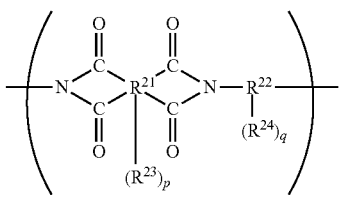

(11)

wherein
$R^{21}$ represents a tetravalent to decavalent organic group;
$R^{22}$ represents a divalent to octavalent organic group;
$R^{23}$ and $R^{24}$ independently represent a phenolic hydroxy group, sulfonate group, or thiol group; and
p and q independently represent a real number in the range of 0 to 6.

14. A cured film comprising a cured product of the photosensitive composition according to claim 10.

15. A pixel division layer of an organic EL display comprising a cured product of the photosensitive composition according to claim 10.

16. An organic EL display having a cured film according to claim 14.

17. A method for producing the black pigment according to claim 5 which comprises adding an alkali metal silicate and an inorganic acid to an aqueous suspension of the pigment containing the core maintained at a pH in the range of at least 2 to less than 7 to coat silica on the surface of the core.

18. A method for producing the black pigment according to claim 4 which comprises adding an alkali metal aluminate and an inorganic acid to an aqueous suspension of the pigment containing the core maintained at a pH in the range of at least 2 to less than 7 to coat aluminum hydroxide on the surface of the core.

19. A method for producing the black pigment according to claim 17 further comprising the step of removing ionic impurities by using an ion exchange resin after the surface treatment step.

\* \* \* \* \*